United States Patent
Fukuzumi et al.

(10) Patent No.: US 7,459,759 B2
(45) Date of Patent: Dec. 2, 2008

(54) MAGNETIC RANDOM ACCESS MEMORY

(75) Inventors: Yoshiaki Fukuzumi, Yokohama (JP); Toshihiko Nagase, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/447,131

(22) Filed: Jun. 6, 2006

(65) Prior Publication Data

US 2006/0274568 A1  Dec. 7, 2006

(30) Foreign Application Priority Data

Jun. 7, 2005  (JP) .............................. 2005-166917

(51) Int. Cl.
*G11C 11/02* (2006.01)

(52) U.S. Cl. .................... 257/427; 257/421; 257/2; 257/3; 257/4; 257/5; 360/324.1; 365/149; 438/3; 438/133

(58) Field of Classification Search ............... 257/427, 257/421, 414, 108, 2–5, 158; 360/313, 324.4, 360/324.1; 365/149, 130, 158; 438/133, 438/3, 800, 900
See application file for complete search history.

(56) References Cited

U.S. PATENT DOCUMENTS

| 6,256,223 | B1 | 7/2001 | Sun |
| 6,545,906 | B1 | 4/2003 | Savtchenko et al. |
| 2005/0018478 | A1 | 1/2005 | Nagase et al. |
| 2006/0067008 | A1* | 3/2006 | Haratani ............... 360/321 |

FOREIGN PATENT DOCUMENTS

| JP | 2004-153181 | 5/2004 |
| JP | 2005-129587 | 5/2005 |

OTHER PUBLICATIONS

U.S. Appl. No. 10/862,617, filed Jun. 8, 2004, Toshihiko Nagase et al.

* cited by examiner

*Primary Examiner*—Jerome Jackson
*Assistant Examiner*—Jami M Valentine
(74) *Attorney, Agent, or Firm*—Oblon, Spivak, McClelland, Maier & Neustadt, P.C.

(57) ABSTRACT

A magnetic random access memory described in embodiments of the present invention comprises a conductive line, a soft magnetic material which surrounds the conductive line, a gap disposed in a part of the soft magnetic material, and a magneto-resistive element in which a part of a vertical magnetization film as a magnetic free layer is positioned in the gap and in which a vertical magnetization film as a magnetic pinned layer is positioned outside the gap.

7 Claims, 30 Drawing Sheets

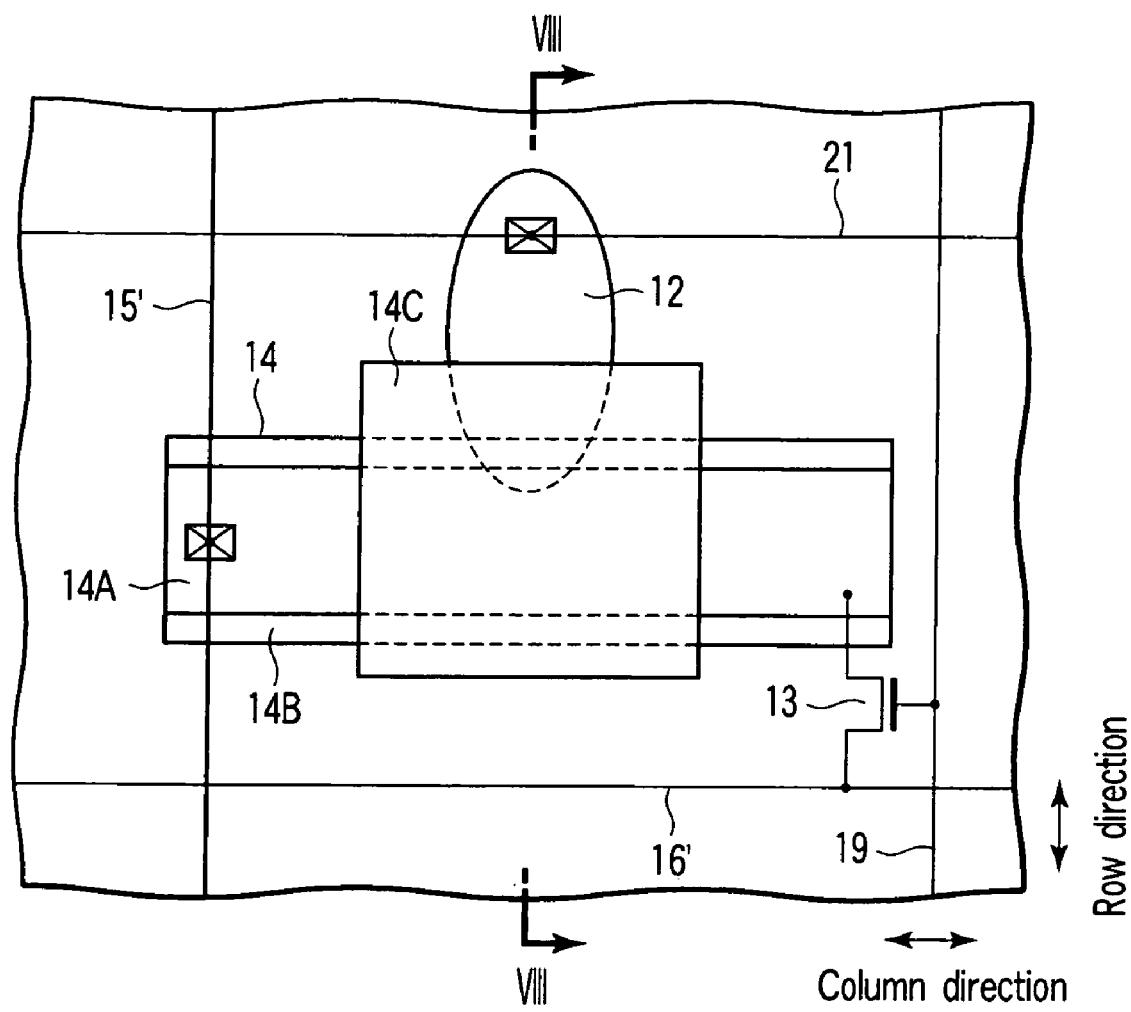
F I G. 7

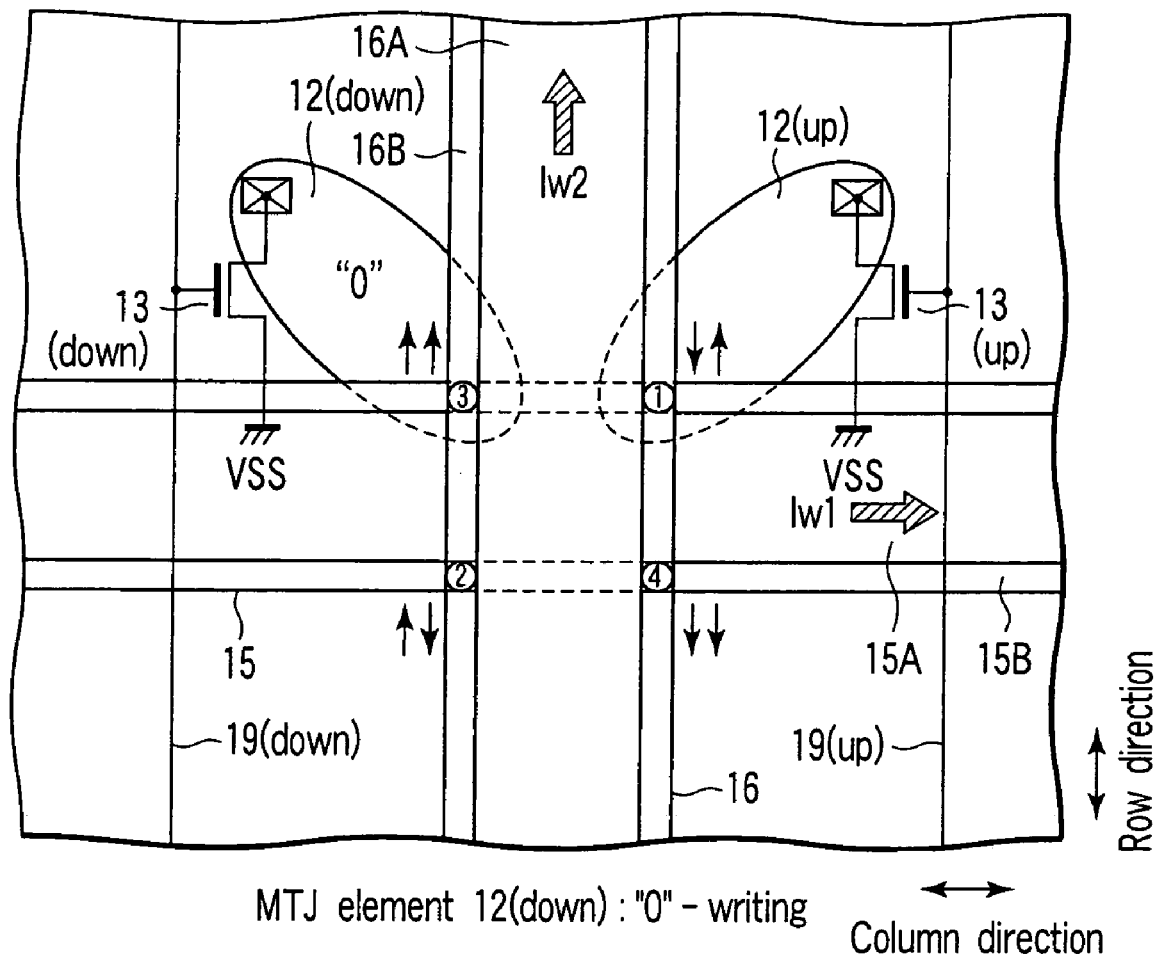
F I G. 26

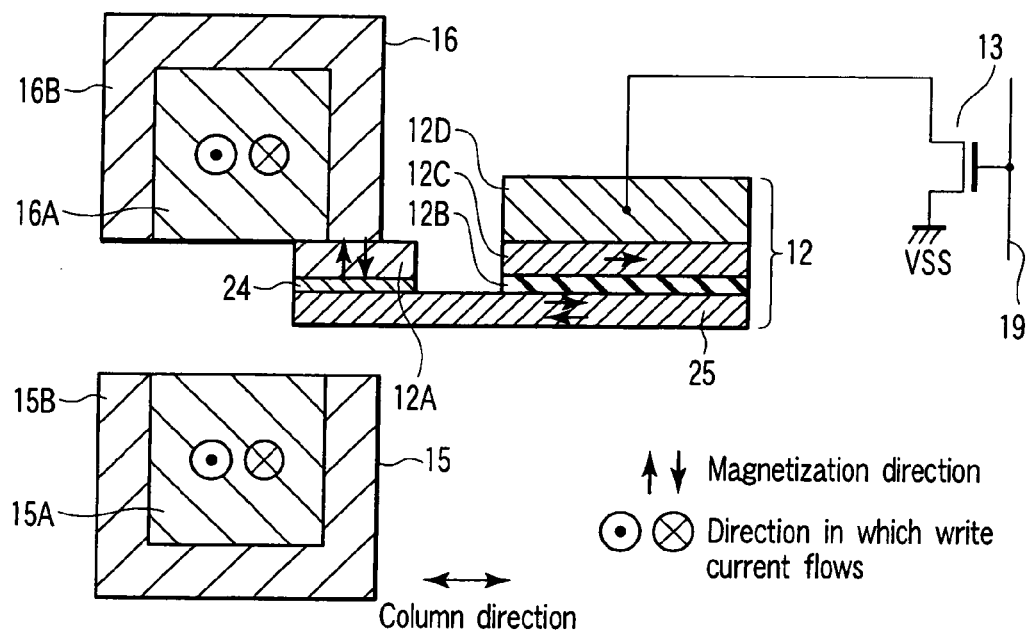
F I G. 34
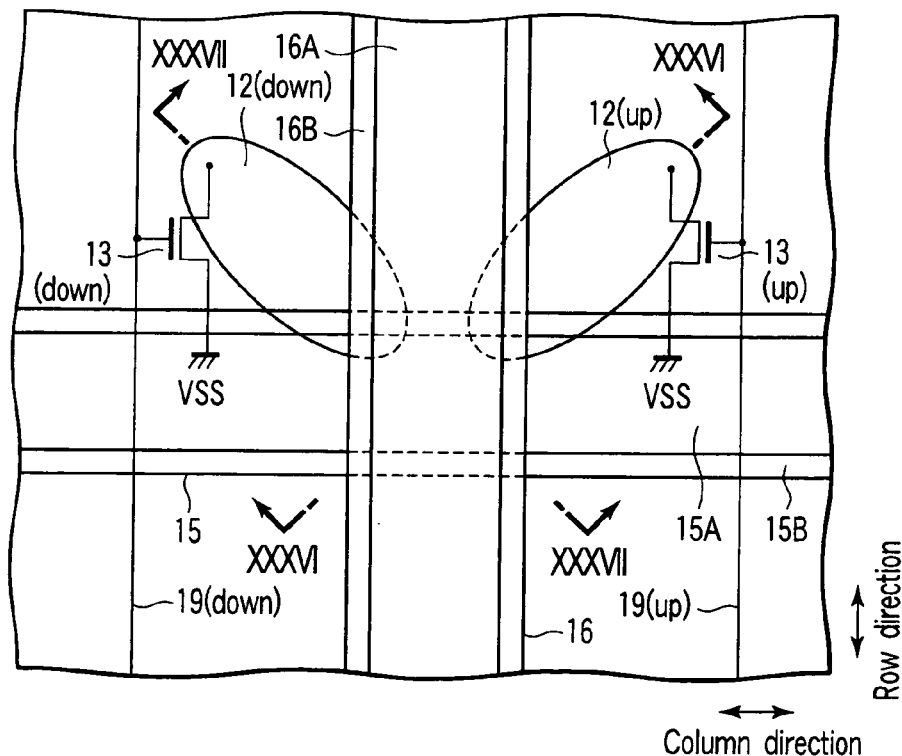
F I G. 35

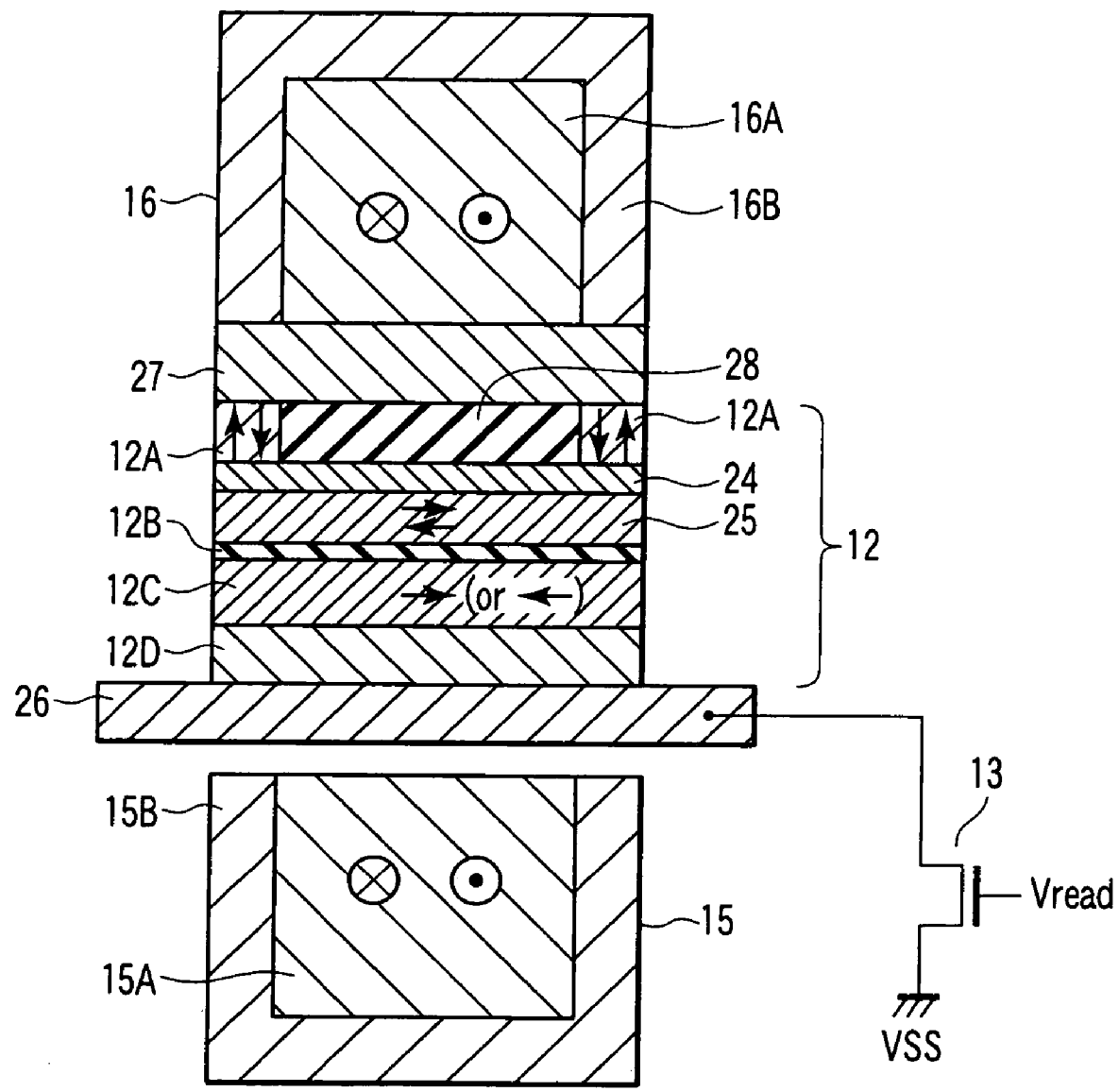
F I G. 41

"0" – writing (resistance r0)

⇔ Magnetization direction of free layer
→ Magnetization direction of pin layer

"1" – writing (resistance r1 > r0)

⇔ Magnetization direction of free layer
→ Magnetization direction of pin layer

"2" – writing (resistance r2 > r1)

⇔ Magnetization direction of free layer
→ Magnetization direction of pin layer

"3" – writing (resistance r3 > r2)

⇔ Magnetization direction of free layer
→ Magnetization direction of pin layer

MAGNETIC RANDOM ACCESS MEMORY

CROSS-REFERENCE TO RELATED APPLICATIONS

This application is based upon and claims the benefit of priority from prior Japanese Patent Application No. 2005-166917, filed Jun. 7, 2005, the entire contents of which are incorporated herein by reference.

BACKGROUND OF THE INVENTION

1. Field of the Invention

The present invention relates to a magnetic random access memory (MRAM) in which a magneto-resistive element is used as a memory cell.

2. Description of the Related Art

Magnetic random access memories have been noted as next-generation memory devices, and researches and developments has been carried out to put these memories to practical use. However, there remain many problems to be solved, such as current reduction, enhancement of a resistance to erroneous writing, and thermal disturbance countermeasures.

To solve these problems, in a conventional magnetic random access memory, several proposals have been made from aspects of a shape of a magneto-resistive element, and a writing system.

For example, as to the shape of the magneto-resistive element, shapes have been proposed such as a cross shape, a bean shape, and a trapezoidal shape. As to the writing system, systems have been proposed such as toggle and spin-injection (see e.g., U.S. Pat. Nos. 6,545,906, 6,256,223).

However, as to the shape of the magneto-resistive element, certain effects are obtained in the current reduction, but it is difficult to obtain a sufficient resistance to erroneous writing only by the shape. When the shape is complicated, working becomes difficult. When a conventional semiconductor element forming technique is used, the technique is disadvantageous for miniaturization of a memory cell.

Moreover, in the toggle system among the writing systems, there is a problem that it is difficult to reduce a current although certain effects are obtained with respect to the resistance to erroneous writing. Furthermore, in the spin-injection system, since it is difficult to reduce a spin-injection current (write current), it is impossible to sufficiently handle problems such as reduction of a cell size, thermal disturbance countermeasure, and device destruction.

BRIEF SUMMARY OF THE INVENTION

According to an aspect of the present invention, there is provided a magnetic random access memory comprising: a conductive line; a soft magnetic material which surrounds the conductive line; a gap disposed in a part of the soft magnetic material; and an magneto-resistive element in which a part of a ferromagnetic film as a magnetic free layer is positioned in the gap and in which a magnetic pinned layer is positioned outside the gap.

BRIEF DESCRIPTION OF THE SEVERAL VIEWS OF THE DRAWING

FIG. 7 is a plan view showing an example of a structure of the magnetic random access memory according to a second embodiment;

FIG. 26 is a plan view showing the writing operation according to the fourth embodiment;

FIG. 34 is a sectional view showing a fifth modification of the fifth embodiment;

FIG. 35 is a plan view showing an example of the structure of the magnetic random access memory according to a sixth embodiment;

FIG. 41 is a sectional view along a line XLI-XLI of FIG. 40;

DETAILED DESCRIPTION OF THE INVENTION

Figure 1:
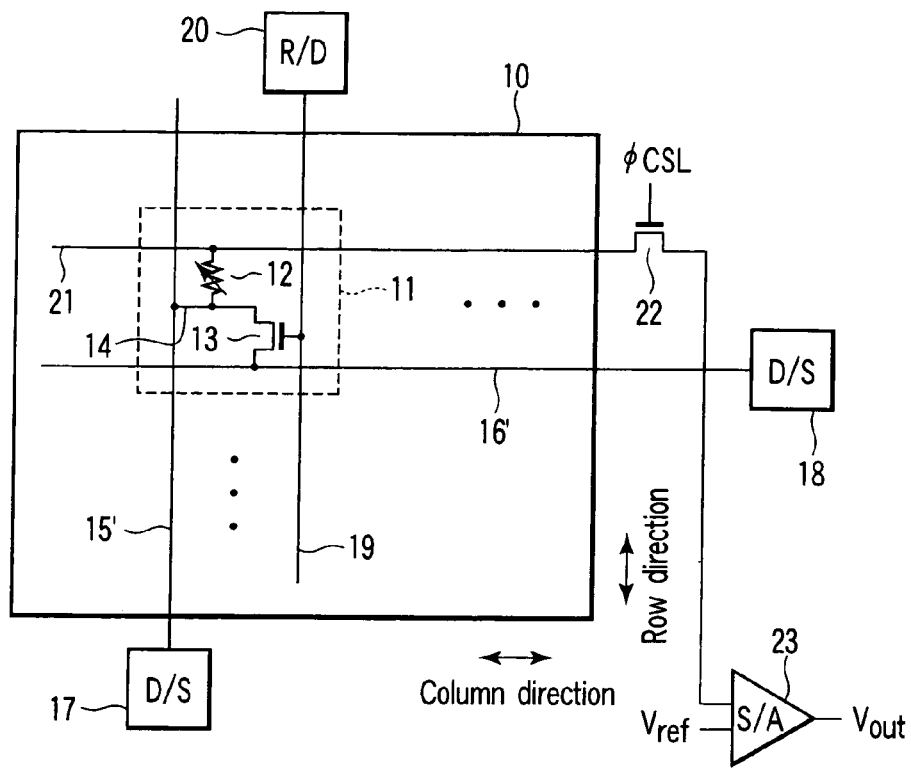
FIG. 1 is a circuit diagram showing a circuit example of a magnetic random access memory of a first embodiment.

A magnetic random access memory of an aspect of the present invention will be described below in detail with reference to the accompanying drawings.

1. Outline

An example of the present invention is applied to a magnetic random access memory of such a type that data is written using a magnetic field (current magnetic field) generated by a write current. In the example of the present invention, there are proposed a structure and a writing system, which are different from those of a conventional example, in order to realize current reduction, reduction of a cell size, and enhancement of resistances to erroneous writing/thermal disturbance.

One proposal relates to a writing system using as a magnetic free layer a so-called vertical magnetization film whose magnetization direction (magnetization easy axis direction) is a thickness direction vertical to a film surface. When the magnetization direction of a part of the magnetic free layer is determined by a current magnetic field, a whole magnetization direction of the magnetic free layer is changed all at once by use of in-plane magnetic coupling.

According to this system, for example, a part of the magnetic free layer is disposed in a gap of a soft magnetic material (yoke material) which is a passage of a line of magnetic force, and a magnetic pinned layer is disposed outside the gap. Accordingly, a width of the gap is reduced, and the magnetic free layer can be disposed in the vicinity of a write line which is a path of a write current.

As a result, the current magnetic field can be efficiently applied to the magnetic free layer, and the system can contribute to the reduction of the current by the reduction of the write current.

Another proposal relates to a writing system in which the magnetic free layer is constituted of a vertical magnetization film and an in-plane magnetization film (horizontal magnetization film) having a horizontal conductive line with respect to the film surface. Data is written into the vertical magnetization film by use of the current magnetic field, and the direction of the magnetization of the in-plane magnetization film is changed in accordance with the data.

According to this system, the vertical magnetization film is disposed in a gap of the soft magnetic material, the data is written into the vertical magnetization film, the data of the vertical magnetization film is transferred to the in-plane magnetization film, and the data can be read based on the magnetization direction of the in-plane magnetization film.

As a result, for example, in the in-plane magnetization film, any fluctuation of characteristics is not generated by the thermal disturbance at a writing time, and reading can be speeded-up and stabilized by enhancement of a magneto-resistive (MR) ratio.

Moreover, in either of the above-described two systems, there is not special limitation as to a shape of a magneto-resistive element, and therefore each system can contribute to the reduction of the cell size by formation of a simple shape. Since the data is written into the vertical magnetization film, sufficient resistances to the erroneous writing/thermal disturbance can be secured, even if a memory cell is miniaturized.

2. Embodiments

Next, several embodiments supposed to be best will be described.

As a magnetic random access memory of a current magnetic field system in which data is written using a current magnetic field, for example, there are known a one-axis type in which the data is written using an only magnetic field having a one-axis direction, a two-axis type in which the data is written using a magnetic field having a two-axis direction.

In the following embodiments, examples of the one-axis and two-axis types will be described according to the present invention.

Additionally, it is not meant that the example of the present invention is not applicable to other types, and the example is, needless to say, applicable to another type, for example, a three-axis type in which the data is written using a magnetic field having three-axis directions.

(1) One-Axis Type

A. First Embodiment

In a first embodiment, a vertical magnetization film whose magnetization direction is vertical to a film surface is used as a magnetic free layer, and the magnetization direction of a part of the magnetic free layer is determined by a current magnetic field. At this time, when inter-particle magnetic coupling is strong in the magnetic free layer, and a material constituting a single magnetic domain is used in the whole free layer, a whole magnetization direction of the magnetic free layer can be changed all at once. There is proposed the magnetic random access memory utilizing the above-described writing system.

a. Circuit Example

FIG. 1 shows a magnetic random access memory of a first embodiment.

A memory cell array 10 comprises a plurality of arrayed memory cells 11. Each memory cell 11 comprises a magneto-resistive element 12 and a selection element 13 which are connected in series to each other.

Here, the magneto-resistive element 12 comprises, for example, a magneto tunnel junction (MTJ), and the selection element 13 comprises, for example, an N-channel MOS transistor.

For example, a local write bit line 14 extending in a column direction is disposed in the vicinity of the magneto-resistive element 12. The magnetization direction of the magneto-resistive element 12 is determined by the direction of a write current flowing through this local write bit line 14.

One end of the local write bit line 14 is connected to, for example, a global write bit line 15'. The global write bit line 15' extends, for example, in a row direction, and one end of the bit line is connected to a write driver/sinker 17.

The other end of the local write bit line 14 is connected to a global write bit line 16' via the selection element 13. The global write bit line 16' extends, for example, in the column direction, and one end of the bit line is connected to a write driver/sinker 18.

Each of the write drivers/sinkers 17, 18 has a decoder function, and selects one column from the memory cell array 10 at a writing time. Each of the write drivers/sinkers 17, 18 controls generation/interruption of a write current, and determines a direction of the write current flowing through the local write bit line 14 in accordance with a value of write data.

A gate of an N-channel MOS transistor which is the selection element 13 is connected to a word line 19. The word line 19 extends, for example, in the row direction, and one end thereof is connected to a row decoder 20 for selecting one row from the memory cell array 10 at a writing/reading time.

The magneto-resistive element 12 is connected between the local write bit line 14 and a read bit line 21. The read bit line 21 extends, for example, in the column direction. One end of the read bit line 21 is connected to a sense amplifier 23 via a selection element 22.

The selection element 22 comprises, for example, an N-channel MOS transistor. Into a gate of the N-channel MOS transistor which is the selection element 22, a column selection signal φCSL is input for selecting one column from the memory cell array 10 at a reading time.

The sense amplifier 23 comprises, for example, a differential amplifier, and judges a value of data read from the selected memory cell 11 based on a reference voltage Vref to output an output signal Vout.

b. Structure Example

Figure 2:
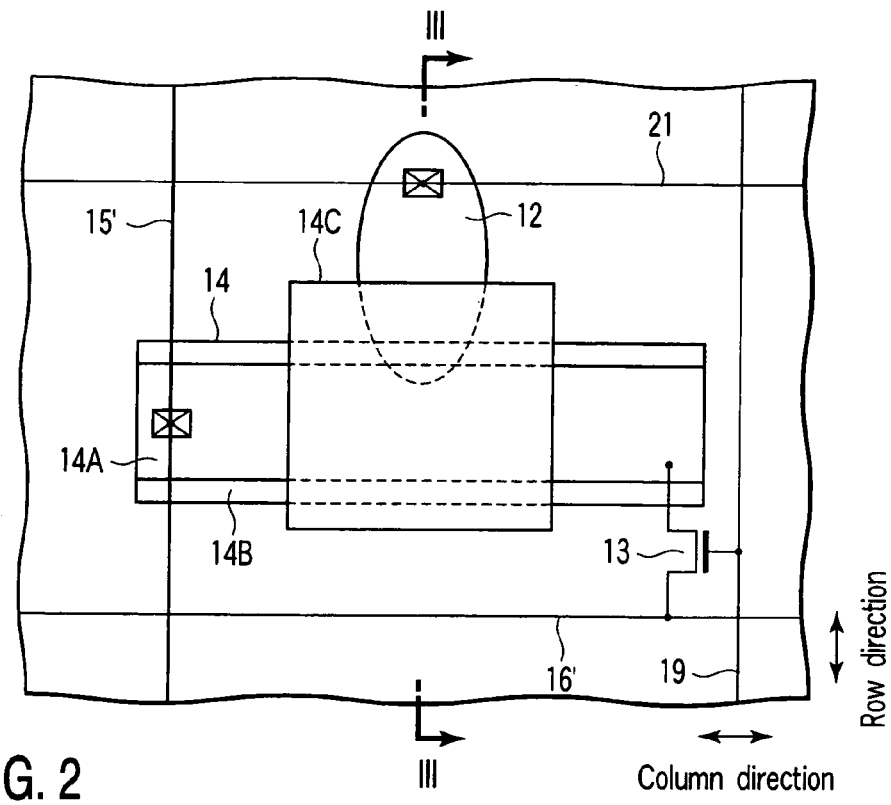
FIG. 2 is a plan view showing a structure example of the magnetic random access memory of the first embodiment.
Figure 3:
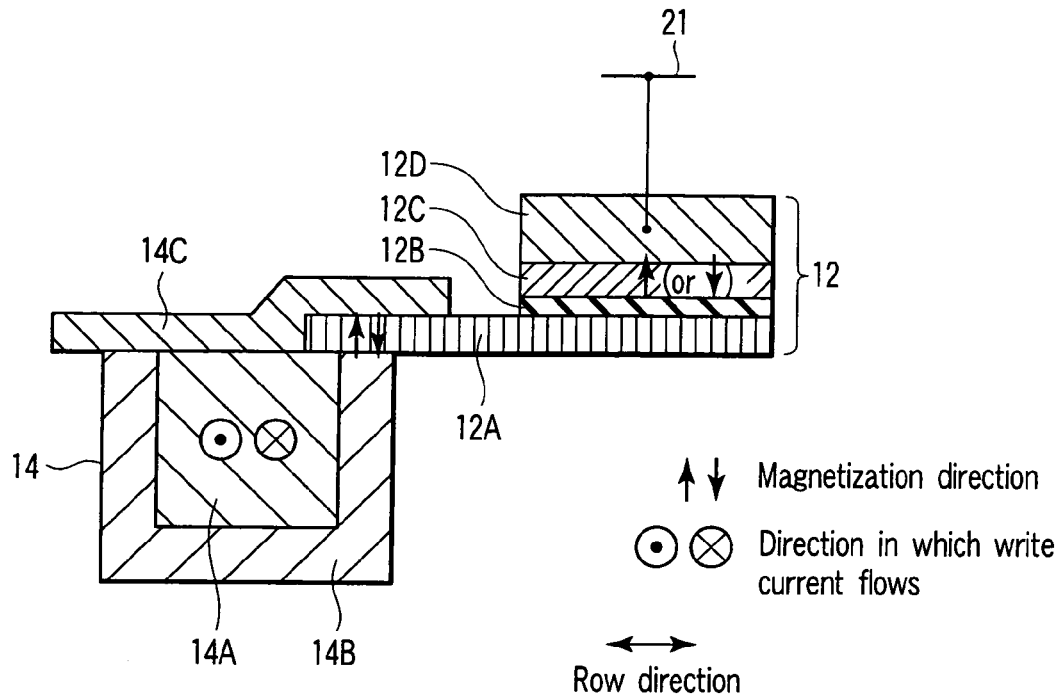
FIG. 3 is a sectional view along a line III-III of FIG. 2.

FIG. 2 shows a device structure of the memory cell of the first embodiment. FIG. 3 is a sectional view along a line III-III of FIG. 2.

The device structure described herein corresponds to the memory cell 11 of FIG. 1.

One end of the local write bit line 14 is connected to the global write bit line 15', and the other end thereof is connected to the global write bit line 16' via the selection element 13. The local write bit line 14 comprises, for example, a conductive line 14A made of a metal such as Al or Cu, and soft magnetic materials (yoke materials) 14B, 14C which surround the conductive line 14A. As the soft magnetic material, for example, Permalloy is preferably used. Furthermore, when the material is laminated on a diffusion preventive barrier film made of tantalum nitride or the like, characteristics of Permalloy or the conductive line metal can be prevented from being deteriorated.

For example, the soft magnetic material 14B covers side and bottom surfaces of the conductive line 14A, and the soft magnetic material 14C covers an upper surface of the conductive line 14A. Each of the soft magnetic materials 14B, 14C has a function of converging a line of magnetic force generated by the write current flowing through the local write bit line 14.

Between the soft magnetic materials 14B, 14C, there is disposed a gap constituting a passage of the converged line of magnetic force. A part of a magnetic free layer 12A of the magneto-resistive element 12 is disposed in this gap.

The magnetic free layer 12A of the magneto-resistive element 12 comprises a ferromagnetic film (vertical magnetization film) whose magnetization direction corresponds to a thickness direction vertical to the film surface. The magnetic free layer 12A is made of a material having strong in-plane magnetic coupling (magnetic coupling among particles) so that a whole magnetization direction is determined, when the magnetization direction of a part of the magnetic free layer is determined by the current magnetic field.

The magnetization direction (upward/downward) of the magnetic free layer 12A can be changed with the magnetic field (current magnetic field) generated by the write current flowing through the local write bit line 14.

A magnetic pinned layer 12C is disposed on the magnetic free layer 12A via a tunnel barrier layer 12B made of an insulating material. The magnetic pinned layer 12C comprises a ferromagnetic film so that the magnetization direction corresponds to the thickness direction vertical to the film surface, and the magnetization direction is pinned by an anti-ferromagnetic layer 12D made of a platinum-manganese alloy.

For example, the magnetization direction of the magnetic pinned layer 12C is pinned upwards.

The anti-ferromagnetic layer 12D is connected to the read bit line 21.

Here, in the present example, the tunnel barrier layer 12B, the magnetic pinned layer 12C, and the anti-ferromagnetic layer 12D are disposed outside the gap between the soft magnetic materials 14B, 14C.

Therefore, the magnetic free layer 12A can be disposed in the vicinity of the local write bit line 14. Moreover, the gap between the soft magnetic materials 14B, 14C can be narrowed, and the current magnetic field can be efficiently applied to the magnetic free layer 12A.

It is to be noted that each of the magnetic free layer 12A and the magnetic pinned layer 12C may comprise one magnetic layer or a plurality of laminated magnetic layers.

Moreover, each of the magnetic free layer 12A and the magnetic pinned layer 12C may have a special structure such as a synthetic anti-ferromagnetic (SAF) structure.

Furthermore, since each of the magnetic free layer 12A and the magnetic pinned layer 12C comprises a vertical magnetization film, there is not any special limitation as to a plane shape of the layer.

c. Operation

An operation of the magnetic random access memory shown in FIGS. 1 to 3 will be described.

Data is written by control of the direction of the write current flowing through the local write bit line 14 in the selected memory cell 11.

First, the word line 19 in the selected row is set to "H (high)" by use of the row decoder 20, and the selection element 13 in the memory cell 11 is turned on. Next, by use of the drivers/sinkers 17, 18, the write current is passed through the local write bit line 14 in the selected column.

In "0"-writing, for example, the write current is passed from the driver/sinker 17 toward the driver/sinker 18.

At this time, for example, in FIG. 3, the write current flows from a backside toward a front side of a drawing sheet through the local write bit line 14. The magnetization direction of a part of the magnetic free layer 12A, disposed in the gap between the soft magnetic materials 14B, 14C, changes to an upward direction. Accordingly, the whole magnetization direction of the magnetic free layer 12A changes to the upward direction by the strong in-plane magnetic coupling.

Consequently, both of the magnetization directions of the magnetic free layer 12A and the magnetic pinned layer 12C change to the upward directions (parallel states), and the "0"-writing is completed.

In "1"-writing, for example, the write current is passed from the driver/sinker 18 toward the driver/sinker 17.

At this time, for example, in FIG. 3, the write current flows from the front side toward the backside of the drawing sheet through the local write bit line 14. The magnetization direction of a part of the magnetic free layer 12A, disposed in the gap between the soft magnetic materials 14B, 14C, changes to a downward direction. Accordingly, the whole magnetization direction of the magnetic free layer 12A changes to the downward direction by the strong in-plane magnetic coupling.

Consequently, the magnetization direction of the magnetic free layer 12A changes to the downward direction, the magnetization direction of the magnetic pinned layer 12C changes to the upward direction (anti-parallel state), and the "1"-writing is completed.

To read the data, a read current is passed through the magneto-resistive element 12, and a resistance value of the magneto-resistive element 12 is detected by the sense amplifier 23.

First, the word line 19 in the selected row is set to "H" by use of the row decoder 20, and the selection element 13 in the memory cell 11 is turned on. Next, the column is selected in response to the column selection signal φCSL, and the read current is passed through the read bit line 21.

In "0"-reading, the magneto-resistive element 12 is brought into the parallel state, and the resistance value is small. Therefore, for example, when the read current is passed from the sense amplifier 23 toward the driver/sinker 18, an input voltage Vin of the sense amplifier 23 is smaller than the reference voltage Vref.

Consequently, it is detected that the magneto-resistive element 12 in the selected memory cell 11 is brought into the parallel state.

In "1"-reading, the magneto-resistive element 12 is brought into the anti-parallel state, and the resistance value is large. Therefore, for example, when the read current is passed from the sense amplifier 23 toward the driver/sinker 18, the input voltage Vin of the sense amplifier 23 is larger than the reference voltage Vref.

Consequently, it is detected that the magneto-resistive element 12 in the selected memory cell 11 is brought into the anti-parallel state.

d. Modifications

Next, modifications of the device structure will be described according to the first embodiment.

Figure 4:
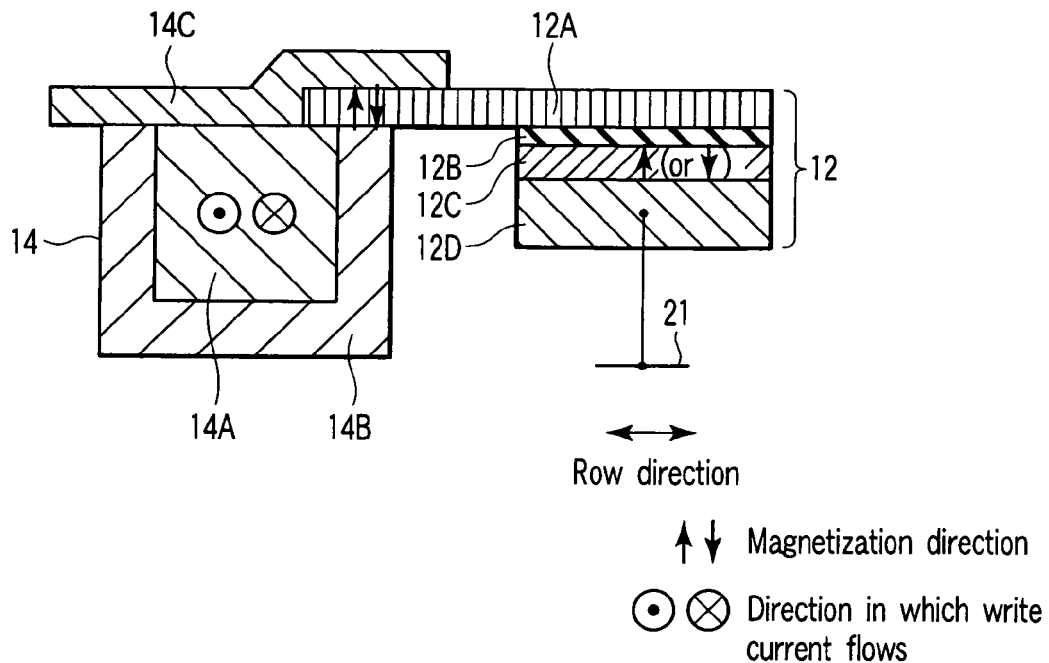
FIG. 4 is a sectional view showing a first modification of the first embodiment.

FIG. 4 shows a first modification.

The first modification is characterized in that a magneto-resistive element 12 has a bottom pin structure.

That is, in the structure of FIG. 3, the magneto-resistive element 12 has a top pin structure, and the magnetic free layer 12A, the tunnel barrier layer 12B, the magnetic pinned layer 12C, and the anti-ferromagnetic layer 12D are formed in order from a semiconductor substrate side.

On the other hand, in the structure of FIG. 4, in the magneto-resistive element 12, an anti-ferromagnetic layer 12D, a magnetic pinned layer 12C, a tunnel barrier layer 12B, and a magnetic free layer 12A are formed in order from a semiconductor substrate side.

Another structure is the same as that of the first embodiment.

Figure 5:
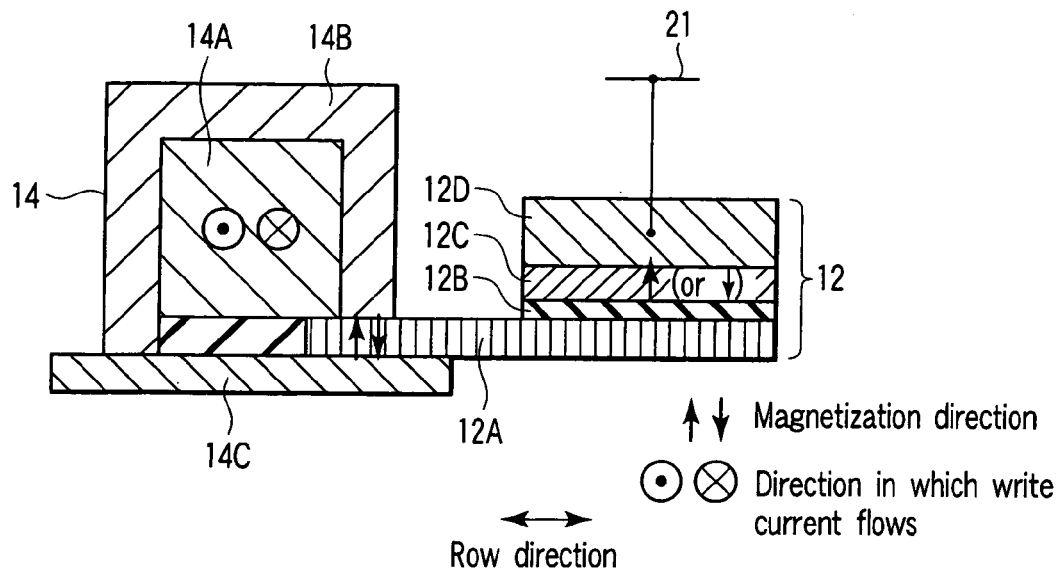
FIG. 5 is a sectional view showing a second modification of the first embodiment.

FIG. 5 shows a second modification.

Characteristics of the second modification lie in that a part of a magnetic free layer 12A disposed in a gap between soft magnetic materials 14B, 14C is positioned right under a local write bit line 14.

That is, in the structure of FIG. 3, a part of the magnetic free layer 12A is disposed right on the local write bit line 14. On the other hand, in the structure of FIG. 5, a part of the magnetic free layer 12A is disposed right under the local write bit line 14.

Another structure is the same as that of the first embodiment.

Figure 6:
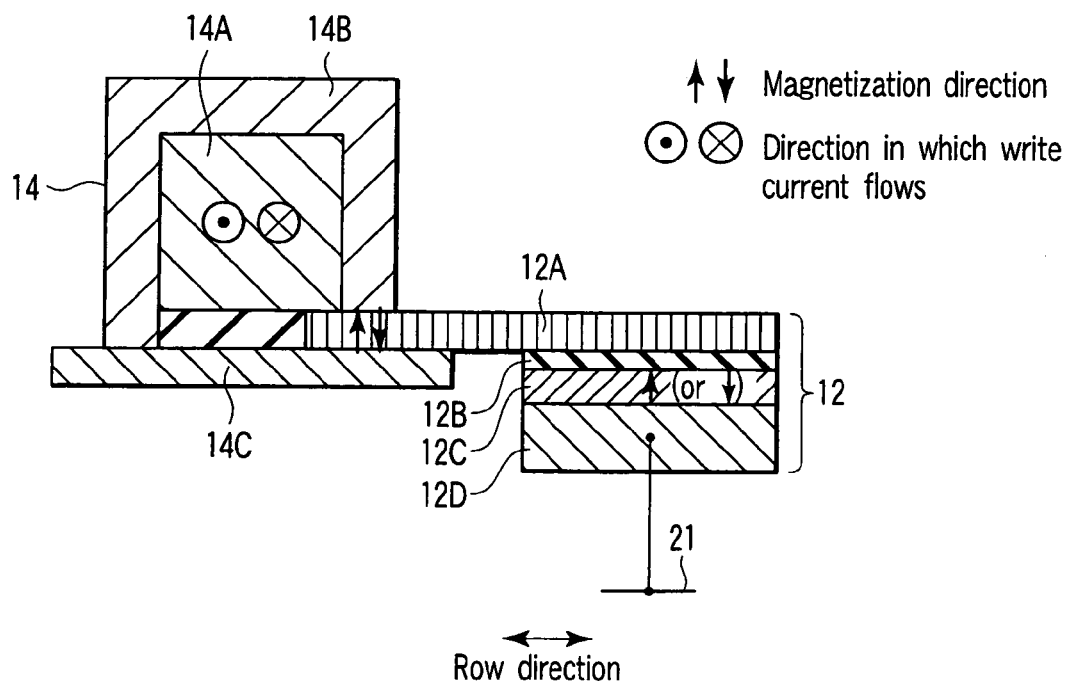
FIG. 6 is a sectional view showing a third modification of the first embodiment.

FIG. 6 shows a third modification.

Characteristics of the third modification include both of the characteristics of the first and second modifications.

That is, a magneto-resistive element 12 has a bottom pin structure, and an anti-ferromagnetic layer 12D, a magnetic pinned layer 12C, a tunnel barrier layer 12B, and a magnetic free layer 12A are formed in order from a semiconductor substrate side.

Moreover, a part of the magnetic free layer 12A is disposed right under the local write bit line 14.

Another structure is the same as that of the first embodiment.

Effects similar to those of the first embodiment can be obtained even in the first to third modifications.

e. Conclusions

As described above, according to the first embodiment, there is utilized the writing system in which the vertical magnetization film is used as the magnetic free layer, the magnetization direction of a part of the magnetic free layer is determined by the current magnetic field, and accordingly the whole magnetization direction of the magnetic free layer is changed all at once by use of the in-plane magnetic coupling.

Therefore, for example, a part of the magnetic free layer is disposed in the gap between the soft magnetic materials (yoke materials), which is the passage of the line of magnetic force, and the magnetic pinned layer is disposed outside the gap. Accordingly, the magnetic free layer can be disposed in the vicinity of a write line which is a path of the write current, and the gap can be narrowed.

As a result, the current magnetic field can be efficiently applied to the magnetic free layer, and the embodiment can contribute to the current reduction by the reduction of the write current.

Moreover, in the first embodiment, since there is not any special limitation as to the shape of the magneto-resistive element, the embodiment can contribute to the reduction of the cell size, when the simple shape is constituted. Since the data is written in the vertical magnetization film, sufficient resistances to the erroneous writing/thermal disturbance can be secured, even if the memory cell is miniaturized.

B. Second Embodiment

In a second embodiment, there is proposed a magnetic random access memory utilizing a writing system in which a magnetic free layer comprises a vertical magnetization film whose magnetization direction corresponds to a thickness direction vertical to a film surface and an in-plane magnetization film (horizontal magnetization film) whose magnetization direction is horizontal to the film surface, data is written into the vertical magnetization film by use of a current magnetic field, and the data is transferred to the in-plane magnetization film.

a. Circuit Example

The circuit example of the first embodiment, that is, the circuit example of the magnetic random access memory of FIG. 1 is applied as such to the second embodiment.

b. Structure Example

Figure 8:
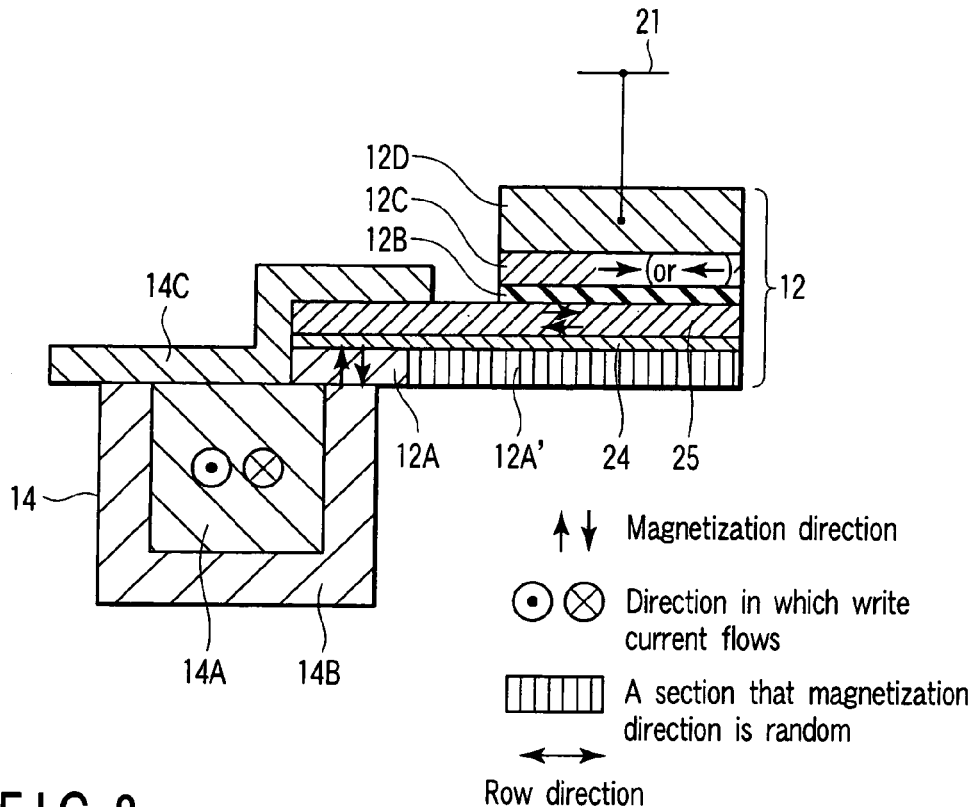
FIG. 8 is a sectional view along a line VIII-VIII of FIG. 7.

FIG. 7 shows a device structure of a magnetic cell of the second embodiment. FIG. 8 is a sectional view along a line VIII-VIII of FIG. 7.

The device structure described herein corresponds to the memory cell 11 of FIG. 1.

One end of a local write bit line 14 is connected to a global write bit line 15', and the other end thereof is connected to a global write bit line 16' via a selection element 13. The local write bit line 14 comprises, for example, a conductive line 14A made of a metal such as Al or Cu, and soft magnetic materials (yoke materials) 14B, 14C which surround the conductive line 14A.

For example, the soft magnetic material 14B covers side and bottom surfaces of the conductive line 14A, and the soft magnetic material 14C covers an upper surface of the conductive line 14A. Each of the soft magnetic materials 14B, 14C has a function of converging a line of magnetic force generated by a write current flowing through the local write bit line 14.

Between the soft magnetic materials 14B, 14C, there is disposed a gap constituting a passage of the converged line of magnetic force. A part of magnetic free layers 12A, 12A', 24, 25 of a magneto-resistive element 12 are disposed in this gap.

The magnetic free layers 12A, 12A', 24, 25 comprise: ferromagnetic films (vertical magnetization films) 12A, 12A' whose magnetization directions correspond to thickness directions vertical to a film surface; an anti-ferromagnetic film (in-plane magnetization film) 25 whose magnetization direction is horizontal to the film surface by shape anisotropy; and a nonmagnetic film 24 disposed among them.

In the present embodiment, the magnetic free layer 12A may be coupled with the anti-ferromagnetic film 25 through a mutually generated static magnetic field. Therefore, the nonmagnetic film 24 may be, for example, a nonmagnetic metal film such as a tantalum film, or a metal compound film of tantalum nitride or the like.

Moreover, by use of a metal compound, mutual diffusion of the upper and lower magnetic films is more effectively prevented, and element reliability can be enhanced.

The vertical magnetization film 12A is positioned in a gap between the soft magnetic materials 14B, 14C. A magnetization direction (upward/downward) of the vertical magnetization film 12A can be changed with the magnetic field (current magnetic field) generated by the write current flowing through the local write bit line 14.

On the other hand, the vertical magnetization film 12A' is positioned outside the gap between the soft magnetic materials 14B, 14C, and is made of a material having weak in-plane magnetic coupling so that the magnetization direction does not change with that of the vertical magnetization film 12A.

Moreover, total magnetization of the vertical magnetization film 12A' is set to zero by a demagnetizing operation or the like in order to prevent the magnetization direction of the in-plane magnetization film 25 from being influenced.

Furthermore, instead of the demagnetizing operation, for example, the vertical magnetization film 12A' may be constituted of a stacked structure of a plurality of magnetic layers different from one another in magnetization direction by 180°. In this case, effects similar to those of demagnetization can be obtained unless the magnetization is caused in a specific direction in the whole vertical magnetization film 12A'.

It is to be noted that to set the magnetization directions of the plurality of magnetic layers to opposite directions (directions different by 180° C.), for example, the plurality of magnetic layers are made of materials having different Curie points, and a direction of a magnetic field is directed to a direction different by 180° midway in a cooling step after annealing.

The magnetization direction of the in-plane magnetization film 25 depends on that of the vertical magnetization film 12A through coupling by the static magnetic field.

When the vertical magnetization film 12A has an upward magnetization direction, the magnetization direction of the in-plane magnetization film 25 changes to a rightward direction after interrupting the write current. When the vertical magnetization film 12A has a downward magnetization direction, the magnetization direction of the in-plane magnetization film 25 changes to a leftward direction after interrupting the write current.

The magnetization direction of the in-plane magnetization film 25 is determined only by the magnetization direction of the vertical magnetization film 12A after interrupting the write current.

As a result, the magnetization direction (rightward/leftward) of the in-plane magnetization film 25 can be indirectly changed by the magnetic field (current magnetic field) generated by the write current flowing through the local write bit line 14.

A magnetic pinned layer 12C is disposed on the in-plane magnetization film 25 via a tunnel barrier layer 12B made of an insulating material. The magnetic pinned layer 12C comprises a ferromagnetic film (in-plane magnetization film), and the magnetization direction is pinned by an anti-ferromagnetic layer 12D in such a manner as to be horizontal to the film surface.

For example, the magnetization direction of the magnetic pinned layer 12C is pinned rightwards.

The anti-ferromagnetic layer 12D is connected to a read bit line 21.

Here, in the present example, the tunnel barrier layer 12B, the magnetic pinned layer 12C, and the anti-ferromagnetic layer 12D are disposed outside the gap between the soft magnetic materials 14B, 14C.

Therefore, the vertical magnetization film 12A can be disposed in the vicinity of the local write bit line 14. Moreover, the gap between the soft magnetic materials 14B, 14C can be narrowed, and the current magnetic field can be efficiently applied to the vertical magnetization film 12A.

It is to be noted that in the present example, the tunnel barrier layer 12B, the magnetic pinned layer 12C, and the anti-ferromagnetic layer 12D may be disposed in the gap between the soft magnetic materials 14B, 14C.

Moreover, each of the vertical magnetization films 12A, 12A', the in-plane magnetization film 25, and the magnetic pinned layer 12C may comprise one magnetic layer or a plurality of laminated magnetic layers.

Moreover, each of the vertical magnetization films 12A, 12A', the in-plane magnetization film 25, and the magnetic pinned layer 12C may have a special structure such as an SAF structure.

Furthermore, there is not any special limitation as to plane shapes of the vertical magnetization films 12A, 12A'.

c. Operation

An operation of the magnetic random access memory shown in FIGS. 7 and 8 will be described.

Data is written by control of the direction of the write current flowing through the local write bit line 14 in the selected memory cell 11.

First, a word line 19 in the selected row is set to "H" by use of the row decoder 20 of FIG. 1, and the selection element 13 in the memory cell 11 is turned on. Next, by use of drivers/ sinkers 17, 18, the write current is passed through the local write bit line 14 in the selected column.

In "0"-writing, for example, the write current is passed from the driver/sinker 17 toward the driver/sinker 18.

At this time, for example, in FIG. 8, the write current flows from a backside toward a front side of a drawing sheet through the local write bit line 14. The magnetization direction of the vertical magnetization film 12A, disposed in the gap between the soft magnetic materials 14B, 14C, changes to an upward direction.

Thereafter, when the write current is interrupted, the magnetization direction of the in-plane magnetization film 25 is influenced by the magnetization of the vertical magnetization film 12A, and changes to a rightward direction.

Accordingly, both of the magnetization directions of the in-plane magnetization film 25 which is a magnetic free layer, and the magnetic pinned layer 12C change to the upward directions (parallel states), and the "0"-writing is completed.

In "1"-writing, for example, the write current is passed from the driver/sinker 18 toward the driver/sinker 17.

At this time, for example, in FIG. 8, the write current flows from the front side toward the backside of the drawing sheet through the local write bit line 14. The magnetization direction of the vertical magnetization film 12A, disposed in the gap between the soft magnetic materials 14B, 14C, changes to a downward direction.

Thereafter, when the write current is interrupted, the magnetization direction of the in-plane magnetization film 25 is influenced by the magnetization of the vertical magnetization film 12A, and changes to a leftward direction.

Consequently, the magnetization direction of the in-plane magnetization film 25, which is the magnetic free layer, changes to the leftward direction, the magnetization direction of the magnetic pinned layer 12C changes to the rightward direction (anti-parallel state), and the "1"-writing is completed.

To read the data, a read current is passed through the magneto-resistive element 12, and a resistance value of the magneto-resistive element 12 is detected by a sense amplifier 23.

First, the word line 19 in the selected row is set to "H" by use of the row decoder 20 of FIG. 1, and the selection element 13 in the memory cell 11 is turned on. Next, the column is selected in response to a column selection signal ϕCSL, and the read current is passed through the read bit line 21.

In "0"-reading, the magneto-resistive element 12 is brought into a parallel state, and a resistance value is small. Therefore, for example, when the read current is passed from the sense amplifier 23 toward the driver/sinker 18, an input voltage Vin of the sense amplifier 23 is smaller than a reference voltage Vref.

Consequently, it is detected that the magneto-resistive element 12 in the selected memory cell 11 is brought into the parallel state.

In "1"-reading, the magneto-resistive element 12 is brought into the anti-parallel state, and the resistance value is large. Therefore, for example, when the read current is passed from the sense amplifier 23 toward the driver/sinker 18, the input voltage Vin of the sense amplifier 23 is larger than the reference voltage Vref.

Consequently, it is detected that the magneto-resistive element 12 in the selected memory cell 11 is brought into the anti-parallel state.

d. Modifications

Next, modifications of the device structure will be described according to the second embodiment.

Figure 9:
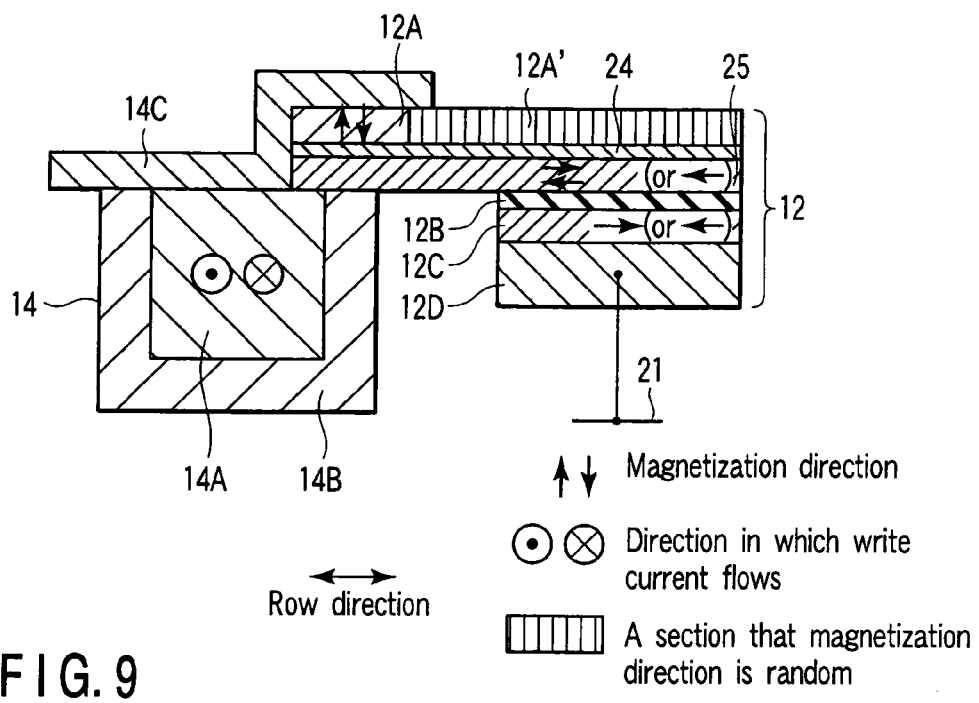
FIG. 9 is a sectional view showing a first modification of the second embodiment.

FIG. 9 shows a first modification.

The first modification is characterized in that a magneto-resistive element 12 has a bottom pin structure.

That is, in the structure of FIG. 8, the magneto-resistive element 12 has a top pin structure, and the magnetic free layers 12A, 12A', 24, 25, the tunnel barrier layer 12B, the magnetic pinned layer 12C, and the anti-ferromagnetic layer 12D are formed in order from a semiconductor substrate side.

On the other hand, in the structure of FIG. 9, in the magneto-resistive element 12, an anti-ferromagnetic layer 12D, a magnetic pinned layer 12C, a tunnel barrier layer 12B, and magnetic free layers 12A, 12A', 24, 25 are formed in order from a semiconductor substrate side.

Another structure is the same as that of the second embodiment.

Figure 10:
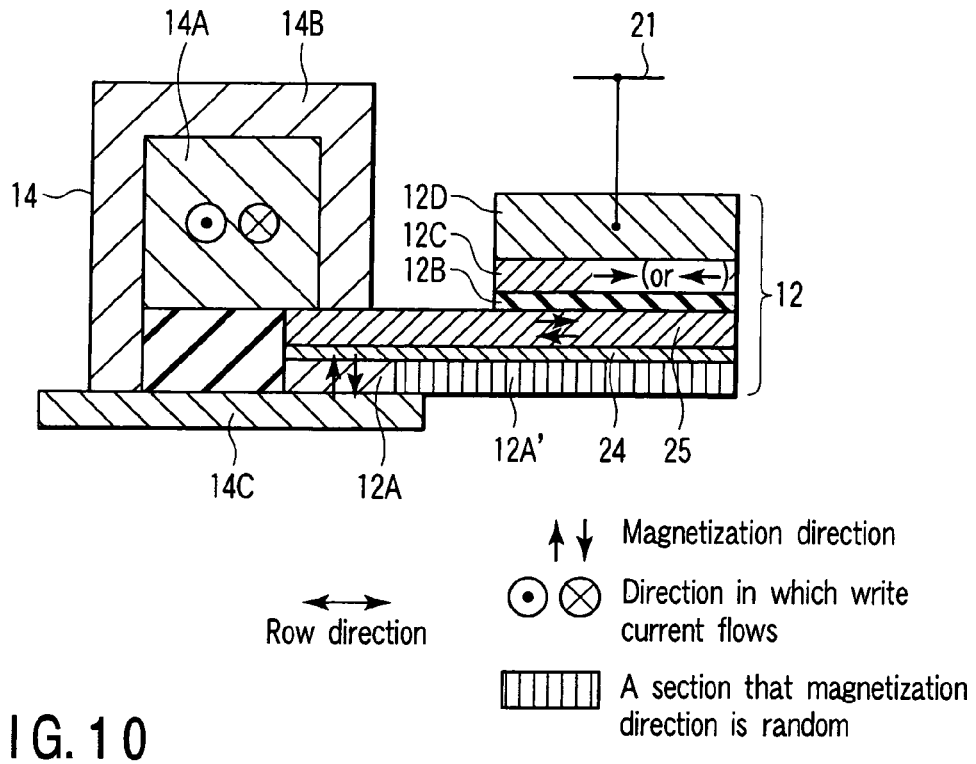
FIG. 10 is a sectional view showing a second modification of the second embodiment.

FIG. 10 shows a second modification.

Characteristics of the second modification lie in that magnetic free layers 12A, 24, 25, disposed in a gap between soft magnetic materials 14B, 14C, are positioned right under a local write bit line 14.

That is, in the structure of FIG. 8, the magnetic free layers 12A, 24, 25 are disposed right on the local write bit line 14. On the other hand, in the structure of FIG. 10, the magnetic free layers 12A, 24, 25 are disposed right under the local write bit line 14.

Another structure is the same as that of the second embodiment.

Figure 11:
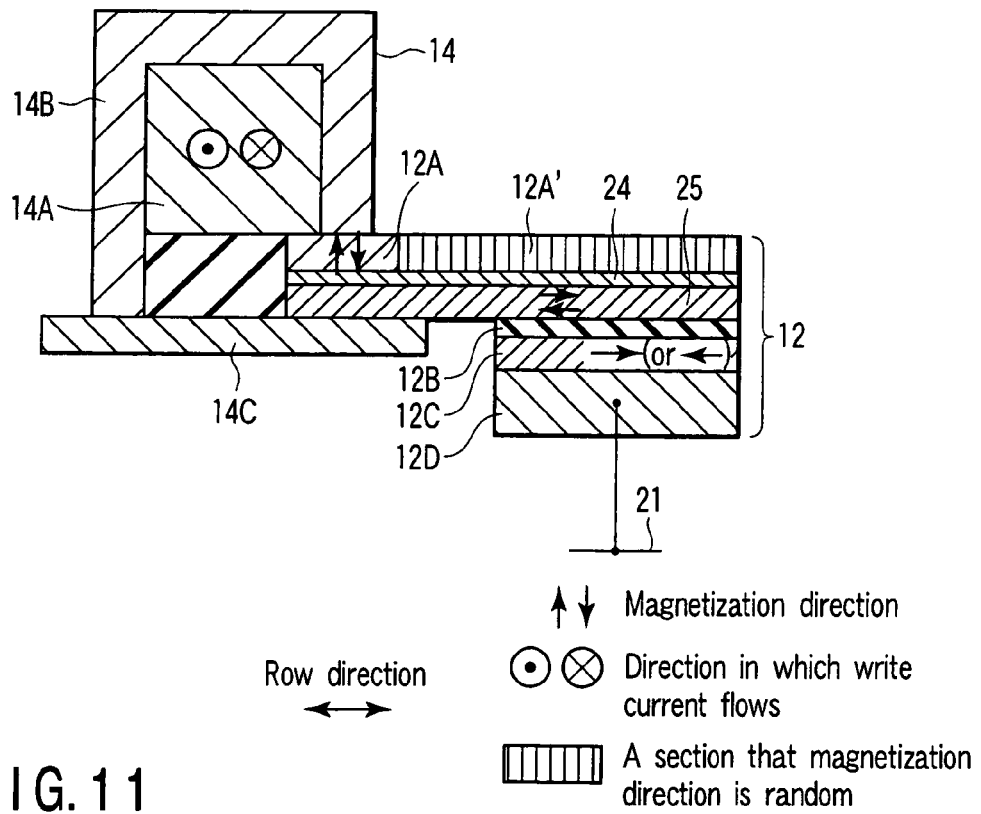
FIG. 11 is a sectional view showing a third modification of the second embodiment.

FIG. 11 shows a third modification.

Characteristics of the third modification include both of the characteristics of the first and second modifications.

That is, a magneto-resistive element 12 has a bottom pin structure, and an anti-ferromagnetic layer 12D, a magnetic pinned layer 12C, a tunnel barrier layer 12B, and magnetic free layers 12A, 12A', 24, 25 are formed in order from a semiconductor substrate side.

Moreover, the magnetic free layers 12A, 24, 25 are disposed right under a local write bit line 14.

Another structure is the same as that of the second embodiment.

Figure 12:
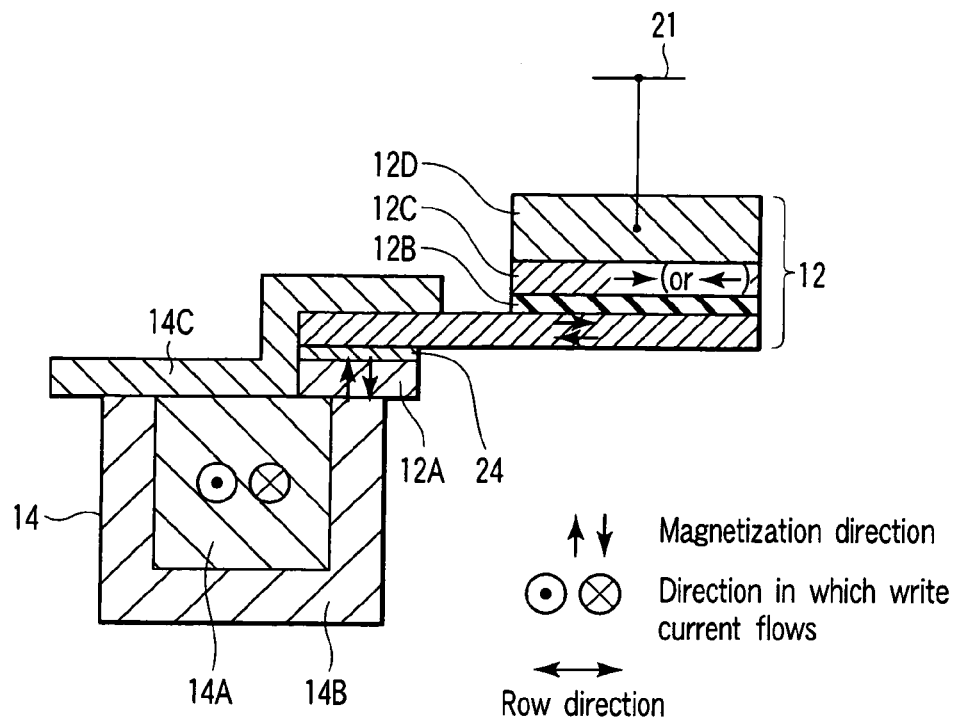
FIG. 12 is a sectional view showing a fourth modification of the second embodiment.

FIG. 12 shows a fourth modification.

The fourth modification has a structure in which the vertical magnetization film 12A' of FIG. 8 does not exist.

That is, in the structure of FIG. 8, a demagnetizing operation is performed, or the vertical magnetization film 12A' whose whole magnetization is zero exists right under the in-plane magnetization film 25. This structure is constituted in consideration of reduction of the number of steps of a wafer process, that is, simultaneous working of magnetic free layers 12A, 12A', 24, 25 by the same mask.

However, the scope of the second embodiment lies in that the magnetization of the in-plane magnetization film 25 is determined by that of the vertical magnetization film 12A which exists in an end portion of the in-plane magnetization film. Ideally, there is not provided the vertical magnetization film 12A' which has a possibility of influencing the magnetization direction of the in-plane magnetization film 25.

To solve the problem, in the fourth modification, as shown in FIG. 12, an only vertical magnetization film 12A in a gap between soft magnetic materials 14B,. 14C is disposed right under an in-plane magnetization film 25.

Another structure is the same as that of the second embodiment.

Figure 13:
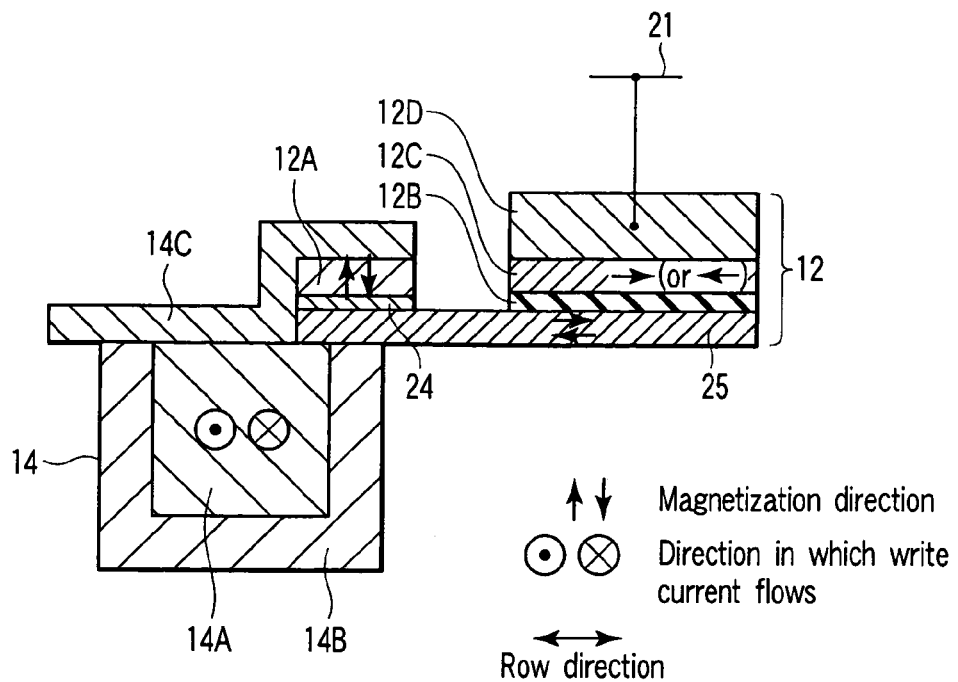
FIG. 13 is a sectional view showing a fifth modification of the second embodiment.

FIG. 13 shows a fifth modification.

The fifth modification includes the characteristics of the fourth modification.

That is, the vertical magnetization film 12A' of FIG. 8 does not exist. A vertical magnetization film 12A and a nonmagnetic film 24 are disposed on an in-plane magnetization film 25. In this case, there is an advantage that a structure of a magneto-resistive element 12 is simple.

Another structure is the same as that of the second embodiment.

Effects similar to those of the second embodiment can be obtained even in the first to fifth modifications.

e. Conclusions

As described above, according to the second embodiment, there is utilized the writing system in which the vertical magnetization film is disposed in the gap between the soft magnetic materials, the data is written in this vertical magnetization film, the data of the vertical magnetization film is transferred to the in-plane magnetization film, and the data is read based on the magnetization direction of the in-plane magnetization film.

Therefore, a resistance to thermal disturbance is determined by characteristics of the vertical magnetization film, and is not deteriorated, even if a memory cell is miniaturized. In the in-plane magnetization film, there are not generated any fluctuation in the characteristics because of thermal disturbance at a writing time or the like, and the reading can be speeded up and stabilized by enhancement of an MR ratio.

Moreover, the resistance to thermal disturbance can be optimized by the vertical magnetization film independently of reading characteristics (MR ratio) which can be optimized by the in-plane magnetization film. Furthermore, magnetization reverse by a current magnetic field may be performed only with respect to the vertical magnetization film disposed in the gap between the soft magnetic materials, and the magnetization reverse is not performed by direct application of the current magnetic field to the in-plane magnetization film. Therefore, a value of the write current can be largely reduced.

It is to be noted that even in the second embodiment, there is not any special limitation to a shape of the magneto-resistive element. Therefore, the embodiment can contribute to reduction of a cell size, when the simple shape is constituted.

(2) Two-Axis Type

A. Third Embodiment

In a third embodiment, there is proposed a magnetic random access memory utilizing the same writing system as that of the first embodiment, that is, a writing system in which a vertical magnetization film whose magnetization direction is vertical to a film surface is used as a magnetic free layer, and the magnetization direction of a part of the magnetic free layer is determined by a current magnetic field. Accordingly, all of the magnetization directions of the magnetic free layers are changed all at once by use of in-plane magnetic coupling.

a. Circuit Example

Figure 14:
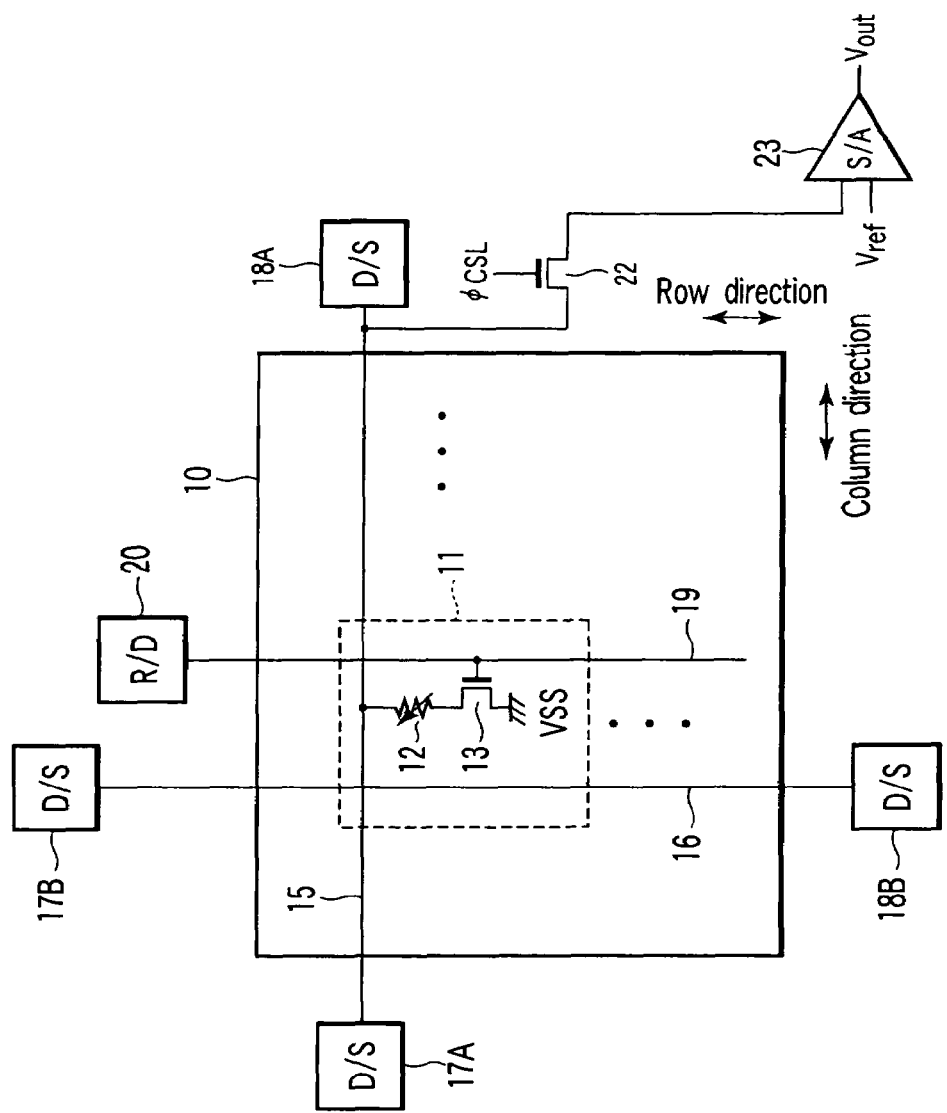
FIG. 14 is a circuit diagram showing an example of a circuit of the magnetic random access memory according to a third embodiment.

FIG. 14 shows a magnetic random access memory of a third embodiment.

A memory cell array 10 comprises a plurality of arrayed memory cells 11. Each memory cell 11 comprises a magneto-resistive element 12 and a selection element 13 which are connected in series to each other. The magneto-resistive element 12 comprises, for example, an MTJ element, and the selection element 13 comprises, for example, an N-channel MOS transistor.

One end of the magneto-resistive element 12 is connected to a write bit line 15 extending, for example, in a column direction. One end of the write bit line 15 is connected to a write driver/sinker 17A, and the other end thereof is connected to a write driver/sinker 18A.

Each of the write drivers/sinkers 17A, 18A has a decoder function, and selects one column from the memory cell array 10 at a writing time. Each of the write drivers/sinkers 17A, 18A controls generation/interruption of a write current, and determines a direction of the write current flowing through the write bit line 15 in accordance with a value of write data.

The write bit line 15 also functions as a read bit line.

The other end of the write bit line 15 is connected to a sense amplifier 23 via a selection element 22.

The selection element 22 comprises, for example, an N-channel MOS transistor. Into a gate of the N-channel MOS transistor which is the selection element 22, a column selection signal φCSL is input for selecting one column from the memory cell array 10 at a reading time.

The sense amplifier 23 comprises, for example, a differential amplifier, and judges a value of data read from the selected memory cell 11 based on a reference voltage Vref to output an output signal Vout.

A write word line 16 extending, for example, in a row direction is disposed in the vicinity of the magneto-resistive element 12. One end of the write word line 16 is connected to a write driver/sinker 17B, and the other end thereof is connected to a write driver/sinker 18B.

Each of the write drivers/sinkers 17B, 18B has a decoder function, and selects one row from the memory cell array 10 at the writing time. Each of the write drivers/sinkers 17B, 18B controls the generation/interruption of the write current, and determines the direction of the write current flowing through the write word line 16 in accordance with the value of the write data.

A magnetization direction of the magneto-resistive element 12 is determined by a composite magnetic field of a magnetic field generated by the write current flowing through the write bit line 15, and a magnetic field generated by the write current flowing through the write word line 16.

The other end of the magneto-resistive element 12 is connected to, for example, a ground terminal Vss via the selection element 13.

A gate of the N-channel MOS transistor which is the selection element 13 is connected to a read word line 19. The read word line 19 extends, for example, in the row direction, and one end thereof is connected to a row decoder 20 for selecting one row from the memory cell array 10 at the reading time.

b. Structure Example

Figure 15:
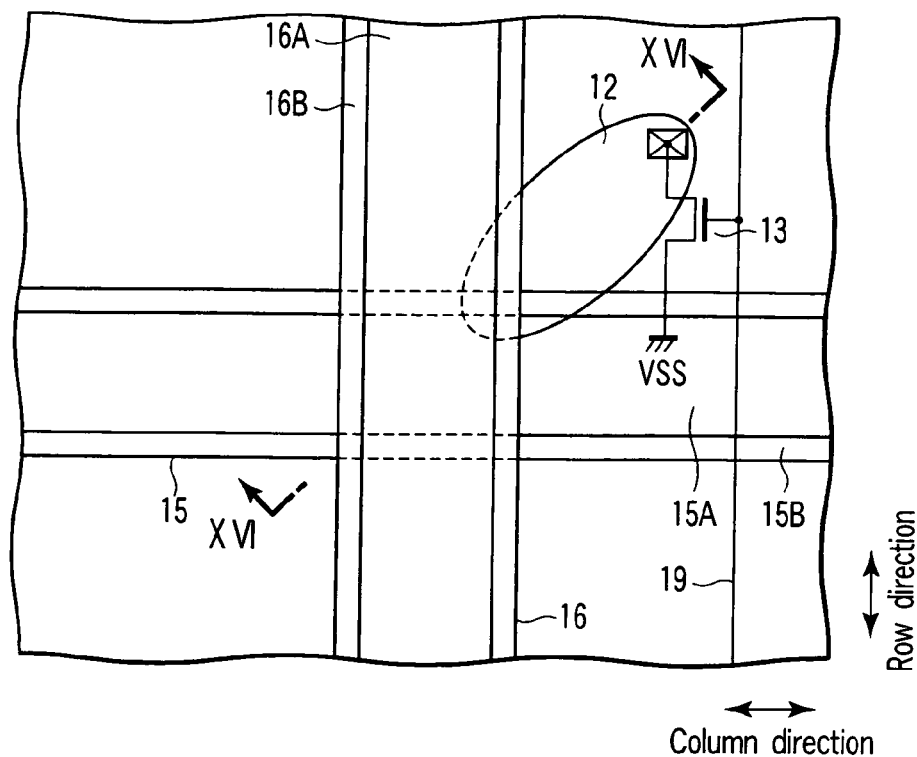
FIG. 15 is a plan view showing an example of the structure of the magnetic random access memory according to the third embodiment.
Figure 16:
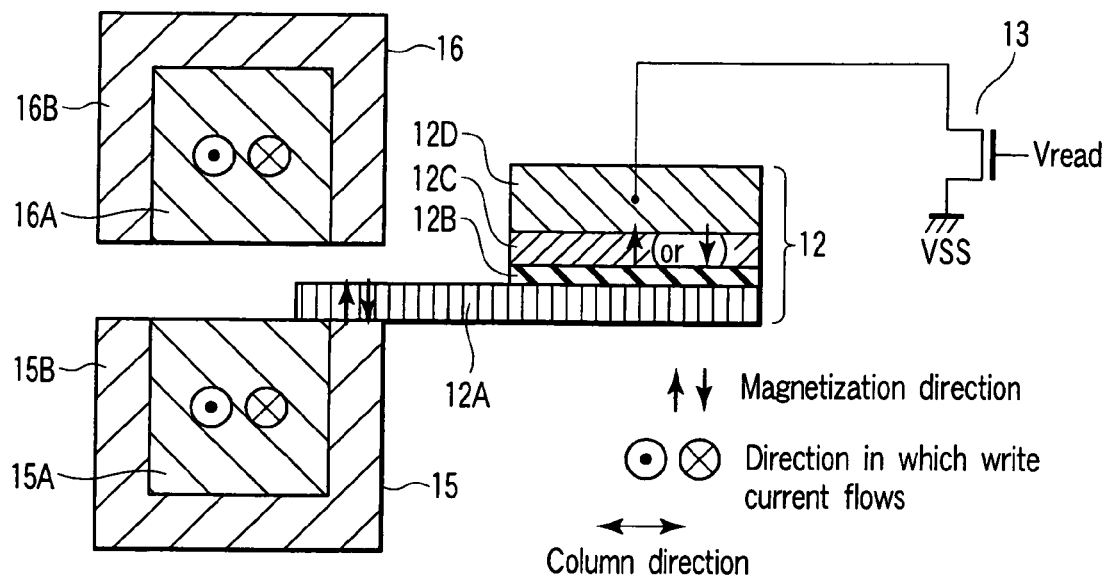
FIG. 16 is a sectional view along a line XVI-XVI of FIG. 15.

FIG. 15 shows a device structure of the memory cell of the third embodiment. FIG. 16 is a sectional view along a line XVI-XVI of FIG. 15.

The device structure described herein corresponds to the memory cell 11 of FIG. 14.

The write bit line 15 comprises, for example, a conductive line 15A made of a metal such as Al or Cu, and a soft magnetic material (yoke material) 15B which surrounds the conductive line 15A. Similarly, the write word line 16 comprises, for example, a conductive line 16A made of a metal such as Al or Cu, and a soft magnetic material (yoke material) 16B which surrounds the conductive line 16A.

The soft magnetic material 15B covers side and bottom surfaces of the conductive line 15A, and the soft magnetic material 16B covers side and upper surfaces of the conductive line 16A. Each of the soft magnetic materials 15B, 16B has a function of converging a line of magnetic force generated by the write current flowing through the write bit line 15 and the write word line 16.

Between the soft magnetic materials 15B, 16B, there are arranged a plurality of gaps constituting passages of the converged line of magnetic force. A part of a magnetic free layer 12A of the magneto-resistive element 12 is disposed in one of the plurality of gaps.

The magnetic free layer 12A of the magneto-resistive element 12 comprises a ferromagnetic film (vertical magnetization film) whose magnetization direction corresponds to a thickness direction vertical to the film surface. The magnetic free layer 12A is made of a material having strong in-plane magnetic coupling so that a whole magnetization direction is determined, when the magnetization direction of a part of the magnetic free layer is determined by the current magnetic field.

The magnetization direction (upward/downward) of the magnetic free layer 12A can be changed with the magnetic field (current magnetic field) generated by the write current flowing through the write bit line 15 and the write word line 16.

A magnetic pinned layer 12C is disposed on the magnetic free layer 12A via a tunnel barrier layer 12B made of an insulating material. The magnetic pinned layer 12C comprises a ferromagnetic film (vertical magnetization film) so that the magnetization direction corresponds to the thickness direction vertical to the film surface, and the magnetization direction is pinned by an anti-ferromagnetic layer 12D.

For example, the magnetization direction of the magnetic pinned layer 12C is pinned upwards.

The anti-ferromagnetic layer 12D is connected to the ground point Vss via the N-channel MOS transistor which is the selection element 13. A read signal Vread is input into a gate of this MOS transistor.

Here, in the present example, the tunnel barrier layer 12B, the magnetic pinned layer 12C, and the anti-ferromagnetic layer 12D are arranged outside a plurality of gaps between the soft magnetic materials 15B, 16B.

Therefore, widths of the plurality of gaps between the soft magnetic materials 15B, 16B are reduced, and the magnetic free layer 12A is disposed in one of the plurality of gaps which are passages of the current magnetic field. Accordingly, the current magnetic field can be efficiently applied to the magnetic free layer 12A.

It is to be noted that each of the magnetic free layer 12A and the magnetic pinned layer 12C may comprise one magnetic layer or a plurality of laminated magnetic layers.

Moreover, each of the magnetic free layer 12A and the magnetic pinned layer 12C may have a special structure such as an SAF structure.

Furthermore, since each of the magnetic free layer 12A and the magnetic pinned layer 12C comprises a vertical magnetization film, there is not any special limitation as to a plane shape of the layer.

c. Operation

An operation of the magnetic random access memory shown in FIGS. 14 to 16 will be described.

Data is written by control of the direction of the write current flowing through the write bit line 15 and the write word line 16 in the selected memory cell 11.

First, by use of the drivers/sinkers 17A, 18A, the write current is passed through the write bit line 15 in the selected column. By use of the drivers/sinkers 17B, 18B, the write current is passed through the write word line 16 in the selected row.

In "0"-writing, for example, the write current is passed from the driver/sinker 17A toward the driver/sinker 18A, and the write current is passed from the driver/sinker 17B to the driver/sinker 18B.

At this time, for example, in FIG. 16, the write current flows from a backside toward a front side of a drawing sheet through the write bit line 15 and the write word line 16. The magnetization direction of a part of the magnetic free layer 12A, disposed in the gap between the soft magnetic materials 15B, 16B, changes to an upward direction. Accordingly, the whole magnetization direction of the magnetic free layer 12A changes to the upward direction by the strong in-plane magnetic coupling.

Consequently, both of the magnetization directions of the magnetic free layer 12A and the magnetic pinned layer 12C change to the upward directions (parallel states), and the "0"-writing is completed.

In "1"-writing, for example, the write current is passed from the driver/sinker 18A toward the driver/sinker 17A, and the write current is passed from the driver/sinker 18B toward the driver/sinker 17B.

At this time, for example, in FIG. 16, the write current flows from the front side toward the backside of the drawing sheet through the write bit line 15 and the write word line 16. The magnetization direction of a part of the magnetic free layer 12A, disposed-in the gap between the soft magnetic materials 15B, 16B, changes to a downward direction. Accordingly, the whole magnetization direction of the magnetic free layer 12A changes to the downward direction by the strong in-plane magnetic coupling.

Consequently, the magnetization direction of the magnetic free layer 12A changes to the downward direction, the magnetization direction of the magnetic pinned layer 12C changes to the upward direction (anti-parallel state), and the "1"-writing is completed.

To read the data, a read current is passed through the magneto-resistive element 12, and a resistance value of the magneto-resistive element 12 is detected by the sense amplifier 23.

First, the word line 19 in the selected row is set to "H" by use of the row decoder 20, and the selection element 13 in the memory cell 11 is turned on. Next, the column is selected in response to a column selection signal φCSL, and the read current is passed from the sense amplifier 23 through the write bit line (read bit line) 15 toward the memory cell 11.

In "0"-reading, the magneto-resistive element 12 is brought into the parallel state, and the resistance value is small. Therefore, for example, when the read current is passed through the magneto-resistive element 12, an input voltage Vin of the sense amplifier 23 is smaller than the reference voltage Vref.

Consequently, it is detected that the magneto-resistive element 12 in the selected memory cell 11 is brought into the parallel state.

In "1"-reading, the magneto-resistive element 12 is brought into the anti-parallel state, and the resistance value is large. Therefore, for example, when the read current is passed through the magneto-resistive element 12, the input voltage Vin of the sense amplifier 23 is larger than the reference voltage Vref.

Consequently, it is detected that the magneto-resistive element 12 in the selected memory cell 11 is brought into the anti-parallel state.

d. Modifications

Next, modifications of the device structure will be described according to the third embodiment.

Figure 17:
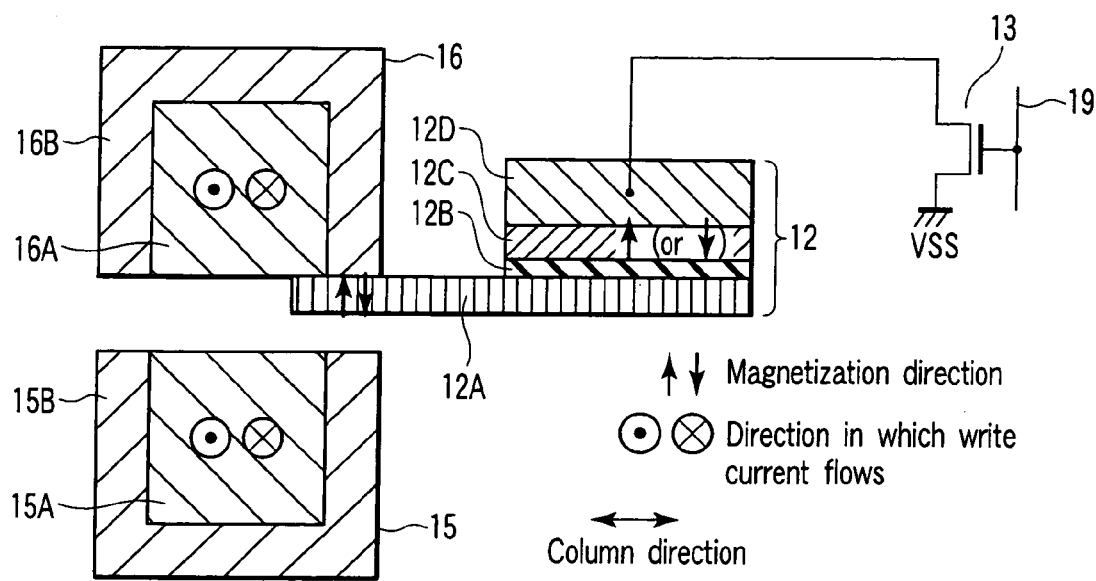
FIG. 17 is a sectional view showing a first modification of the third embodiment.

FIG. 17 shows a first modification.

The first modification is characterized in that a magnetic free layer 12A of a magneto-resistive element 12 is connected to a write word line 16.

That is, in the structure of FIG. 16, the magnetic free layer 12A is connected to the write bit line 15. That is, in this case, the write bit line 15 also functions as a read bit line, and the write bit line 15 is connected to a sense amplifier.

On the other hand, in the structure of FIG. 17, the magnetic free layer 12A is connected to a write word line 16. That is, in this case, since the write word line 16 functions as a read word line, the write word line 16 is connected to a sense amplifier.

Another structure is the same as that of the third embodiment.

Figure 18:
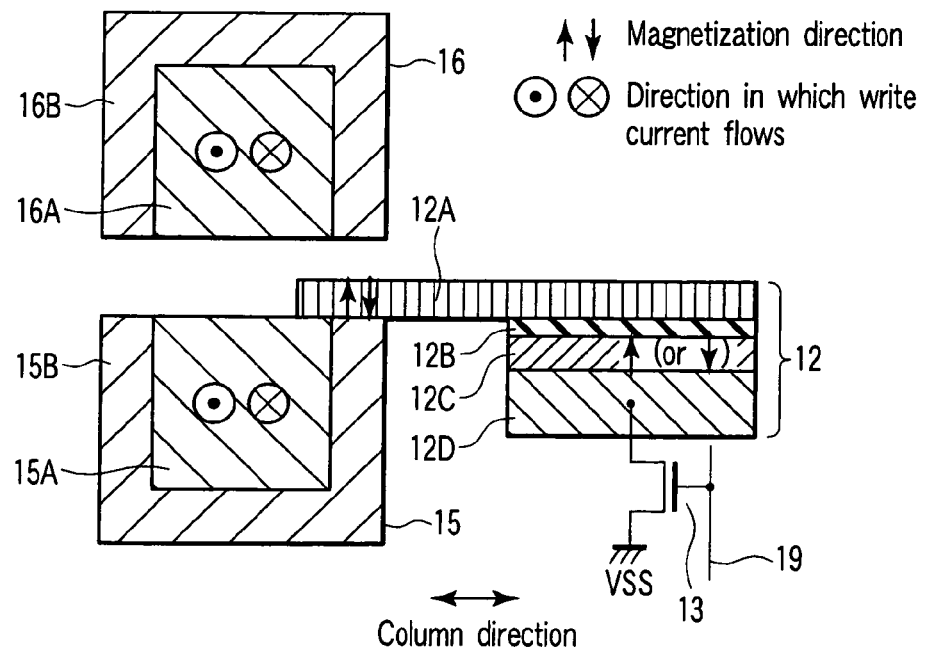
FIG. 18 is a sectional view showing a second modification of the third embodiment.

FIG. 18 shows a second modification.

Characteristics of the second modification lie in that a magneto-resistive element 12 has a bottom pin structure.

That is, in the structure of FIG. 16, the magneto-resistive element 12 has a top pin structure, and the magnetic free layer 12A, the tunnel barrier layer 12B, the magnetic pinned layer 12C, and the anti-ferromagnetic layer 12D are formed in order from a semiconductor substrate side.

On the other hand, in the structure of FIG. 18, in the magneto-resistive element 12, an anti-ferromagnetic layer 12D, a magnetic pinned layer 12C, a tunnel barrier layer 12B, and a magnetic free layer 12A are formed in order from a semiconductor substrate side.

Another structure is the same as that of the third embodiment.

Figure 19:
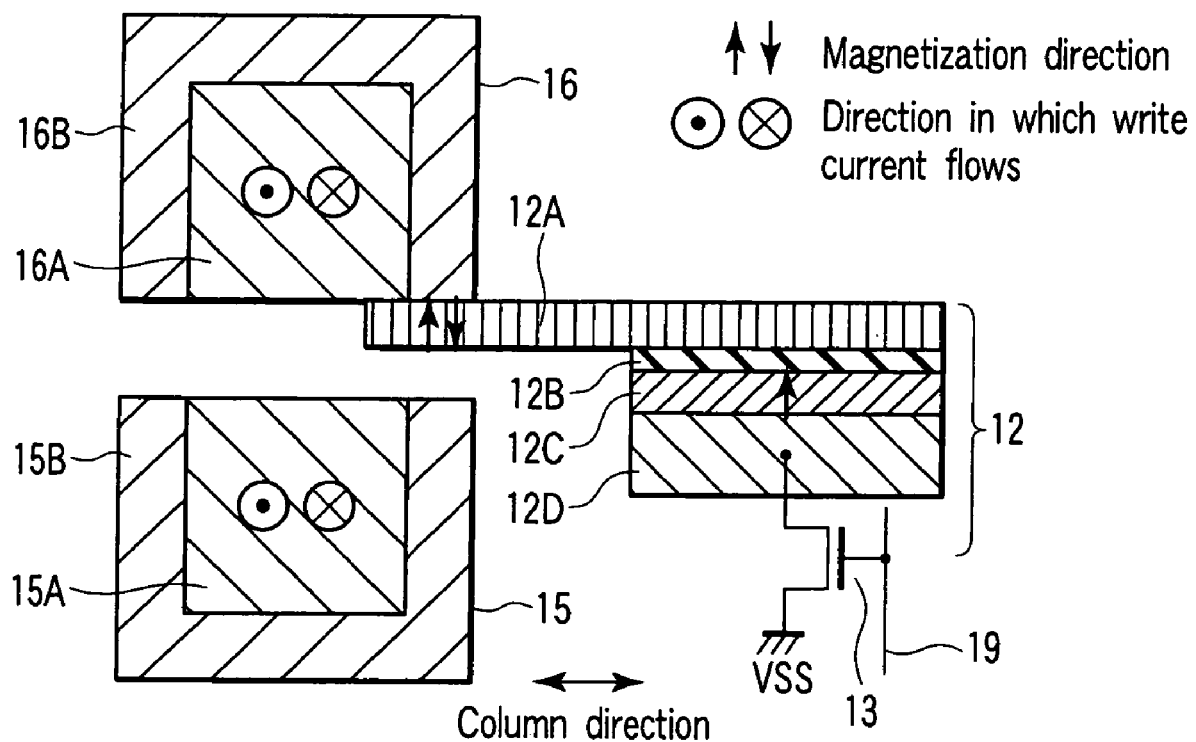
FIG. 19 is a sectional view showing a third modification of the third embodiment.

FIG. 19 shows a third modification.

Characteristics of the third modification include both of the characteristics of the first and second modifications.

That is, a magneto-resistive element 12 has a bottom pin structure, and an anti-ferromagnetic layer 12D, a magnetic pinned layer 12C, a tunnel barrier layer 12B, and a magnetic free layer 12A are formed in order from a semiconductor substrate side.

Moreover, the magnetic free layer 12A is connected to a write word line 16.

Another structure is the same as that of the third embodiment.

Effects similar to those of the third embodiment can be obtained even in the first to third modifications.

e. Conclusions

As described above, according to the third embodiment, in the two-axis magnetic random access memory, it is possible to simultaneously realize the effects similar to those of the first embodiment, that is, current reduction, reduction of a cell size, and enhancement of resistances to erroneous writing/thermal disturbance.

B. Fourth Embodiment

A fourth embodiment is an improvement of the third embodiment, and relates to the same writing system as that of the third embodiment. In the fourth embodiment, a plurality of magneto-resistive elements are arranged in an intersection between two write lines (two axis), and a memory capacity is increased by high integration of a memory cell.

a. Circuit Example

Figure 20:
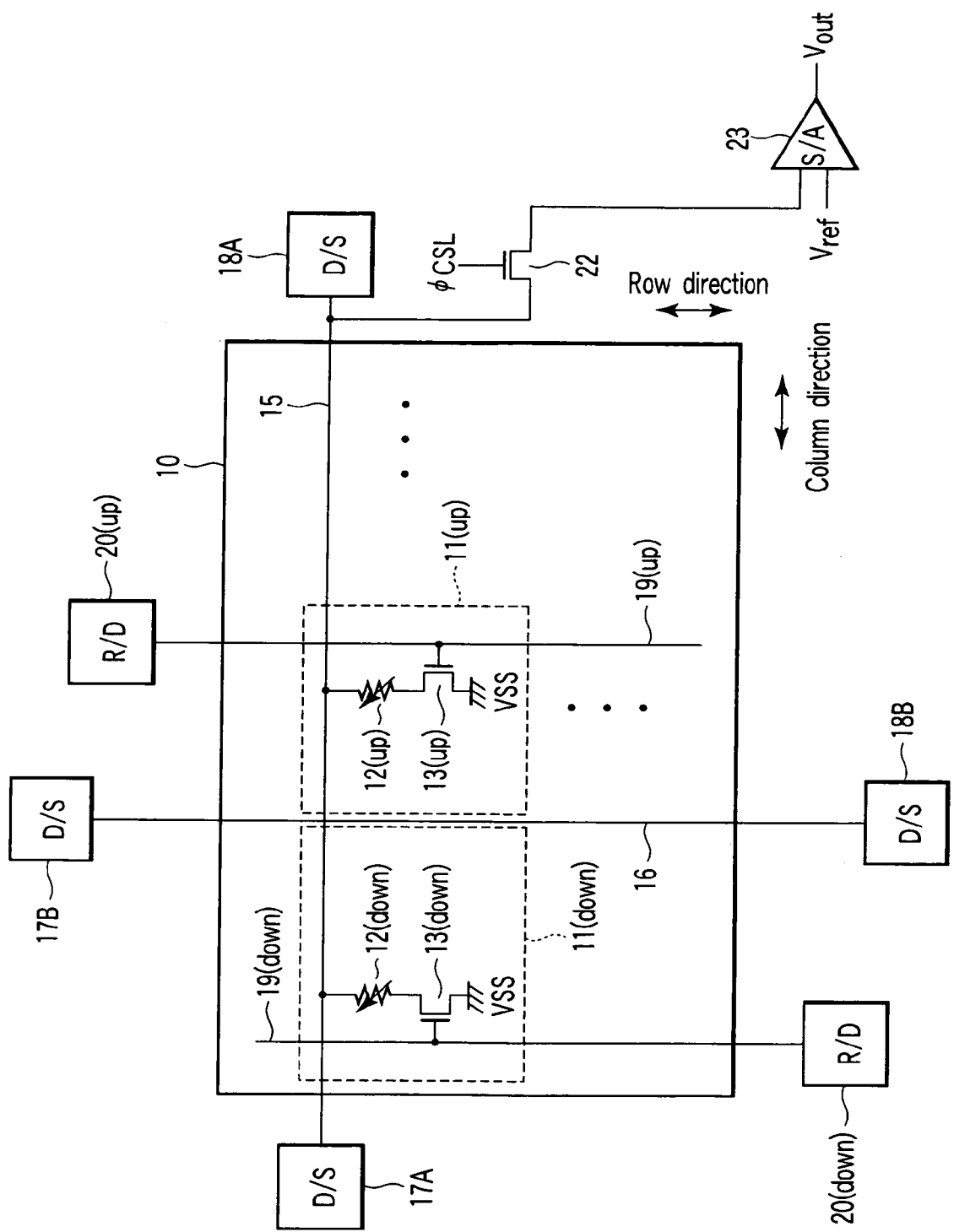
FIG. 20 is a circuit diagram showing an example of the circuit of the magnetic random access memory according to a fourth embodiment.

FIG. 20 shows a magnetic random access memory according to a fourth embodiment.

A memory cell array 10 comprises a plurality of arrayed memory cells 11(up), 11(down). Each of the memory cells 11(up) comprises a magneto-resistive element 12(up) and a selection element 13(up) which are connected in series to each other. Each of the memory cells 11(down) comprises a magneto-resistive element 12(down) and a selection element 13(down) which are connected in series to each other.

One end of each of the magneto-resistive elements 12(up), 12(down) is connected to a write bit line 15 extending, for example, in a column direction. One end of the write bit line 15 is connected to a write driver/sinker 17A, and the other end thereof is connected to a write driver/sinker 18A.

Each of the write drivers/sinkers 17A, 18A has a decoder function, and selects one column from the memory cell array 10 at a writing time. Each of the write drivers/sinkers 17A, 18A controls generation/interruption of a write current, and determines a direction of the write current flowing through the write bit line 15 in accordance with a value of write data.

The write bit line 15 also functions as a read bit line.

The other end of the write bit line 15 is connected to a sense amplifier 23 via a selection element 22.

The selection element 22 comprises, for example, an N-channel MOS transistor. Into a gate of the N-channel MOS transistor which is the selection element 22, a column selection signal φCSL is input for selecting one column from the memory cell array 10 at a reading time.

The sense amplifier 23 comprises, for example, a differential amplifier, and judges values of data read from the selected memory cells 11(up), 11(down) based on a reference voltage Vref to output an output signal Vout.

A write word line 16 extending, for example, in a row direction is disposed in the vicinity of the magneto-resistive elements 12(up), 12(down). One end of the write word line 16 is connected to a write driver/sinker 17B, and the other end thereof is connected to a write driver/sinker 18B.

Each of the write drivers/sinkers 17B, 18B has a decoder function, and selects one row from the memory cell array 10 at a writing time. Each of the write drivers/sinkers 17B, 18B controls the generation/interruption of the write current, and determines the direction of the write current flowing through the write word line 16 in accordance with the value of write data.

Magnetization direction of the magneto-resistive elements 12(up), 12(down) are determined by a composite magnetic field of a magnetic field generated by the write current flowing through the write bit line 15, and a magnetic field generated by the write current flowing through the write word line 16.

Here, the write word line 16 is shared by two adjacent memory cells 11(up), 11(down).

The other end of the magneto-resistive element 12(up) is connected to, for example, a ground terminal Vss via the selection element 13(up).

A gate of the N-channel MOS transistor which is the selection element 13(up) is connected to a read word line 19(up). The read word line 19(up) extends, for example, in the row direction, and one end thereof is connected to a row decoder 20(up) for selecting one row from the memory cell array 10 at the reading time.

The other end of the magneto-resistive element 12(down) is connected to, for example, the ground terminal Vss via the selection element 13(down).

A gate of the N-channel MOS transistor which is the selection element 13(down) is connected to a read word line 19(down). The read word line 19(down) extends, for example, in the row direction, and one end thereof is connected to a row decoder 20(down) for selecting one row from the memory cell array 10 at the reading time.

The row decoder 20(up) is disposed, for example, in one of two end portions of the memory cell array 10 in the row direction, and the row decoder 20(down) is disposed, for example, in the other end portion of the memory cell array 10 in the row direction.

b. Structure Example

Figure 21:
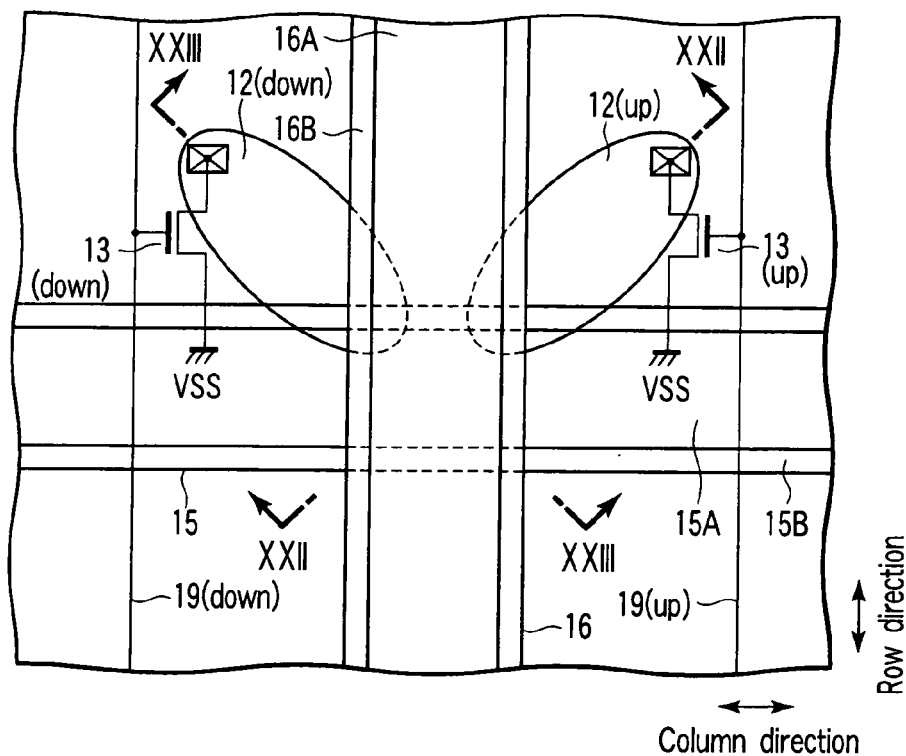
FIG. 21 is a plan view showing an example of the structure of the magnetic random access memory according to the fourth embodiment.
Figure 22:
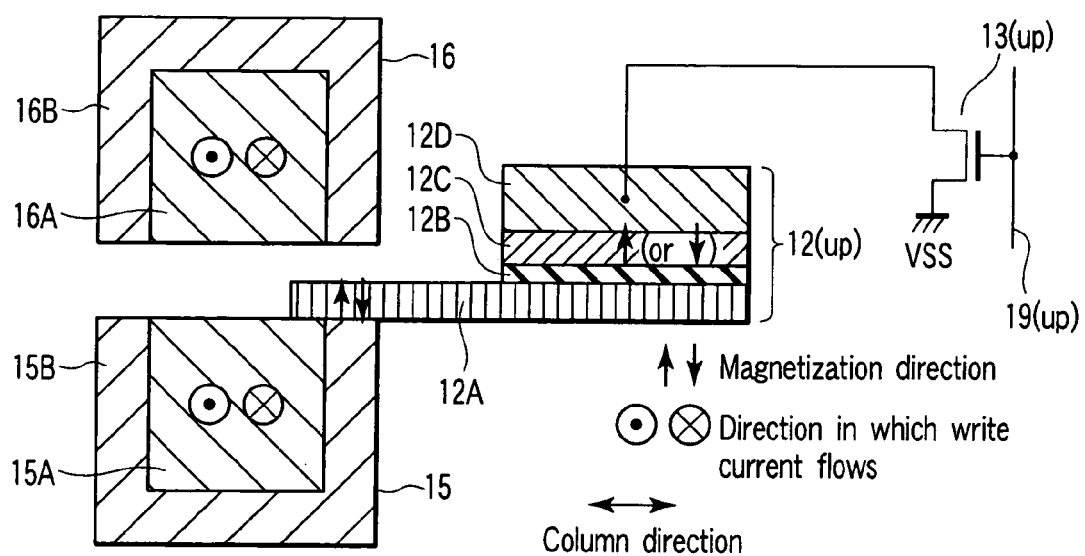
FIG. 22 is a sectional view along a line XXII-XXII of FIG. 21.
Figure 23:
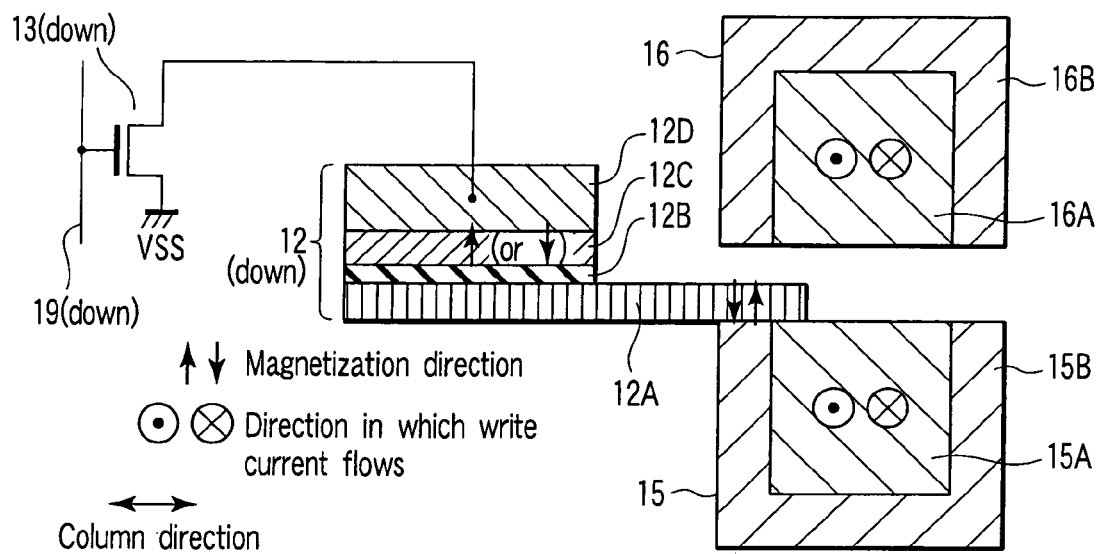
FIG. 23 is a sectional view along a line XXIII-XXIII of FIG. 21.

FIG. 21 shows a device structure of the memory cell of the fourth embodiment. FIG. 22 is a sectional view along a line XXII-XXII of FIG. 21, and FIG. 23 is a sectional view along a line XXIII-XXIII if FIG. 21.

The device structure described herein corresponds to the memory cells 11(up), 11(down) of FIG. 20.

The write bit line 15 comprises, for example, a conductive line 15A made of a metal such as Al or Cu, and a soft magnetic material (yoke material) 15B which surrounds the conductive line 15A. Similarly, the write word line 16 comprises, for example, a conductive line 16A made of a metal such as Al or Cu, and a soft magnetic material (yoke material) 16B which surrounds the conductive line 16A.

The soft magnetic material 15B covers side and lower surfaces of the conductive line 15A, and the soft magnetic material 16B covers side and upper surfaces of the conductive line 16A. Each of the soft magnetic materials 15B, 16B has a function of converging a line of magnetic force generated by the write current flowing through the write bit line 15 and the write word line 16.

Between the soft magnetic materials 15B, 16B, there are arranged a plurality of gaps constituting passages of the converged line of magnetic force. A part of a magnetic free layer 12A of each of the magneto-resistive elements 12(up), 12(down) is disposed in one of the plurality of gaps.

The magnetic free layer 12A of each of the magneto-resistive elements 12(up), 12(down) comprises a ferromagnetic film (vertical magnetization film) whose magnetization direction corresponds to a thickness direction vertical to the film surface. The magnetic free layer 12A is made of a material having strong in-plane magnetic coupling so that a whole magnetization direction is determined, when the magnetization direction of a part of the magnetic free layer is determined by the current magnetic field.

The magnetization direction (upward/downward) of the magnetic free layer 12A can be changed with the magnetic field (current magnetic field) generated by the write current flowing through the write bit line 15 and the write word line 16.

A magnetic pinned layer 12C is disposed on the magnetic free layer 12A via a tunnel barrier layer 12B made of an insulating material. The magnetic pinned layer 12C comprises a ferromagnetic film (vertical magnetization film) so that the magnetization direction corresponds to the thickness direction vertical to the film surface, and the magnetization direction is pinned by an anti-ferromagnetic layer 12D.

For example, the magnetization direction of the magnetic pinned layer 12C is pinned upwards.

The anti-ferromagnetic layer 12D of the magneto-resistive element 12(up) is connected to a ground point Vss via an N-channel MOS transistor which is the selection element 13(up). A gate of this MOS transistor is connected to the read word line 19(up).

The anti-ferromagnetic layer 12D of the magneto-resistive element 12(down) is connected to the ground point Vss via an N-channel MOS transistor which is the selection element 13(down). A gate of this MOS transistor is connected to the read word line 19(down).

Here, in the present example, two magneto-resistive elements 12(up), 12(down) are arranged in an intersection between the write bit line 15 and the write word line 16. With regard to these magneto-resistive elements 12(up), 12(down), as described later with respect to an operation, data can be written and read independently with respect to the elements, and it is therefore possible to realize enlargement of a memory capacity by high integration of the memory cells.

Moreover, in the present embodiment, the tunnel barrier layer 12B, the magnetic pinned layer 12C, and the anti-ferromagnetic layer 12D are arranged outside a plurality of gaps between the soft magnetic materials 15B, 16B.

Therefore, widths of the plurality of gaps between the soft magnetic materials 15B, 16B are reduced, and the magnetic free layer 12A is disposed in one of the plurality of gaps constituting passages of the current magnetic field. Accordingly, the current magnetic field can efficiently be applied to the magnetic free layer 12A.

It is to be noted that each of the magnetic free layer 12A and the magnetic pinned layer 12C may comprise one magnetic layer or a plurality of laminated magnetic layers.

Moreover, each of the magnetic free layer 12A and the magnetic pinned layer 12C may have a special structure such as an SAF structure.

Furthermore, since each of the magnetic free layer 12A and the magnetic pinned layer 12C comprises a vertical magnetization film, there is not any special limitation as to a plane shape of the layer.

c. Operation

An operation of the magnetic random access memory shown in FIGS. 20 to 23 will be described.

Data is written by control of the direction of the write current flowing through the write bit line 15 and the write word line 16.

Writing with Respect to the Magneto-resistive Element 12(Up)

First, the writing of the data into the magneto-resistive element 12(up) will be described.

Figure 24:
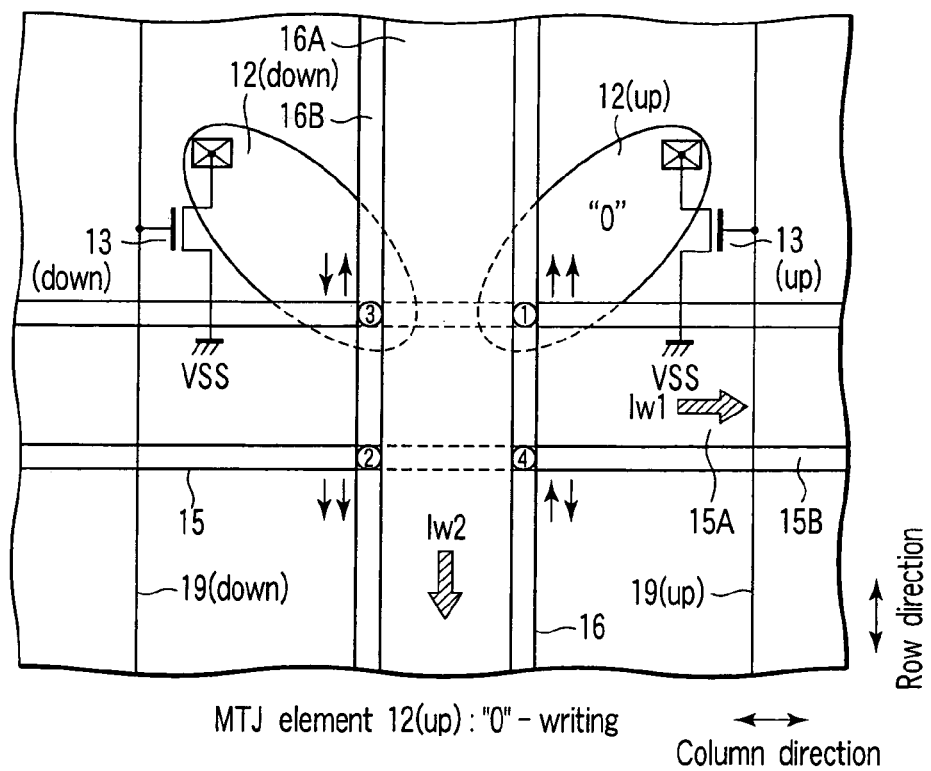
FIG. 24 is a plan view showing a writing operation according to the fourth embodiment.

In "0"-writing, as shown in FIG. 24, for example, a write current Iw1 is passed from the driver/sinker 17A toward the driver/sinker 18A, and a write current Iw2 is passed from the driver/sinker 17B toward the driver/sinker 18B.

At this time, in FIG. 22, the write current flows from a backside toward a front side of a drawing sheet through the write bit line 15 and the write word line 16, and the magnetization direction of a part of the magnetic free layer 12A of the magneto-resistive element 12(up), disposed in the gap (point 1 of FIG. 24) between the soft magnetic materials 15B, 16B, changes to an upward direction. Accordingly, the whole magnetization direction of the magnetic free layer 12A changes to the upward direction by the strong in-plane magnetic coupling.

Consequently, both of the magnetization directions of the magnetic free layer 12A and the magnetic pinned layer 12C change to the upward directions (parallel states), and the "0"-writing is completed.

Here, as shown in FIG. 24, during the "0"-writing with respect to the magneto-resistive element 12(up), both of the current magnetic fields by the write currents Iw1, Iw2 are directed upwards in the point 1. However, in a point 3, the current magnetic field by the write current Iw1 is directed upwards, and the current magnetic field by the write current Iw2 is directed downwards.

Therefore, since the upward and downward magnetic fields are offset in the point 3, the erroneous writing is not caused with respect to the magneto-resistive element 12(down).

Figure 25:
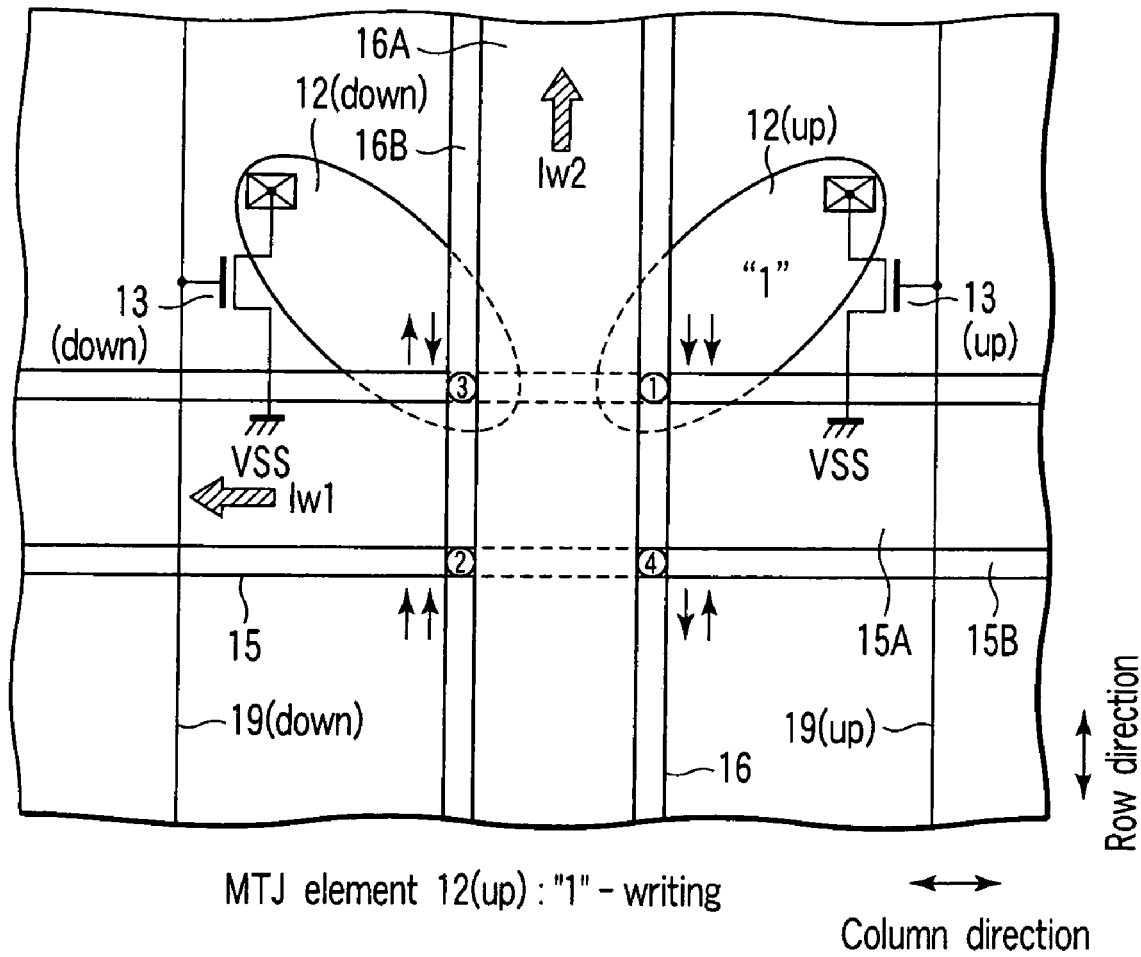
FIG. 25 is a plan view showing the writing operation according to the fourth embodiment.

In "1"-writing, as shown in FIG. 25, for example, the write current Iw1 is passed from the driver/sinker 18A toward the driver/sinker 17A, and the write current Iw2 is passed from the driver/sinker 18B toward the driver/sinker 17B.

At this time, in FIG. 22, the write current flows from the front side toward the backside of the drawing sheet through the write bit line 15 and the write word line 16. The magnetization direction of a part of the magnetic free layer 12A, disposed in the gap (point 1 of FIG. 25) between the soft magnetic materials 15B, 16B, changes to a downward direction. Accordingly, the whole magnetization direction of the magnetic free layer 12A changes to the downward direction by the strong in-plane magnetic coupling.

Consequently, the magnetization direction of the magnetic free layer 12A changes to the downward direction, the magnetization direction of the magnetic pinned layer 12C changes to the upward direction (anti-parallel state), and the "1"-writing is completed.

Here, as shown in FIG. 25, during the "1"-writing with respect to the magneto-resistive element 12(up), both of the current magnetic fields by the write currents Iw1, Iw2 are directed upwards in the point 1. However, in the point 3, the current magnetic field by the write current Iw1 is directed downwards, and the current magnetic field by the write current Iw2 is directed downwards.

Therefore, since the downward and upward magnetic fields are offset in the point 3, the erroneous writing is not caused with respect to the magneto-resistive element 12(down).

Writing with Respect to the Magneto-resistive Element 12(Down)

Next, the writing of the data into the magneto-resistive element 12(down) will be described.

In "0"-writing, as shown in FIG. 26, for example, a write current Iw1 is passed from the driver/sinker 17A toward the driver/sinker 18A, and a write current Iw2 is passed from the driver/sinker 18B toward the driver/sinker 17B.

At this time, in FIG. 23, the write current flows from a backside toward a front side of a drawing sheet through the write bit line 15 and the write word line 16, and the magnetization direction of a part of the magnetic free layer 12A of the magneto-resistive element 12(down), disposed in the gap (point 3 of FIG. 26) between the soft magnetic materials 15B, 16B, changes to an upward direction. Accordingly, the whole magnetization direction of the magnetic free layer 12A changes to the upward direction by the strong in-plane magnetic coupling.

Consequently, both of the magnetization directions of the magnetic free layer 12A and the magnetic pinned layer 12C change to the upward directions (parallel states), and the "0"-writing is completed.

Here, as shown in FIG. 26, during the "0"-writing with respect to the magneto-resistive element 12(down), both of the current magnetic fields by the write currents Iw1, Iw2 are directed upwards in the point 3. However, in a point 1, the current magnetic field by the write current Iw1 is directed upwards, and the current magnetic field by the write current Iw2 is directed downwards.

Therefore, since the upward and downward magnetic fields are offset in the point 1, the erroneous writing is not caused with respect to the magneto-resistive element 12(up).

Figure 27:
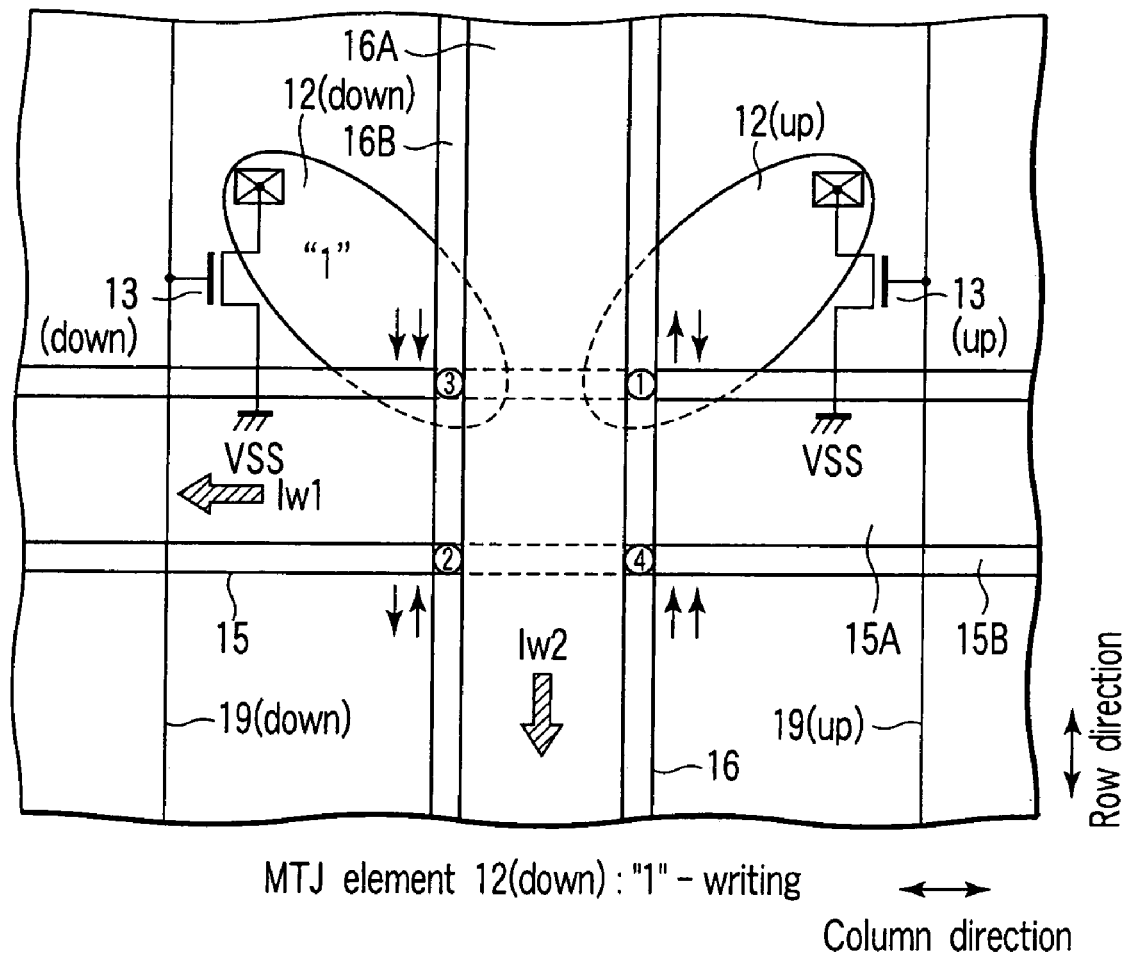
FIG. 27 is a plan view showing the writing operation according to the fourth embodiment.

In "1"-writing, as shown in FIG. 27, for example, the write current Iw1 is passed from the driver/sinker 18A toward the driver/sinker 17A, and the write current Iw2 is passed from the driver/sinker 17B toward the driver/sinker 18B.

At this time, in FIG. 23, the write current flows from the backside toward the front side of the drawing sheet through the write bit line 15 and the write word line 16. The magnetization direction of a part of the magnetic free layer 12A, disposed in the gap (point 3 of FIG. 27) between the soft magnetic materials 15B, 16B, changes to a downward direction. Accordingly, the whole magnetization direction of the magnetic free layer 12A changes to the downward direction by the strong in-plane magnetic coupling.

Consequently, the magnetization direction of the magnetic free layer 12A changes to the downward direction, the magnetization direction of the magnetic pinned layer 12C changes to the upward direction (anti-parallel state), and the "1"-writing is completed.

Here, as shown in FIG. 27, during the "1"-writing with respect to the magneto-resistive element 12(down), both of the current magnetic fields by the write currents Iw1, Iw2 are directed downwards in the point 3. However, in the point 1, the current magnetic field by the write current Iw1 is directed downwards, and the current magnetic field by the write current Iw2 is directed upwards.

Therefore, since the downward and upward magnetic fields are offset in the point 1, the erroneous writing is not caused with respect to the magneto-resistive element 12(up).

To read the data, a read current is passed through the magneto-resistive elements 12(up), 12(down), and resistance values of the magneto-resistive elements 12(up), 12(down) are detected by the sense amplifier 23.

For example, when the data of the magneto-resistive element 12(up) is read, the read word line 19(up) is set to "H" by use of the row decoder 20, and the selection element 13(up) in the memory cell 11(up) is turned on. Next, the column is selected in response to the column selection signal φCSL, and the read current is passed from the sense amplifier 23 through the write bit line (read bit line) 15 toward the memory cell 11(up).

In "0"-reading, the magneto-resistive element 12(up) is brought into the parallel state, and the resistance value is small. Therefore, for example, when the read current is passed through the magneto-resistive element 12(up), an input voltage Vin of the sense amplifier 23 is smaller than the reference voltage Vref.

Consequently, it is detected that the magneto-resistive element 12(up) in the selected memory cell 11(up) is brought into the parallel state.

In "1"-reading, the magneto-resistive element 12(up) is brought into the anti-parallel state, and the resistance value is large. Therefore, for example, when the read current is passed through the magneto-resistive element 12(up), the input voltage Vin of the sense amplifier 23 is larger than the reference voltage Vref.

Consequently, it is detected that the magneto-resistive element 12(up) in the selected memory cell 11(up) is brought into the anti-parallel state.

d. Conclusions

As described above, according to the fourth embodiment, in the two-axis type magnetic random access memory, effects similar to those of the first embodiment can be obtained. The plurality of magneto-resistive elements can be arranged in an intersection between the write bit line and the write word line to achieve the high integration.

C. Fifth Embodiment

In a fifth embodiment, there is proposed a magnetic random access memory utilizing the same writing system as that of the second embodiment, that is, a writing system in which a magnetic free layer comprises a vertical magnetization film whose magnetization direction corresponds to a thickness direction vertical to a film surface and an in-plane magnetization film (horizontal magnetization film) whose magnetization direction is horizontal to the film surface, data is written into the vertical magnetization film by use of a current magnetic field, and the data is transferred to the in-plane magnetization film.

a. Circuit Example

In the fifth embodiment, the circuit example of the third embodiment, that is, the circuit example of the magnetic random access memory of FIG. 14 is applied as such.

b. Structure Example

Figure 28:
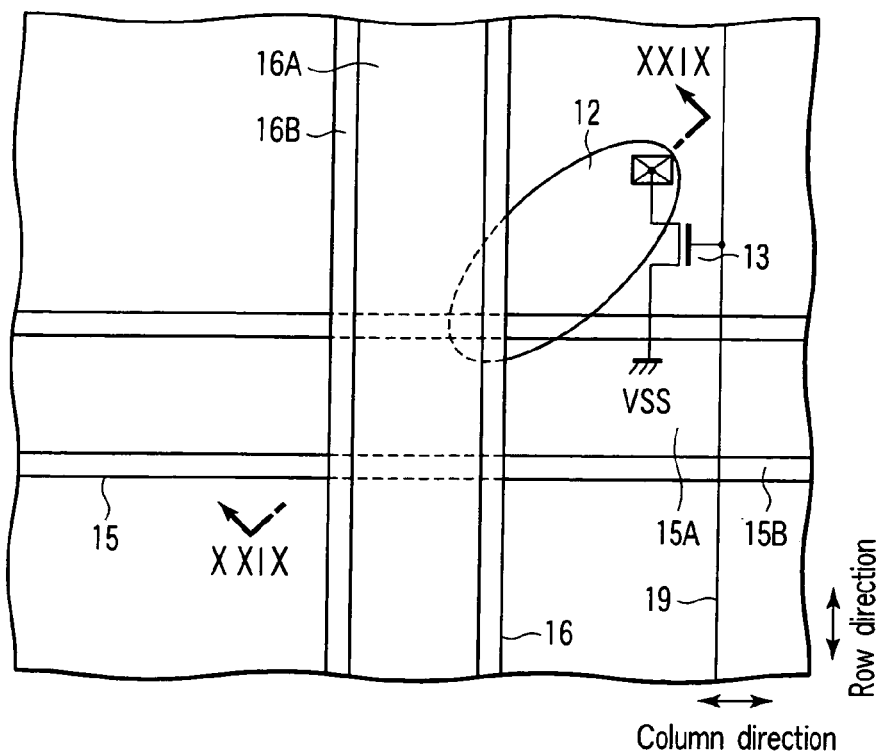
FIG. 28 is a plan view showing an example of the structure of the magnetic random access memory according to a fifth embodiment.
Figure 29:
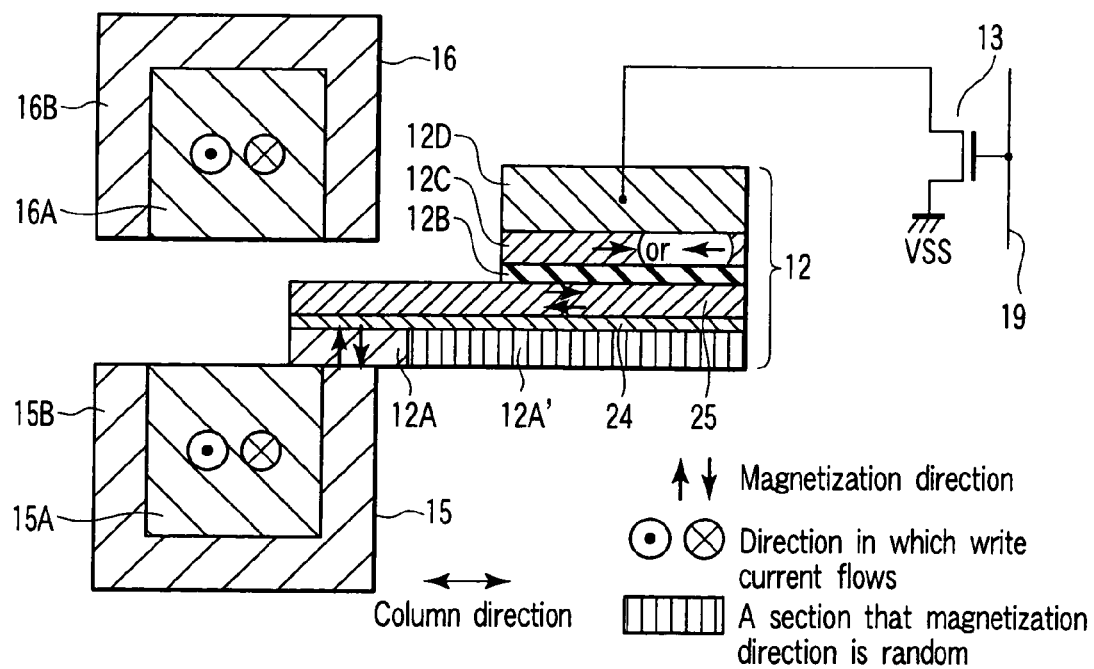
FIG. 29 is a sectional view along a line XXIX-XXIX of FIG. 28.

FIG. 28 shows a device structure of a memory cell of the fifth embodiment. FIG. 29 is a sectional view along a line XXIX-XXIX of FIG. 28.

The device structure described herein corresponds to the memory cell 11 of FIG. 14.

A write bit line 15 comprises, for example, a conductive line 15A made of a metal such as Al or Cu, and a soft magnetic material (yoke material) 15B which surrounds the conductive line 15A. Similarly, a write word line 16 comprises, for example, a conductive line 16A made of a metal such as Al or Cu, and a soft magnetic material (yoke material) 16B which surrounds the conductive line 16A.

The soft magnetic material 15B covers side and lower surfaces of the conductive line 15A, and the soft magnetic material 16B covers side and upper surfaces of the conductive line 16A. Each of the soft magnetic materials 15B, 16B has a function of converging a line of magnetic force generated by a write current flowing through the write bit line 15 and the write word line 16.

Between the soft magnetic materials 15B, 16B, there are arranged a plurality of gap constituting passages of the converged line of magnetic force. A part of magnetic free layers 12A, 12A', 24, 25 of a magneto-resistive element 12 are disposed in one of the plurality of gaps.

The magnetic free layers 12A, 12A', 24, 25 comprise: ferromagnetic films (vertical magnetization films) 12A, 12A' whose magnetization directions correspond to thickness directions vertical to a film surface; a ferromagnetic film (in-plane magnetization film) 25 whose magnetization direction is horizontal to the film surface; and a nonmagnetic film 24 disposed among them.

The vertical magnetization film 12A is positioned in one of the plurality of gaps between the soft magnetic materials 15B, 16B. A magnetization direction (upward/downward) of the vertical magnetization film 12A can be changed with a magnetic field (current magnetic field) generated by the write current flowing through the write bit line 15 and the write word line 16.

On the other hand, the vertical magnetization film 12A' is positioned outside the plurality of gaps between the soft magnetic materials 15B, 16B, and is made of a material having weak in-plane magnetic coupling so that the magnetization direction does not change with that of the vertical magnetization film 12A.

Moreover, total magnetization of the vertical magnetization film 12A' is set to zero by a demagnetizing operation or the like in order to prevent the magnetization direction of the in-plane magnetization film 25 from being influenced.

Furthermore, instead of the demagnetizing operation, for example, the vertical magnetization film 12A' may be constituted of a stacked structure of a plurality of magnetic layers different from one another in magnetization direction by 180°. In this case, effects similar to those of demagnetization can be obtained unless the magnetization is caused in a specific direction in the whole vertical magnetization film 12A'.

The magnetization direction of the in-plane magnetization film 25 depends on that of the vertical magnetization film 12A.

When the vertical magnetization film 12A has an upward magnetization direction, the magnetization direction of the in-plane magnetization film 25 changes to a rightward direction. When the vertical magnetization film 12A has a downward magnetization direction, the magnetization direction of the in-plane magnetization film 25 changes to a leftward direction.

The magnetization direction of the in-plane magnetization film 25 is determined only by the magnetization direction of the vertical magnetization film 12A after interrupting the write current.

As a result, the magnetization direction (rightward/leftward) of the in-plane magnetization film 25 can be indirectly changed by the magnetic field (current magnetic field) generated by the write current flowing through the write bit line 15 and the write word line 16.

A magnetic pinned layer 12C is disposed on the in-plane magnetization film 25 via a tunnel barrier layer 12B made of an insulating material. The magnetic pinned layer 12C comprises a ferromagnetic film (in-plane magnetization film) whose magnetization direction is horizontal to a film surface, and the magnetization direction is pinned by an anti-ferromagnetic layer 12D.

For example, the magnetization direction of the magnetic pinned layer 12C is pinned rightwards.

The anti-ferromagnetic layer 12D is connected to a ground point Vss via an N-channel MOS transistor which is a selection element 13. A gate of this MOS transistor is connected to a read word line 19.

Here, in the present example, the tunnel barrier layer 12B, the magnetic pinned layer 12C, and the anti-ferromagnetic layer 12D are disposed outside the plurality of gaps between the soft magnetic materials 15B, 16B.

Therefore, widths of the plurality of gaps between the soft magnetic materials 15B, 16B are reduced, and the magnetic free layer 12A is disposed in one of the plurality of gaps constituting the passages of the current magnetic field. Accordingly, the current magnetic field can efficiently be applied to the vertical magnetization film 12A.

It is to be noted that in the present embodiment, the tunnel barrier layer 12B, the magnetic pinned layer 12C, and the anti-ferromagnetic layer 12D may be disposed in the gap between the soft magnetic materials 15B, 16B.

Moreover, each of the vertical magnetization films 12A, 12A', the in-plane magnetization film 25, and the magnetic pinned layer 12C may comprise one magnetic layer or a plurality of laminated magnetic layers.

Moreover, each of the vertical magnetization films 12A, 12A', the in-plane magnetization film 25, and the magnetic pinned layer 12C may have a special structure such as an SAF structure.

Furthermore, there is not any special limitation as to plane shapes of the vertical magnetization films 12A, 12A'.

c. Operation

An operation of the magnetic random access memory shown in FIGS. 28 and 29 will be described.

Data is written by control of the direction of the write current flowing through the write bit line 15 and the write word line 16 in the selected memory cell 11.

First, by use of drivers/sinkers 17A, 18A of FIG. 14, the write current is passed through the write bit line 15 in a selected column. By use of drivers/sinkers 17B, 18B, the write current is passed through the write word line 16 in a selected row.

In "0"-writing, for example, the write current is passed from the driver/sinker 17A toward the driver/sinker 18A of FIG. 14, and the write current is passed from the write driver/sinker 17B toward the write driver/sinker 18B.

At this time, for example, in FIG. 29, the write current flows from a backside toward a front side of a drawing sheet through the write bit line 15 and the write word line 16. The magnetization direction of the magnetic free layer 12A, disposed in the gap between the soft magnetic materials 15B, 16B, changes to an upward direction.

Thereafter, when the write current is interrupted, the magnetization direction of the in-plane magnetization film 25 is influenced by the magnetization of the vertical magnetization film 12A, and changes to a rightward direction.

Accordingly, both of the magnetization directions of the in-plane magnetization film 25 which is a magnetic free layer, and the magnetic pinned layer 12C change to rightward directions (parallel states), and the "0"-writing is completed.

In "1"-writing, for example, the write current is passed from the driver/sinker 18A toward the driver/sinker 17A of FIG. 14, and the write current is passed from the driver/sinker 18B toward the driver/sinker 17B.

At this time, for example, in FIG. 29, the write current flows from the front side toward the backside of the drawing sheet through the write bit line 15 and the write word line 16. The magnetization direction of the vertical magnetization film 12A, disposed in the gap between the soft magnetic materials 15B, 16B, changes to a downward direction.

Thereafter, when the write current is interrupted, the magnetization direction of the in-plane magnetization film 25 is influenced by the magnetization of the vertical magnetization film 12A, and changes to a leftward direction.

Consequently, the magnetization direction of the in-plane magnetization film 25, which is the magnetic free layer, changes to the leftward direction, the magnetization direction of the magnetic pinned layer 12C changes to the rightward direction (anti-parallel state), and the "1"-writing is completed.

To read the data, a read current is passed through the magneto-resistive element 12, and a resistance value of the magneto-resistive element 12 is detected by a sense amplifier 23.

First, the word line 19 in the selected row is set to "H" by use of a row decoder 20 of FIG. 14, and the selection element 13 in the memory cell 11 is turned on. Next, the column is selected in response to a column selection signal φCSL, and the read current is passed from the sense amplifier 23 through the write bit line (read bit line) 15 toward the memory cell 11.

In "0"-reading, the magneto-resistive element 12 is brought into a parallel state, and a resistance value is small. Therefore, for example, when the read current is passed through the magneto-resistive element 12, an input voltage Vin of the sense amplifier 23 is smaller than a reference voltage Vref.

Consequently, it is detected that the magneto-resistive element 12 in the selected memory cell 11 is brought into the parallel state.

In "1"-reading, the magneto-resistive element 12 is brought into the anti-parallel state, and the resistance value is large. Therefore, for example, when the read current is passed through the magneto-resistive element 12, the input voltage Vin of the sense amplifier 23 is larger than the reference voltage Vref.

Consequently, it is detected that the magneto-resistive element 12 in the selected memory cell 11 is brought into the anti-parallel state.

d. Modifications

Next, modifications of the device structure will be described according to the fifth embodiment.

Figure 30:
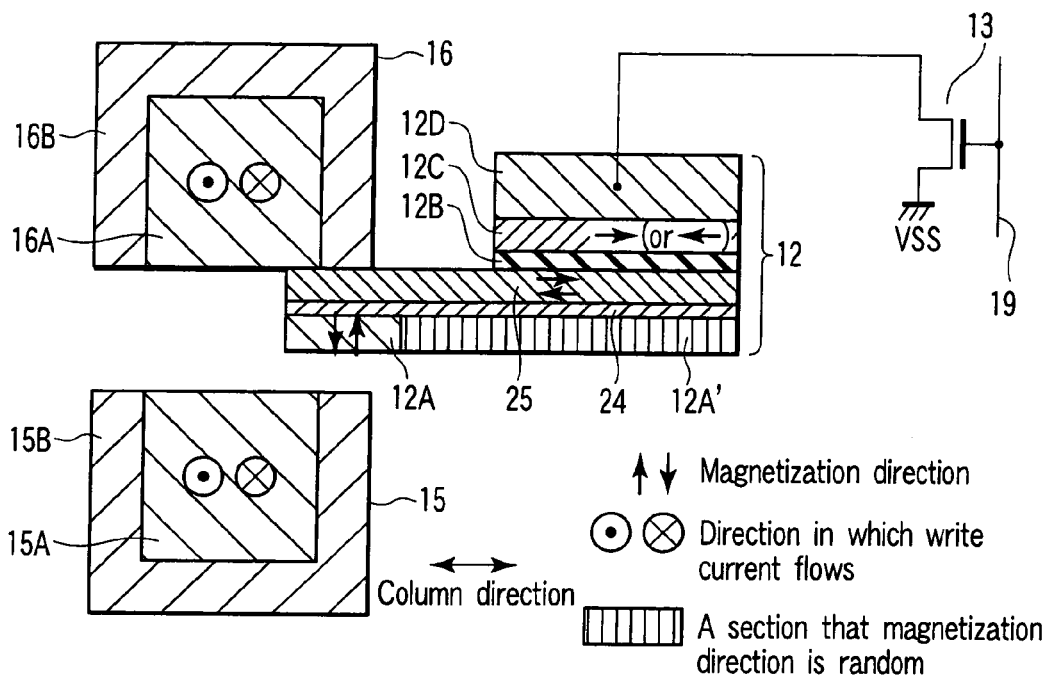
FIG. 30 is a sectional view showing a first modification of the fifth embodiment.

FIG. 30 shows a first modification.

The first modification is characterized in that magnetic free layers 12A, 12A', 24, 25 of a magneto-resistive element 12 are connected to a write word line 16.

That is, in the structure of FIG. 29, the magnetic free layers 12A, 12A', 24, 25 are connected to a write bit line 15. That is, in this case, the write bit line 15 also functions as the read bit line, and the write bit line 15 is connected to the sense amplifier.

On the other hand, in the structure of FIG. 30, the magnetic free layers 12A, 12A', 24, 25 are connected to the write word line 16. That is, in this case, since the write word line 16 also functions as a read word line, the write word line 16 is connected to a sense amplifier.

Another structure is the same as that of the fifth embodiment.

Figure 31:
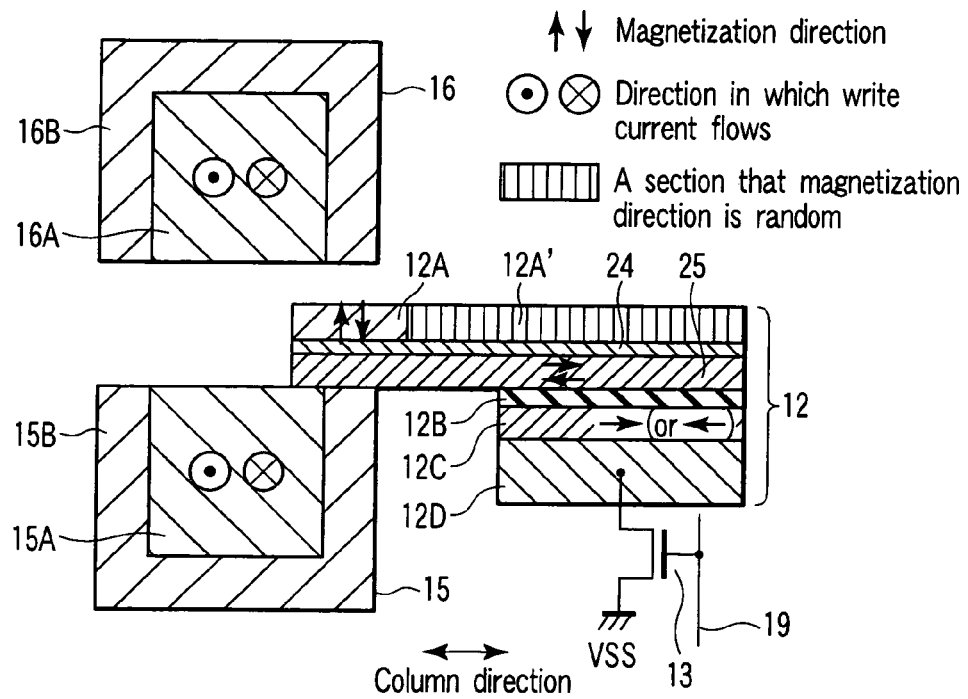
FIG. 31 is a sectional view showing a second modification of the fifth embodiment.

FIG. 31 shows a second modification.

Characteristics of the second modification lie in that a magneto-resistive element 12 has a bottom pin structure.

That is, in the structure of FIG. 29, the magneto-resistive element 12 has a top pin structure, and the magnetic free layers 12A, 12A', 24, 25, the tunnel barrier layer 12B, the magnetic pinned layer 12C, and the anti-ferromagnetic layer 12D are formed in order from a semiconductor substrate side.

On the other hand, in a structure of FIG. 31, in the magneto-resistive element 12, an anti-ferromagnetic layer 12D, a magnetic pinned layer 12C, a tunnel barrier layer 12B, and magnetic free layers 12A, 12A', 24, 25 are formed in order from a semiconductor substrate side.

Another structure is the same as that of the fifth embodiment.

Figure 32:
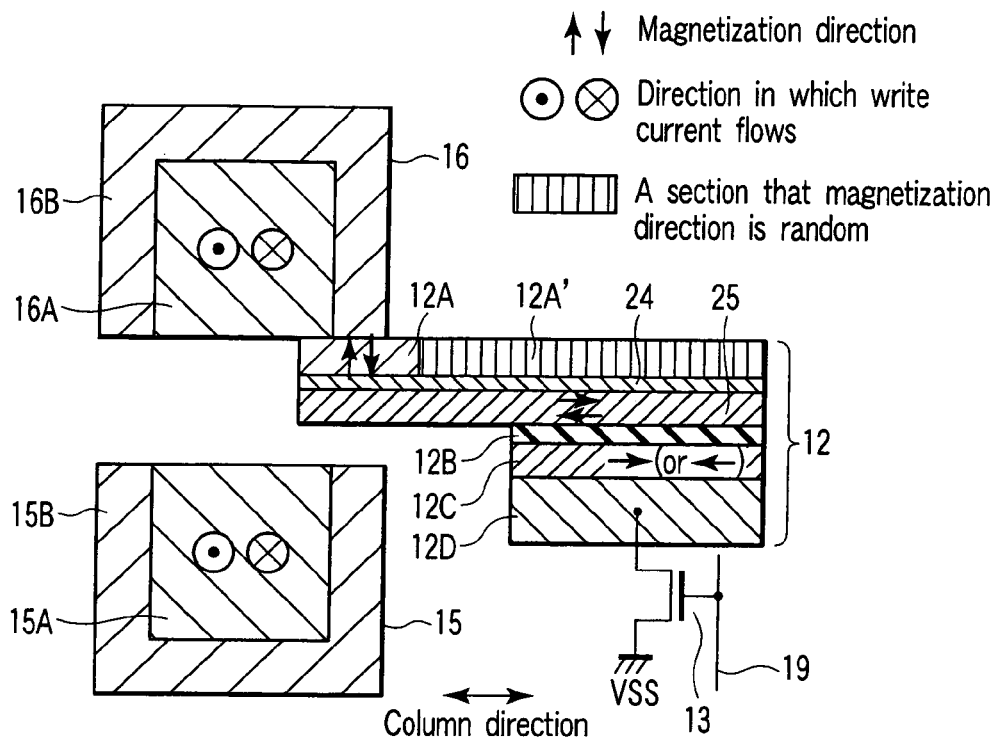
FIG. 32 is a sectional view showing a third modification of the fifth embodiment.

FIG. 32 shows a third modification.

Characteristics of the third modification include both of the characteristics of the first and second modifications.

That is, a magneto-resistive element 12 has a bottom pin structure, and an anti-ferromagnetic layer 12D, a magnetic pinned layer 12C, a tunnel barrier layer 12B, and magnetic free layers 12A, 12A', 24, 25 are formed in order from a semiconductor substrate side.

Moreover, the magnetic free layer 12A is connected to a write word line 16.

Another structure is the same as that of the fifth embodiment.

Figure 33:
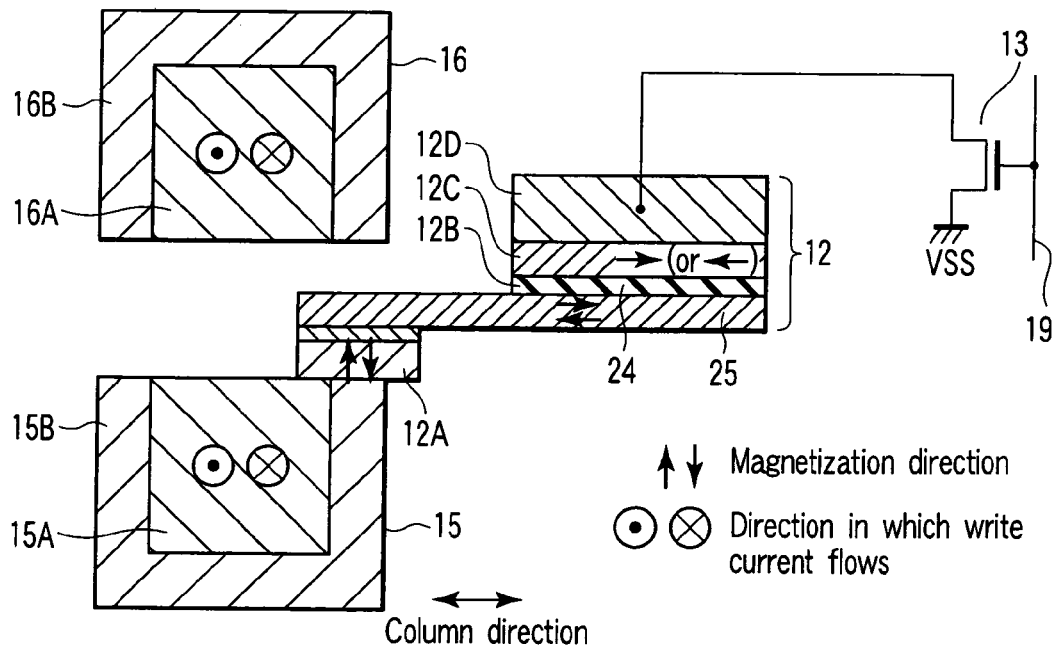
FIG. 33 is a sectional view showing a fourth modification of the fifth embodiment.

FIG. 33 shows a fourth modification.

The fourth modification has a structure in which the vertical magnetization film 12A' of FIG. 29 does not exist.

That is, in the structure of FIG. 29, a demagnetizing operation is performed, or the vertical magnetization film 12A' whose whole magnetization is zero exists right under the in-plane magnetization film 25. This structure is constituted in consideration of reduction of the number of steps of a wafer process, that is, simultaneous working of magnetic free layers 12A, 12A', 24, 25 by the same mask.

However, the scope of the fifth embodiment lies in that the magnetization of the in-plane magnetization film 25 is determined by that of the vertical magnetization film 12A which exists in an end portion of the in-plane magnetization film. Ideally, there is not provided the vertical magnetization film 12A' which has a possibility of influencing the magnetization direction of the in-plane magnetization film 25.

To solve the problem, in the fourth modification, as shown in FIG. 33, an only vertical magnetization film 12A in a gap between soft magnetic materials 15B, 16B is disposed right under an in-plane magnetization film 25.

Another structure is the same as that of the fifth embodiment.

FIG. 34 shows a fifth modification.

The fifth modification includes the characteristics of the fourth modification.

That is, the vertical magnetization film 12A' of FIG. 29 does not exist. A vertical magnetization film 12A and a nonmagnetic film 24 are disposed on an in-plane magnetization film 25, and the vertical magnetization film 12A is connected to a write word line 16. In this case, there is an advantage that a structure of a magneto-resistive element 12 is simple.

Another structure is the same as that of the fifth embodiment.

Effects similar to those of the fifth embodiment can be obtained even in the first to fifth modifications.

e. Conclusions

As described above, according to the fifth embodiment, in the two-axis type magnetic random access memory, it is possible to simultaneously realize effects similar to those of the second embodiment, that is, current reduction, reduction of a cell size, and enhancement of resistances to erroneous writing/thermal disturbance.

D. Sixth Embodiment

A sixth embodiment is an improvement of the fifth embodiment, and relates to the same writing system as that of the fifth embodiment. In the sixth embodiment, a plurality of magneto-resistive elements are arranged in an intersection between two write lines (two axis) to achieve enlargement of a memory capacity by high integration of memory cells.

a. Circuit Example

In the sixth embodiment, the circuit example of the fourth embodiment, that is, the circuit example of the magnetic random access memory of FIG. 20 is applied as such.

b. Structure Example

Figure 36:
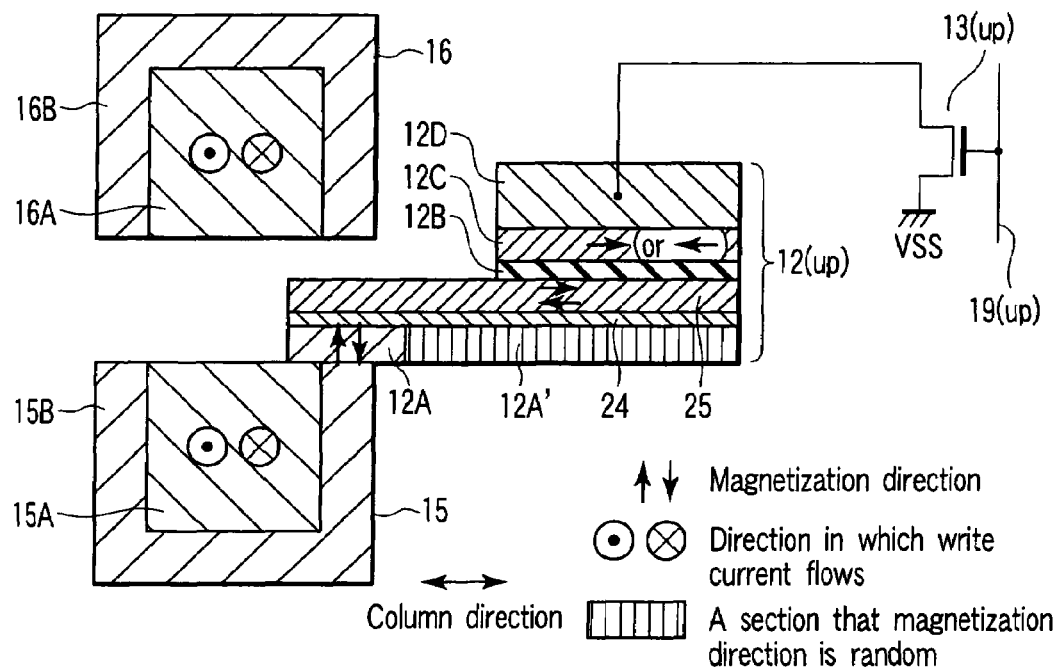
FIG. 36 is a sectional view along a line XXXVI-XXXVI of FIG. 35.
Figure 37:
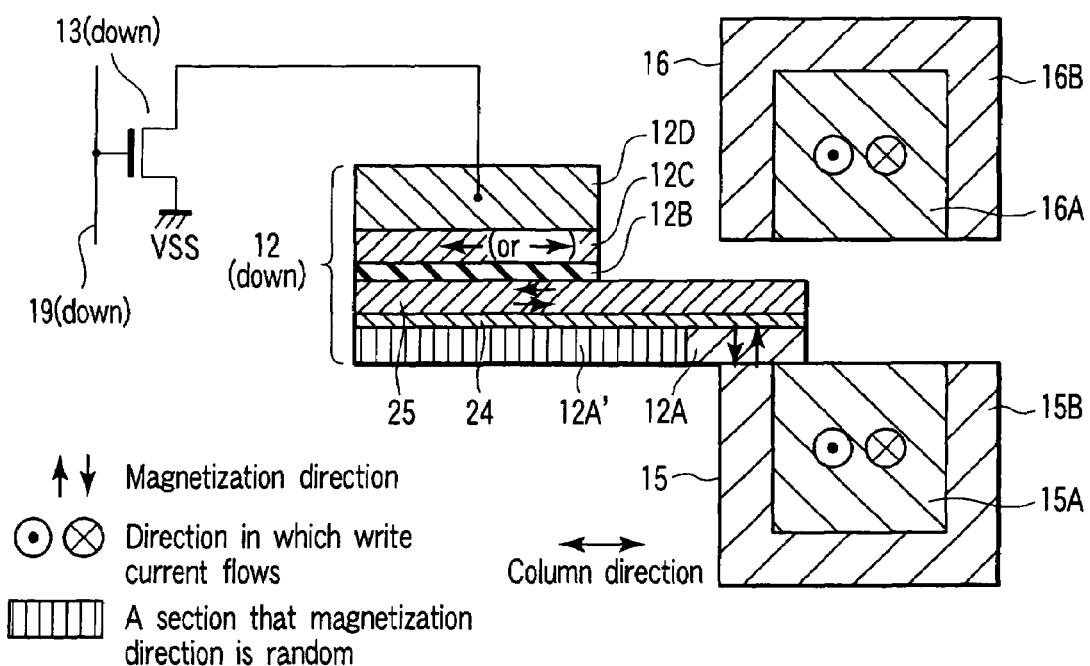
FIG. 37 is a sectional view along a line XXXVII-XXXVII of FIG. 35.

FIG. 35 shows a device structure of a memory cell according to the sixth embodiment. FIG. 36 is a sectional view along a line XXXVI-XXXVI of FIG. 35, and FIG. 37 is a sectional view along a line XXXVII-XXXVII of FIG. 35.

The device structure mentioned herein corresponds to the memory cells 11(up), 11(down) of FIG. 20.

A write bit line 15 comprises, for example, a conductive line 15A made of a metal such as Al or Cu, and a soft magnetic material (yoke material) 15B which surrounds the conductive line 15A. Similarly, a write word line 16 comprises, for example, a conductive line 16A made of a metal such as Al or Cu, and a soft magnetic material (yoke material) 16B which surrounds the conductive line 16A.

The soft magnetic material 15B covers side and lower surfaces of the conductive line 15A, and the soft magnetic material 16B covers side and upper surfaces of the conductive line 16A. Each of the soft magnetic materials 15B, 16B has a function of converging a line of magnetic force generated by the write current flowing through the write bit line 15 and the write word line 16.

Between the soft magnetic materials 15B, 16B, there are arranged a plurality of gaps constituting passages of the converged line of magnetic force. A part of magnetic free layers 12A, 12A', 24, 25 of each of magneto-resistive elements 12(up), 12(down) are disposed in one of the plurality of gaps.

The magnetic free layers 12A, 12A', 24, 25 comprise: ferromagnetic films (vertical magnetization films) 12A, 12A' whose magnetization directions correspond to thickness directions vertical to a film surface; a ferromagnetic film (in-plane magnetization film) 25 whose magnetization direction is horizontal to the film surface; and a nonmagnetic film 24 disposed among them.

The vertical magnetization film 12A is positioned in a plurality of gaps between the soft magnetic materials 15B, 16B. The magnetization direction (upward/downward) of the vertical magnetization film 12A of each of the magneto-resistive elements 12(up), 12(down) can be changed with a magnetic field (current magnetic field) generated by the write current flowing through the write bit line 15 and the write word line 16.

On the other hand, the vertical magnetization film 12A' is positioned outside the plurality of gaps between the soft magnetic materials 15B, 16B, and is made of a material having weak in-plane magnetic coupling so that the magnetization direction does not change with that of the vertical magnetization film 12A.

Moreover, total magnetization of the vertical magnetization film 12A' is set to zero by a demagnetizing operation or the like in order to prevent the magnetization direction of the in-plane magnetization film 25 from being influenced.

Furthermore, instead of the demagnetizing operation, for example, the vertical magnetization film 12A' may be constituted of a stacked structure of a plurality of magnetic layers different from one another in magnetization direction by 180°. In this case, effects similar to those of demagnetization can be obtained unless the magnetization is caused in a specific direction in the whole vertical magnetization film 12A'.

The magnetization direction of the in-plane magnetization film 25 depends on that of the vertical magnetization film.

As to the magneto-resistive element 12(up), when the magnetic free layer 12A has an upward magnetization direction, the magnetization direction of the in-plane magnetization film 25 changes to a rightward direction. When the magnetic free layer 12A has a downward magnetization direction, the magnetization direction of the in-plane magnetization film 25 changes to a leftward direction.

As to the magneto-resistive element 12(down), when the magnetic free layer 12A has an upward magnetization direction, the magnetization direction of the in-plane magnetization film 25 changes to a leftward direction. When the magnetic free layer 12A has a downward magnetization direction, the magnetization direction of the in-plane magnetization film 25 changes to a rightward direction.

The magnetization direction of the in-plane magnetization film 25 is determined by that of the magnetic free layer 12A only, after the write current is interrupted.

As a result, the magnetization direction (rightward/leftward) of the in-plane magnetization film 25 of each of the magneto-resistive elements 12(up), 12(down) can be indirectly changed by the magnetic field (current magnetic field) generated by the write current flowing through the write bit line 15 and the write word line 16.

A magnetic pinned layer 12C is disposed on the in-plane magnetization film 25 via a tunnel barrier layer 12B made of an insulating material. The magnetic pinned layer 12C comprises a ferromagnetic film (in-plane magnetization film) whose magnetization direction is horizontal to a film surface, and the magnetization direction is pinned by an anti-ferromagnetic layer 12D.

For example, as to the magneto-resistive element 12(up), the magnetization direction of the magnetic pinned layer 12C is pinned rightwards. As to the anti-ferromagnetic layer 12D, the magnetization direction of the magnetic pinned layer 12C is pinned leftwards.

The anti-ferromagnetic layer 12D of the magneto-resistive element 12(up) is connected to a ground point Vss via an N-channel MOS transistor which is a selection element 13(up). A gate of this MOS transistor is connected to a read word line 19(up).

The anti-ferromagnetic layer 12D of the magneto-resistive element 12(down) is connected to a ground point Vss via an N-channel MOS transistor which is a selection element 13(down). A gate of this MOS transistor is connected to a read word line 19(down).

Here, in the present example, two magneto-resistive elements 12(up), 12(down) are arranged in an intersection between the write bit line 15 and the write word line 16. With regard to these magneto-resistive elements 12(up), 12(down), as described later with respect to an operation, data can be written and read independently with respect to the elements, and it is therefore possible to realize enlargement of a memory capacity by high integration of the memory cells.

Moreover, in the present embodiment, the tunnel barrier layer 12B, the magnetic pinned layer 12C, and the anti-ferromagnetic layer 12D are arranged outside a plurality of gaps between the soft magnetic materials 15B, 16B.

Therefore, widths of the plurality of gaps between the soft magnetic materials 15B, 16B are reduced, and the magnetic free layer 12A is disposed in one of the plurality of gaps constituting passages of the current magnetic field. Accordingly, the current magnetic field can efficiently be applied to the magnetic free layer 12A.

It is to be noted that in the present embodiment, the tunnel barrier layer 12B, the magnetic pinned layer 12C, and the anti-ferromagnetic layer 12D may be arranged in a plurality of gaps between the soft magnetic materials 15B, 16B.

Moreover, each of the vertical magnetization films 12A, 12A', the in-plane magnetization film 25, and the magnetic pinned layer 12C may comprise one magnetic layer or a plurality of laminated magnetic layers.

Furthermore, each of the vertical magnetization films 12A, 12A', the in-plane magnetization film 25, and the magnetic pinned layer 12C may have a special structure such as an SAF structure.

Additionally, there is not any special limitation as to a plane shape of the layer.

c. Operation

An operation of the magnetic random access memory shown in FIGS. 35 to 37 will be described.

Data is written by control of the direction of the write current flowing through the write bit line 15 and the write word line 16.

Writing with Respect to the Magneto-resistive Element 12(Up)

First, the writing of the data into the magneto-resistive element 12(up) will be described.

In "0"-writing, for example, in FIG. 20, the write current is passed from the driver/sinker 17A toward the driver/sinker 18A, and the write current is passed from the driver/sinker 17B toward the driver/sinker 18B.

At this time, in FIG. 36, the write current flows from a backside toward a front side of a drawing sheet through the write bit line 15 and the write word line 16, and the magnetization direction of the vertical magnetization film 12A of the magneto-resistive element 12(up), disposed in the gap between the soft magnetic materials 15B, 16B, changes to an upward direction.

Thereafter, when the write current is interrupted, the magnetization direction of the in-plane magnetization film 25 is influenced by magnetization of the vertical magnetization film 12A, and changes to a rightward direction.

Consequently, both of the magnetization directions of the in-plane magnetization film 25 which is the magnetic free layer, and the magnetic pinned layer 12C change to the rightward directions (parallel states), and the "0"-writing is completed.

It is to be noted that for reasons similar to those described in the fourth embodiment, during the "0"-writing with respect to the magneto-resistive element 12(up), erroneous writing is not caused with respect to the magneto-resistive element 12(down).

In "1"-writing, for example, in FIG. 20, the write current is passed from the driver/sinker 18A toward the driver/sinker 17A, and the write current is passed from the driver/sinker 18B toward the driver/sinker 17B.

At this time, in FIG. 36, the write current flows from the front side toward the backside of the drawing sheet through the write bit line 15 and the write word line 16. The magnetization direction of the magnetic free layer 12A of the magneto-resistive element 12(up), disposed in the gap between the soft magnetic materials 15B, 16B, changes to a downward direction.

Thereafter, when the write current is interrupted, the magnetization direction of the in-plane magnetization film 25 is influenced by the magnetization of the vertical magnetization film 12A, and changes to a leftward direction.

Consequently, the magnetization direction of the in-plane magnetization film 25 which is the magnetic free layer changes to the leftward direction, the magnetization direction of the magnetic pinned layer 12C changes to the rightward direction (anti-parallel state), and the "1"-writing is completed.

It is to be noted that for reasons similar to those described in the fourth embodiment, during the "1"-writing with respect to the magneto-resistive element 12(up), the erroneous writing is not caused with respect to the magneto-resistive element 12(down).

Writing with Respect to the Magneto-resistive Element 12(Down)

Next, the writing of the data into the magneto-resistive element 12(down) will be described.

In "0"-writing, for example, in FIG. 20, the write current is passed from the driver/sinker 17A toward the driver/sinker 18A, and the write current is passed from the driver/sinker 18B toward the driver/sinker 17B.

At this time, in FIG. 37, the write current flows from a front side toward a backside of a drawing sheet through the write bit line 15 and the write word line 16, and the magnetization direction of the vertical magnetization film 12A of the magneto-resistive element 12(down), disposed in the gap between the soft magnetic materials 15B, 16B, changes to an upward direction.

Thereafter, when the write current is interrupted, the magnetization direction of the in-plane magnetization film 25 is influenced by the magnetization of the vertical magnetization film 12A, and changes to a leftward direction.

Consequently, both of the magnetization directions of the in-plane magnetization film 25 which is the magnetic free layer, and the magnetic pinned layer 12C change to leftward directions (parallel states), and the "0"-writing is completed.

It is to be noted that for reasons similar to those described in the fourth embodiment, during the "0"-writing with respect to the magneto-resistive element 12(down), the erroneous writing is not caused with respect to the magneto-resistive element 12(up).

In "1"-writing, for example, in FIG. 20, the write current is passed from the driver/sinker 18A toward the driver/sinker 17A, and the write current is passed from the driver/sinker 17B toward the driver/sinker 18B.

At this time, in FIG. 37, the write current flows from the backside toward the front side of the drawing sheet through the write bit line 15 and the write word line 16. The magnetization direction of the vertical magnetization film 12A of the anti-ferromagnetic layer 12D, disposed in the gap between the soft magnetic materials 15B, 16B, changes to a downward direction.

Thereafter, when the write current is interrupted, the magnetization direction of the in-plane magnetization film 25 is influenced by the magnetization of the vertical magnetization film 12A, and changes to a rightward direction.

Consequently, the magnetization direction of the in-plane magnetization film 25 which is the magnetic free layer changes to the rightward direction, the magnetization direction of the magnetic pinned layer 12C changes to the leftward direction (anti-parallel state), and the "1"-writing is completed.

It is to be noted that for reasons similar to those described in the fourth embodiment, during the "1"-writing with respect to the magneto-resistive element 12(down), the erroneous writing is not caused with respect to the magneto-resistive element 12(up).

To read the data, a read current is passed through the magneto-resistive elements 12(up), 12(down), and resistance values of the magneto-resistive elements 12(up), 12(down) are detected by the sense amplifier 23.

For example, when the data of the magneto-resistive element 12(up) is read, the read word line 19(up) is set to "H" by use of the row decoder 20, and the selection element 13(up) in the memory cell 11(up) is turned on. Next, the column is selected in response to the column selection signal φCSL, and the read current is passed from the sense amplifier 23 through the write bit line (read bit line) 15 toward the memory cell 11(up).

In "0"-reading, the magneto-resistive element 12(up) is brought into the parallel state, and the resistance value is small. Therefore, for example, when the read current is passed through the magneto-resistive element 12(up), an input voltage Vin of the sense amplifier 23 is smaller than the reference voltage Vref.

Consequently, it is detected that the magneto-resistive element 12(up) in the memory cell 11(up) is brought into the parallel state.

In "1"-reading, the magneto-resistive element 12(up) is brought into the anti-parallel state, and the resistance value is large. Therefore, for example, when the read current is passed through the magneto-resistive element 12(up), the input voltage Vin of the sense amplifier 23 is larger than the reference voltage Vref.

Consequently, it is detected that the magneto-resistive element 12(up) in the memory cell 11(up) is brought into the anti-parallel state.

d. Conclusions

As described above, according to the sixth embodiment, in the two-axis type magnetic random access memory, effects similar to those of the second embodiment can be obtained. The plurality of magneto-resistive elements can be arranged in an intersection between the write bit line and the write word line to achieve the high integration.

E. Seventh Embodiment

In a seventh embodiment, the same writing system as that of the second embodiment is employed.

That is, there is proposed a structure in which a magnetic free layer comprises a vertical magnetization film whose magnetization direction corresponds to a thickness direction vertical to a film surface and an in-plane magnetization film (horizontal magnetization film) whose magnetization direction is horizontal to the film surface, data is written into the vertical magnetization film by use of a current magnetic field, and the data is transferred to the in-plane magnetization film. Moreover, in the seventh embodiment, one magneto-resistive element is disposed in an intersection between two write lines, and two-bits (four values) data is stored in the magneto-resistive element.

a. Circuit Example

In the seventh embodiment, the circuit example of the third embodiment, that is, the circuit example of the magnetic random access memory of FIG. 14 is applied as such.

b. Structure Example

Figure 38:
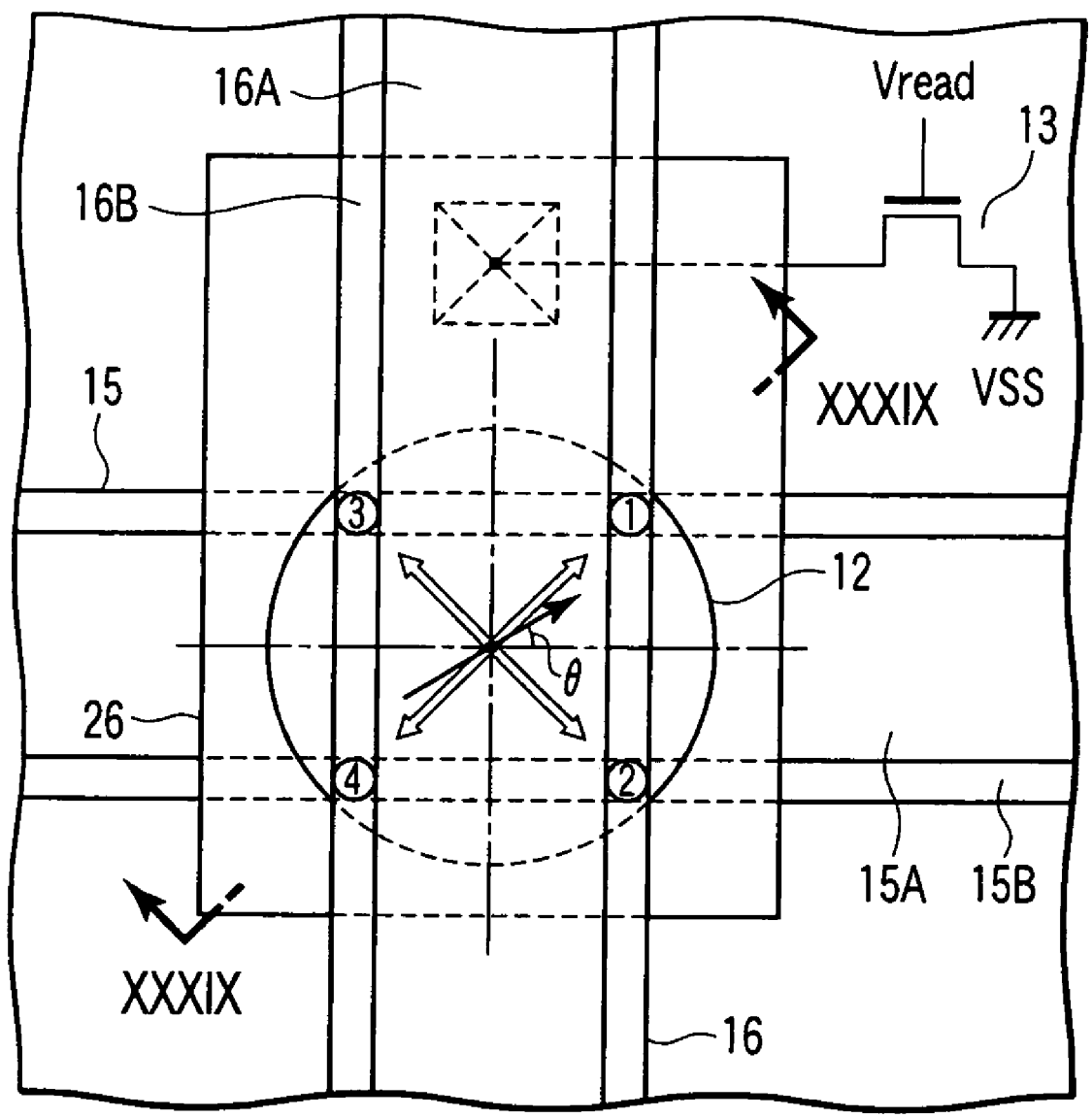
FIG. 38 is a plan view showing an example of the structure of the magnetic random access memory according to a seventh embodiment.
Figure 39:
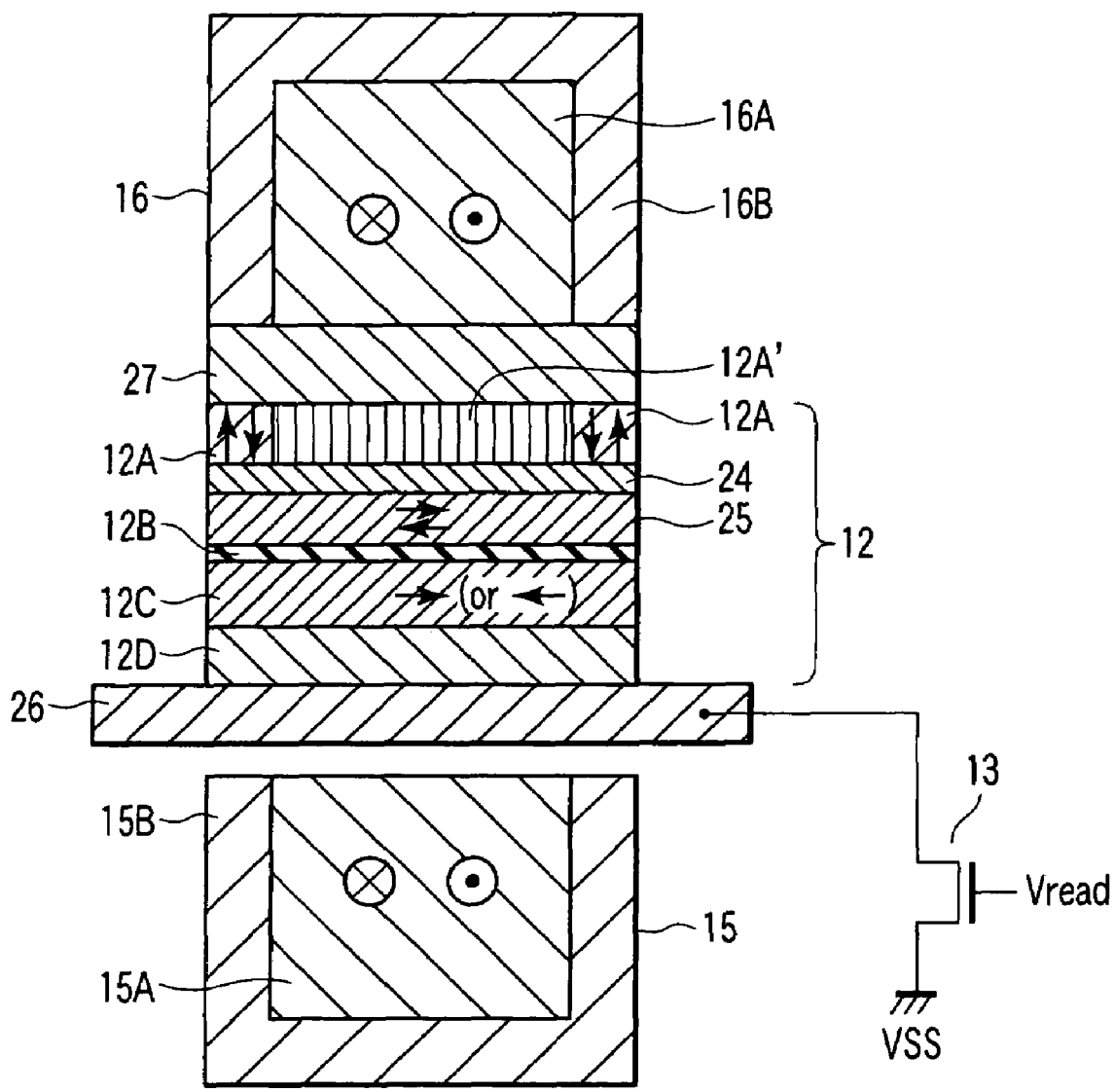
FIG. 39 is a sectional view along a line XXXIX-XXXIX of FIG. 38;.

FIG. 38 shows a device structure of a memory cell of the seventh embodiment. FIG. 39 is a sectional view along a line XXXIX-XXXIX of FIG. 38.

The device structure described herein corresponds to the memory cell 11 of FIG. 14.

A write bit line 15 comprises, for example, a conductive line 15A made of a metal such as Al or Cu, and a soft magnetic material (yoke material) 15B which surrounds the conductive line 15A. Similarly, a write word line 16 comprises, for example, a conductive line 16A made of a metal such as Al or Cu, and a soft magnetic material (yoke material) 16B which surrounds the conductive line 16A.

The soft magnetic material 15B covers side and lower surfaces of the conductive line 15A, and the soft magnetic material 16B covers side and upper surfaces of the conductive line 16A. Each of the soft magnetic materials 15B, 16B has a function of converging a line of magnetic force generated by a write current flowing through the write bit line 15 and the write word line 16.

A magneto-resistive element 12 is disposed in an intersection between the write bit line 15 and the write word line 16. Specifically, the magneto-resistive element 12 is disposed in at least a position to fill in all of gaps between the soft magnetic materials 15B, 16B. Four (points 1, 2, 3, 4) gaps exist between the soft magnetic materials 15B, 16B.

The magneto-resistive element 12 is disposed in a shape having point symmetry with respect to a central point of the intersection between the write bit line 15 and the write word line 16, for example, a circular shape or a cross shape. When the element has the cross shape, the element is positioned in such a manner that cross tips are positioned in the gaps (points 1, 2, 3, 4) between the soft magnetic materials 15B, 16B.

The magneto-resistive element 12 comprises magnetic free layers 12A, 12A', 24, 25, a tunnel barrier layer 12B, a magnetic pinned layer 12C, and an anti-ferromagnetic layer 12D.

In the present embodiment, the magneto-resistive element 12 has a bottom pin structure, but may have a top pin structure.

The magnetic free layers 12A, 12A', 24, 25 comprise: ferromagnetic films (vertical magnetization films) 12A, 12A' whose magnetization directions correspond to thickness directions vertical to a film surface; a ferromagnetic film (in-plane magnetization film) 25 whose magnetization direction is horizontal to the film surface; and a nonmagnetic film 24 disposed among them.

The vertical magnetization film 12A is positioned in four gaps (points 1, 2, 3, 4) between the soft magnetic materials 15B, 16B. A magnetization direction (upward/downward) of the vertical magnetization film 12A can be changed with a magnetic field (current magnetic field) generated by the write current flowing through the write bit line 15 and the write word line 16.

The vertical magnetization film 12A' is positioned in the outside (including a region in the intersection of the write bit line 15 and the write word line 16) of the gaps between the soft magnetic materials 15B, 16B, and is made of a material having weak in-plane magnetic coupling so that the magnetization direction does not change with that of the vertical magnetization film 12A.

Moreover, total magnetization of the vertical magnetization film 12A' is set to zero by a demagnetizing operation or the like in order to prevent the magnetization direction of the in-plane magnetization film 25 from being influenced.

Furthermore, instead of the demagnetizing operation, for example, the vertical magnetization film 12A' may be constituted of a stacked structure of a plurality of magnetic layers different from one another in magnetization direction by 180°. In this case, effects similar to those of demagnetization can be obtained unless the magnetization is caused in a specific direction in the whole vertical magnetization film 12A'.

Figure 40:
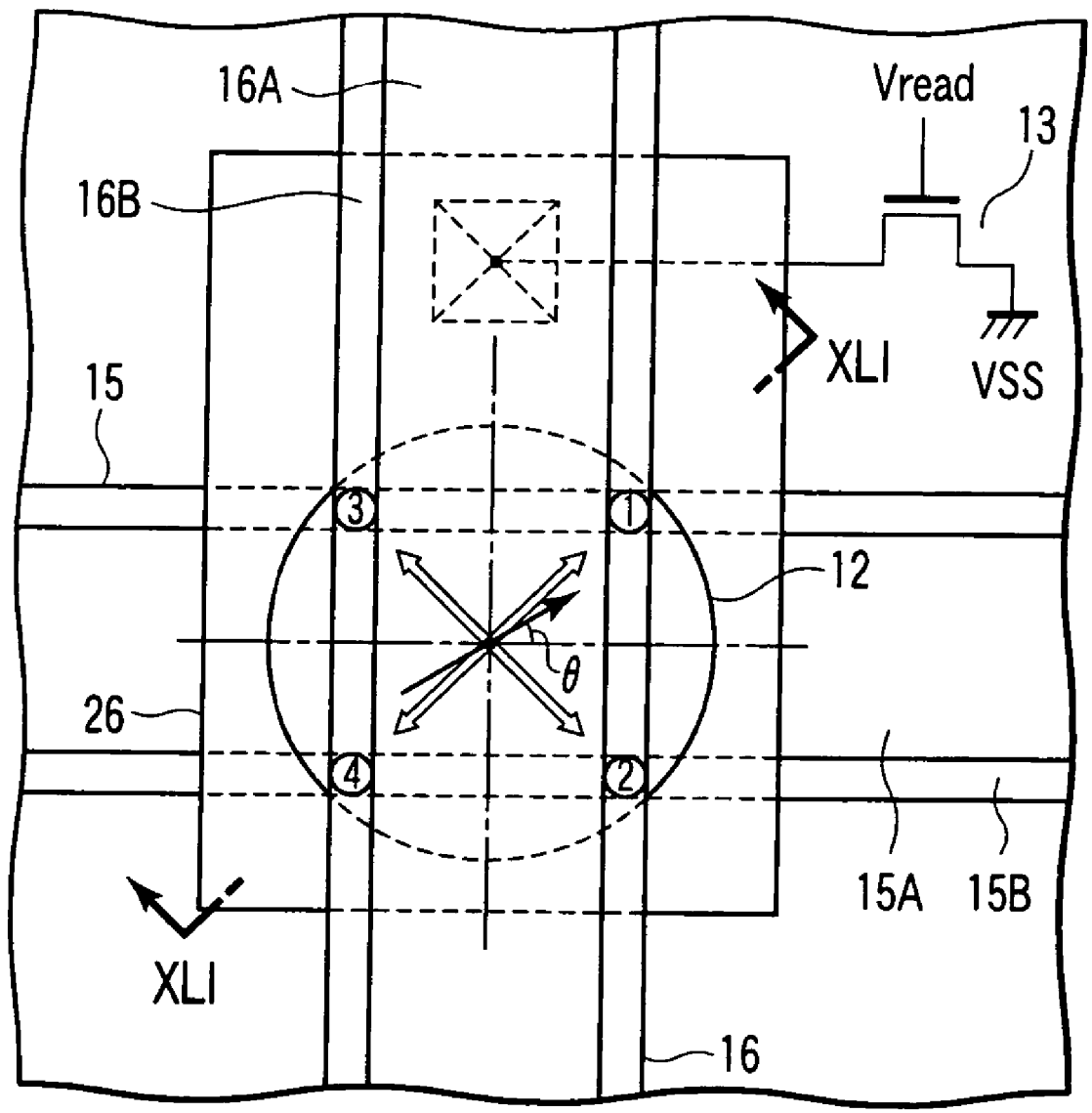
FIG. 40 is a plan view showing an example of the structure of the magnetic random access memory according to the seventh embodiment.

As to the vertical magnetization film 12A', for example, as shown in FIGS. 40 and 41, the film may be replaced with a nonmagnetic film 28 constituted of an insulator or a conductor.

The magnetization direction of the in-plane magnetization film 25 depends on that of the vertical magnetization film 12A disposed in four positions (points 1, 2, 3, 4).

For example, when the vertical magnetization film 12A has an upward magnetization direction in the point 1, and a downward magnetization direction in the point 4, magnetization of the in-plane magnetization film 25 is directed from the point 4 toward the point 1. When the vertical magnetization film 12A has a downward magnetization direction in the point 1, and an upward magnetization direction in the point 4, the magnetization of the in-plane magnetization film 25 is directed from the point 1 toward the point 4.

Similarly, when the vertical magnetization film 12A has an upward magnetization direction in the point 2, and a downward magnetization direction in the point 3, the magnetization of the in-plane magnetization film 25 is directed from the point 3 toward the point 2. When the vertical magnetization film 12A has a downward magnetization direction in the point 2, and an upward magnetization direction in the point 3, the magnetization of the in-plane magnetization film 25 is directed from the point 2 toward the point 3.

The magnetization direction of the in-plane magnetization film 25 is determined only by the magnetization direction of the vertical magnetization film 12A disposed in four positions after interrupting the write current. That is, the magnetization direction of the in-plane magnetization film 25 is set to any one of the four directions indirectly by a magnetic field (current magnetic field) generated by the write current flowing through the write bit line 15 and the write word line 16.

The magnetic pinned layer 12C is disposed under the in-plane magnetization film 25 via the tunnel barrier layer 12B made of an insulating material. The magnetic pinned layer 12C comprises a ferromagnetic film (in-plane magnetization film) whose magnetization direction is horizontal to a film surface, and the magnetization direction is pinned by the anti-ferromagnetic layer 12D.

For example, the magnetization direction of the magnetic pinned layer 12C is pinned in a tilted direction on the side of the point 1 by θ=about 26.6° with respect to a direction in which the write bit line 15 extends. A major point lies in that margins of four-values data (resistance values r0, r1, r2, r3) stored in the in-plane magnetization film 25 are set to be equal.

The anti-ferromagnetic layer 12D is disposed, for example, on a lower electrode 26, and the lower electrode 26 is connected to a ground point Vss via an N-channel MOS transistor which is a selection element 13. A read signal Vread is supplied to a gate of this MOS transistor.

The vertical magnetization films 12A, 12A' are connected to the write word line 16, for example, via an upper electrode 27.

It is to be noted that each of the vertical magnetization films 12A, 12A', the in-plane magnetization film 25, and the magnetic pinned layer 12C may comprise one magnetic layer or a plurality of laminated magnetic layers.

Moreover, each of the vertical magnetization films 12A, 12A', the in-plane magnetization film 25, and the magnetic pinned layer 12C may have a special structure such as an SAF structure.

Furthermore, there is not any special limitation as to plane shapes of the vertical magnetization films 12A, 12A'.

c. Operation

An operation of the magnetic random access memory shown in FIGS. 38 and 39 will be described.

Data is written by control of the direction of the write current flowing through the write bit line 15 and the write word line 16 in the selected memory cell 11.

First, by use of drivers/sinkers 17A, 18A of FIG. 14, the write current is passed through the write bit line 15 in a selected column. By use of drivers/sinkers 17B, 18B of FIG. 14, the write current is passed through the write word line 16 in a selected row.

Figure 42:
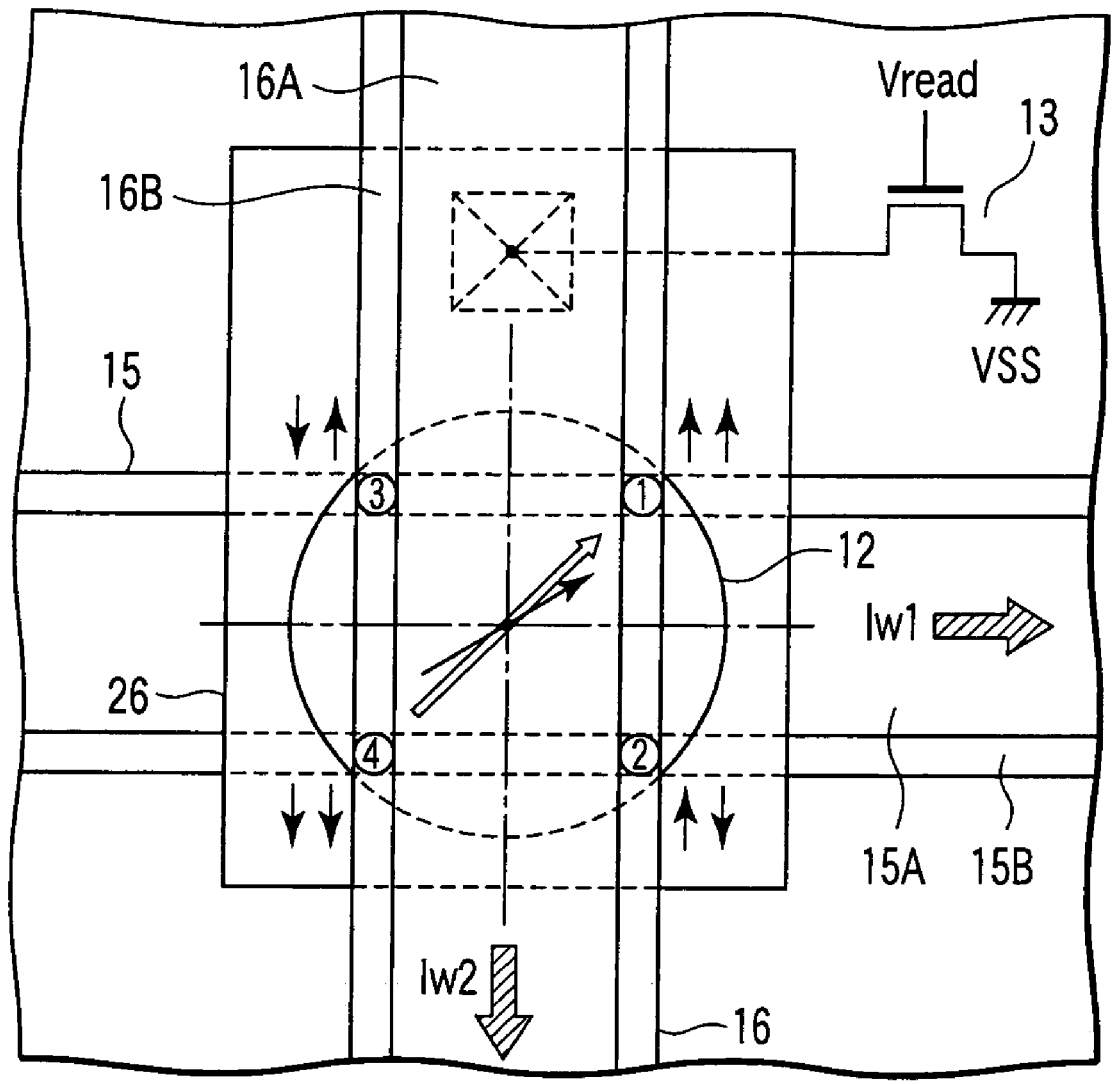
FIG. 42 is a plan view showing a writing operation according to the seventh embodiment.

In "0"-writing, for example, as shown in FIG. 42, a write current Iw1 is passed from the driver/sinker 17A toward the driver/sinker 18A of FIG. 14, and a write current Iw2 is passed from the write driver/sinker 17B toward the write driver/sinker 18B of FIG. 14.

At this time, for example, as shown in FIGS. 39 and 42, the write current flows from a backside toward a front side of a drawing sheet through the write bit line 15 and the write word line 16. The magnetization direction of the magnetic free layer 12A, disposed in the gap (point 1) between the soft magnetic materials 15B, 16B, changes to an upward direction, and the magnetization direction of the magnetic free layer 12A, disposed in the gap (point 4) between the soft magnetic materials 15B, 16B, changes to a downward direction.

Here, during the "0"-writing, in the points 2, 3, the current magnetic field by one of the write currents Iw1, Iw2 is directed upwards, and the current magnetic field by the other current is directed downwards. Therefore, the magnetic fields of the magnetic free layer 12A in the points 2, 3 are offset.

Thereafter, when the write current is interrupted, the magnetization direction of the in-plane magnetization film 25 is influenced by the magnetization of the vertical magnetization film 12A in the points 1, 4, and changes to a direction from the point 4 toward the point 1.

Accordingly, the magnetization directions of the in-plane magnetization film 25 which is a magnetic free layer, and the magnetic pinned layer 12C are brought closest to parallel states (resistance value r0), and the "0"-writing is completed.

Figure 43:
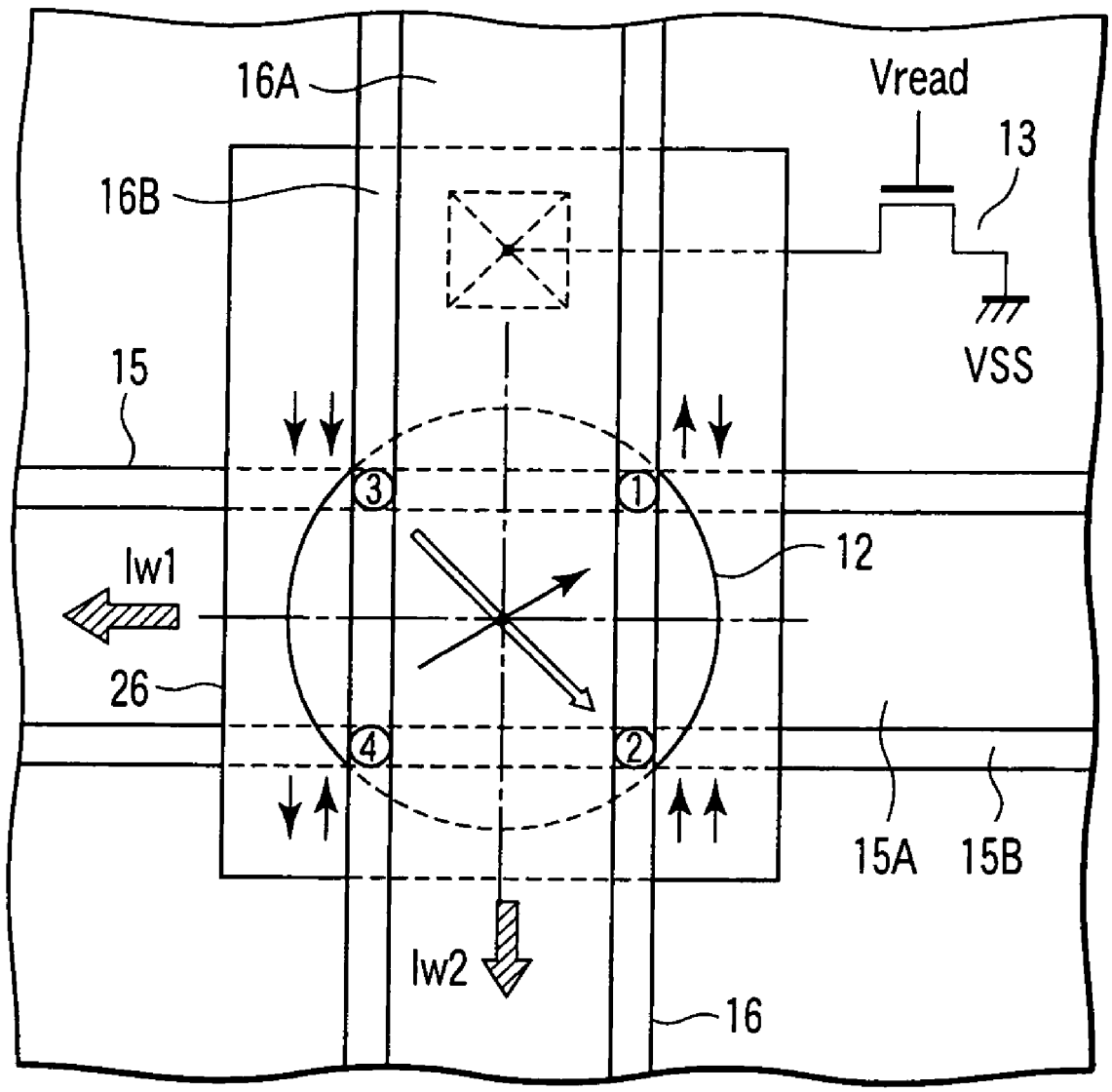
FIG. 43 is a plan view showing the writing operation according to the seventh embodiment.

In "1"-writing, for example, as shown in FIG. 43, the write current Iw1 is passed from the driver/sinker 18A toward the driver/sinker 17A of FIG. 14, and the write current Iw2 is passed from the driver/sinker 17B toward the driver/sinker 18B of FIG. 14.

At this time, for example, in FIGS. 30, 43, the write current flows from the front side toward the backside of the drawing sheet through the write bit line 15, and the write current flows from the backside toward the front side of the drawing sheet through the write word line 16. The magnetization direction of the vertical magnetization film 12A, disposed in the gap (point 2) between the soft magnetic materials 15B, 16B, changes to an upward direction, and the magnetization direction of the magnetic free layer 12A, disposed in the gap (point 3) between the soft magnetic materials 15B, 16B, changes to a downward direction.

Here, during the "1"-writing, in the points 1, 4, the current magnetic field by one of the write currents Iw1, Iw2 is directed upwards, and the current magnetic field by the other current is directed downwards. Therefore, the magnetic fields of the magnetic free layer 12A in the points 1, 4 are offset.

Thereafter, when the write current is interrupted, the magnetization direction of the in-plane magnetization film 25 is influenced by the magnetization of the vertical magnetization film 12A in the points 2, 3, and changes to a direction from the point 3 toward the point 2.

Consequently, the magnetization directions of the in-plane magnetization film 25, which is the magnetic free layer, and the magnetic pinned layer 12C are brought close to parallel states (resistance value r1>r0), and the "1"-writing is completed.

Figure 44:
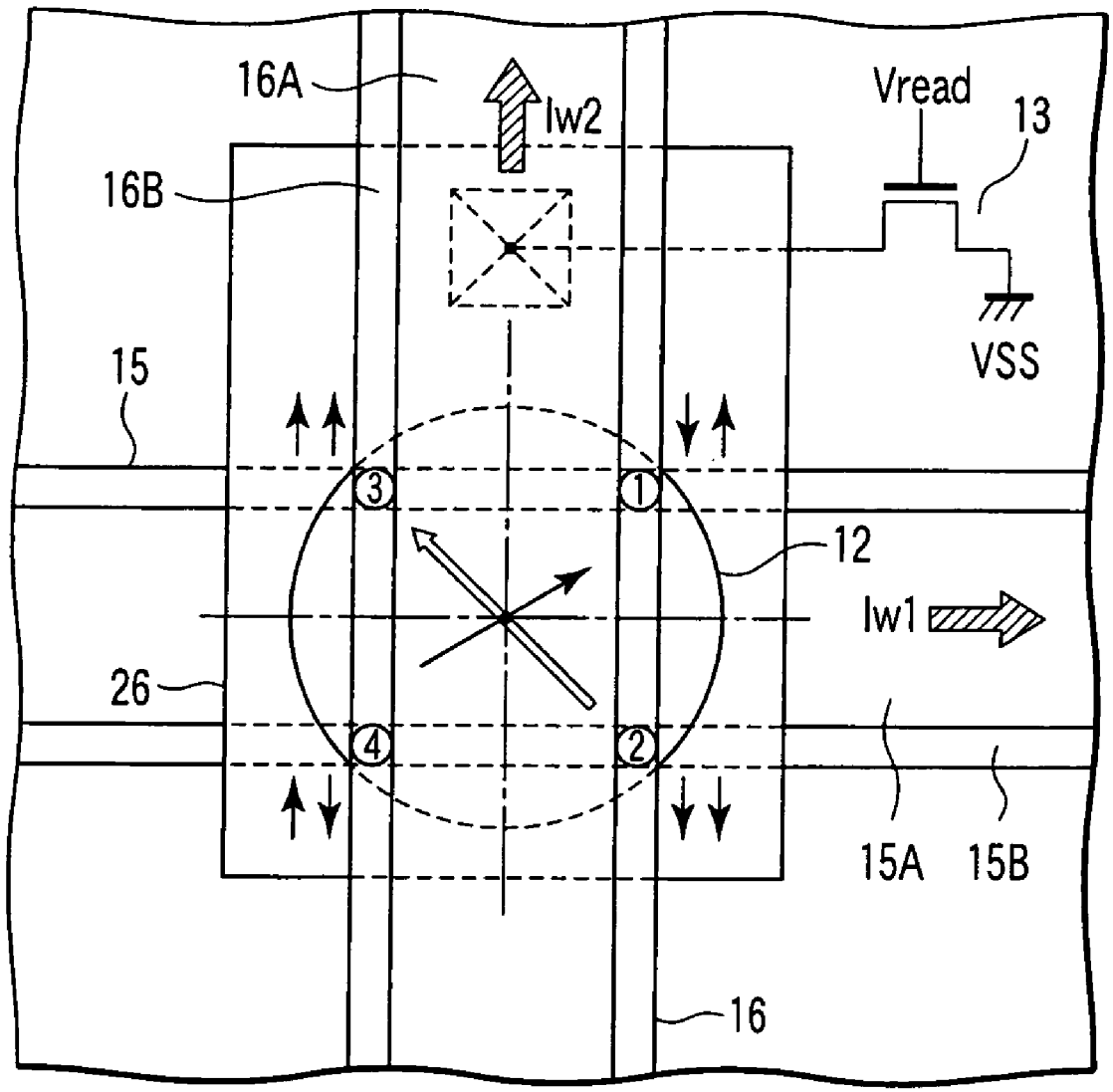
FIG. 44 is a plan view showing the writing operation according to the seventh embodiment.

In "2"-writing, for example, as shown in FIG. 44, the write current Iw1 is passed from the driver/sinker 17A toward the driver/sinker 18A of FIG. 14, and the write current Iw2 is passed from the driver/sinker 18B toward the driver/sinker 17B of FIG. 14.

At this time, for example, in FIGS. 39, 44, the write current flows from the backside toward the front side of the drawing sheet through the write bit line 15, and the write current flows from the front side toward the backside of the drawing sheet through the write word line 16. The magnetization direction of the vertical magnetization film 12A, disposed in the gap (point 3) between the soft magnetic materials 15B, 16B, changes to an upward direction, and the magnetization direction of the magnetic free layer 12A, disposed in the gap (point 3) between the soft magnetic materials 15B, 16B changes to a downward direction.

Here, during the "2"-writing, in the points 1, 4, the current magnetic field by one of the write currents Iw1, Iw2 is directed upwards, and the current magnetic field by the other current is directed downwards. Therefore, the magnetic fields of the magnetic free layer 12A in the points 1, 4 are offset.

Thereafter, when the write current is interrupted, the magnetization direction of the in-plane magnetization film 25 is influenced by the magnetization of the vertical magnetization film 12A in the points 2, 3, and changes to a direction from the point 2 toward the point 3.

Consequently, the magnetization directions of the in-plane magnetization film 25, which is the magnetic free layer, and the magnetic pinned layer 12C are brought close to anti-parallel states (resistance value r2>r1), and the "2"-writing is completed.

Figure 45:
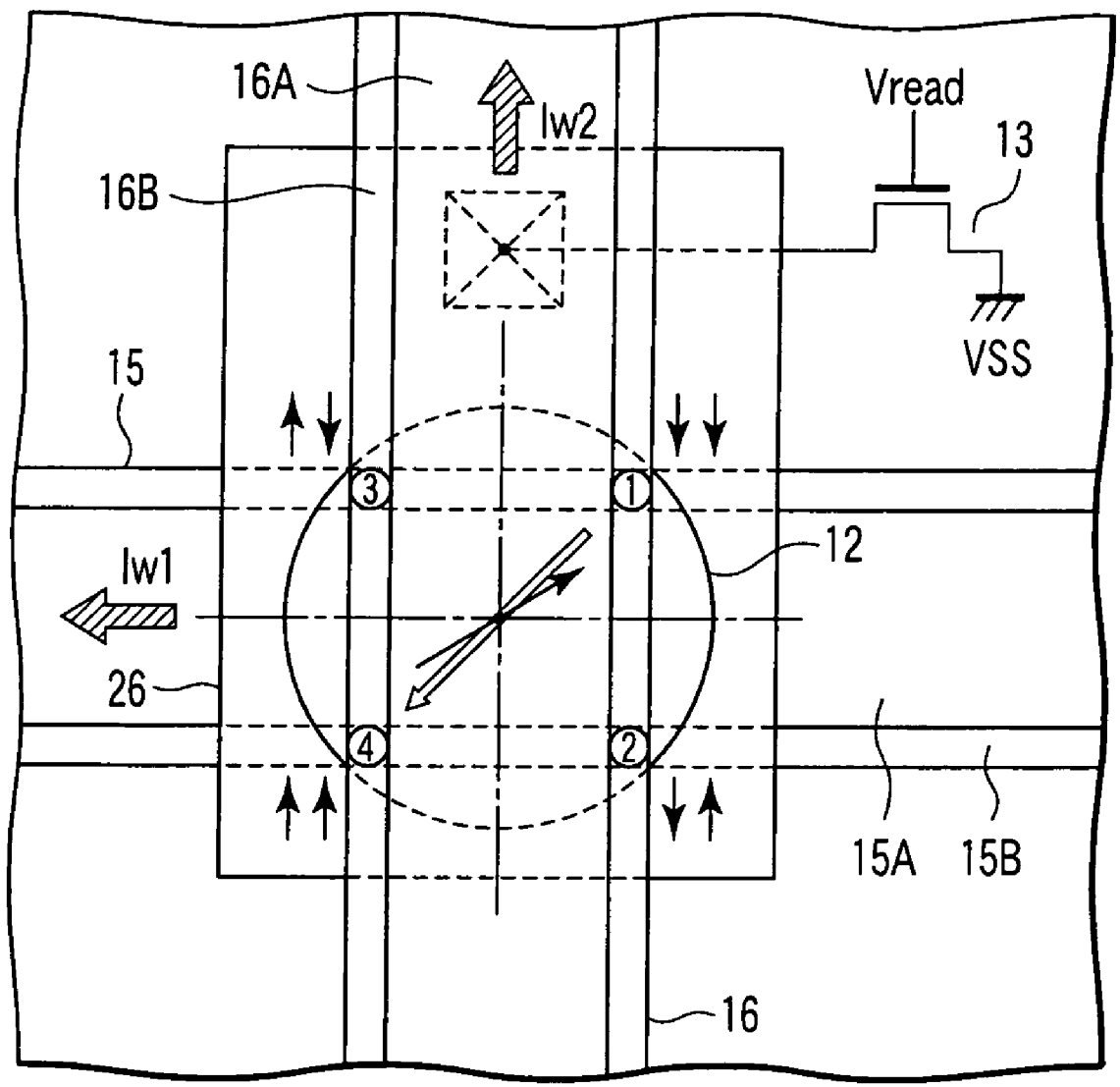
FIG. 45 is a plan view showing the writing operation according to the seventh embodiment.

In "3"-writing, for example, as shown in FIG. 45, the write current Iw1 is passed from the driver/sinker 18A toward the driver/sinker 17A of FIG. 14, and the write current Iw2 is passed from the driver/sinker 18B toward the driver/sinker 17B of FIG. 14.

At this time, for example, in FIGS. 39, 45, the write current flows from the front side toward the backside of the drawing sheet through the write bit line 15 and the write word line 16.

The magnetization direction of the vertical magnetization film 12A, disposed in the gap (point 1) between the soft magnetic materials 15B, 16B, changes to a downward direction, and the magnetization direction of the magnetic free layer 12A, disposed in the gap (point 4) between the soft magnetic materials 15B, 16B, changes to an upward direction.

Here, during the "3"-writing, in the points 2, 3, the current magnetic field by one of the write currents Iw1, Iw2 is directed upwards, and the current magnetic field by the other current is directed downwards. Therefore, the magnetic fields of the magnetic free layer 12A in the points 2, 3 are offset.

Thereafter, when the write current is interrupted, the magnetization direction of the in-plane magnetization film 25 is influenced by the magnetization of the vertical magnetization film 12A in the points 1, 4, and changes to a direction from the point 1 toward the point 4.

Consequently, the magnetization directions of the in-plane magnetization film 25, which is the magnetic free layer, and the magnetic pinned layer 12C are brought closet to anti-parallel states (resistance value r3>r2), and the "3"-writing is completed.

To read the data, a read current is passed through the magneto-resistive element 12, and a resistance value of the magneto-resistive element 12 is detected by a sense amplifier 23.

First, the selection element 13 in the selected memory cell 11 is turned on by use of the row decoder 20 of FIG. 14. Next, a column is selected in response to a column selection signal φCSL, and the read current is passed from the sense amplifier 23 through the write bit line (read bit line) 15 toward the memory cell 11.

Since an input voltage Vin of the sense amplifier 23 changes in accordance with read data "0", "1", "2", "3", the data stored in the magneto-resistive element 12 can be detected, for example, by use of a read circuit which has a latch circuit and which reads multi-valued data, instead of a differential amplifier.

d. Conclusions

As described above, according to the seventh embodiment, effects similar to those of the second embodiment can be obtained in the two-axis type magnetic random access memory. Moreover, the magneto-resistive element capable of storing a plurality of bit data can be disposed in the intersection of the write bit line and the write word line to realize enlargement of a memory capacity.

(3) Conclusions

As described above in the examples of the one-axis and two-axis types, according to the embodiments of the present invention, it is possible to simultaneously realize reduction of the current of the magnetic random access memory, reduction of a cell size, and enhancement of resistances to erroneous writing/thermal disturbance.

3. Materials

Examples of materials will be described.

(1) A vertical magnetization film can be made of the following materials.

An alloy containing at least one element of iron (Fe), cobalt (Co), nickel (Ni), and at least one element of chromium (Cr), platinum (Pt), palladium (Pd).

This alloy includes both of a regular alloy and an irregular alloy. Examples of the regular alloy include Fe(50)Pt(50), Fe(50)Pd(50), Co(50)Pt(50) and the like (numerals in parentheses indicate ratios), and examples of the irregular alloy include a CoCr alloy, a CoPt alloy, a CoCrPt alloy, a CoCrPtTa alloy, a CoCrNb alloy and the like.

Moreover, to these alloys, there may be added impurity elements such as Cu, Ag, Cr, B, V, Ta, Nb, SiO$_2$, MgO, TiN, or an alloy or compound of them.

A structure in which at least one element of Fe, Co, Ni or an alloy containing the element is laminated alternately with one element of Pt, Pd or an alloy containing the element.

Examples of this structure include a Co/Pt artificial lattice, a Co/Pd artificial lattice, a CoCr/Pt artificial lattice and the like. Impurity elements such as Cu, Ag, or an alloy or an insulating material of them may be added to the alloy constituting this structure.

An amorphous alloy constituted of: at least one element of rare earth metals such as terbium (Tb), dysprosium (Dy), and gadolinium (Gd); and at least one element of transition metals.

Examples of the alloy include TbFe, TbCo, TbFeCo, DyTbFeCo, GdTbCo and the like.

(2) The nonmagnetic film can be made of the following materials.

Ta

TiN, CrRu, Co—Cr—Pt (a total ratio of Cr and Pt is set to 50% or more in order to obtain non-magnetism), Au, Ag, Pt, Pd, Ir, Fe, Cr, MgO The nonmagnetic film is constituted using these materials. Moreover, the vertical magnetization film is formed on the nonmagnetic film. Accordingly, orientation of the vertical magnetization film is enhanced, and characteristics thereof can be enhanced.

CrTi, CrNb, CrV, CoCrPt, CrRu

The nonmagnetic film is constituted using these materials. Moreover, the in-plane magnetization film is formed on the nonmagnetic film. Accordingly, the orientation of the in-plane magnetization film is enhanced, and the characteristics thereof can be enhanced.

4. Others

According to the embodiments of the present invention, a magnetic field generation efficiency can be enhanced, and an efficiency of 1 kOe/mA or more can be realized. In this case, a write current can be set to several milliamperes or less. Moreover, as to a switching magnetic field (reverse magnetic field) of the magneto-resistive element, a level can be raised to a level at which magnetic shielding becomes unnecessary, that is, to such an extent that erroneous writing is not caused by an external magnetic field.

Moreover, for example, as to the magnetic random access memory of FIGS. 28 and 29, the thicknesses of the vertical magnetization film 12A, the nonmagnetic film 24, and the in-plane magnetization film 25 are set to 5 nm, 2 nm, 3 nm, respectively, and a thickness of a protective film disposed between the in-plane magnetization film 25 and the soft magnetic material 16B is set to 20 nm. In this case, a gap between the write bit line 15 and the write word line 16 is 30 nm, and an efficiency of about 250 Oe/mA can be realized. In this case, the data can be written at a write current of about 4 mA.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   a conductive line which extends in a first direction;
   a soft magnetic material which surrounds the conductive line;
   a gap disposed in a part of the soft magnetic material;
   a magnetic free layer having a first portion and a second portion, and provided in a plane which is parallel to the first direction and a second direction crossing the first direction, the first portion being located in the gap, the second portion being located outside the gap;
   a magnetic pinned layer; and
   a tunnel barrier layer which is provided between the second portion of the magnetic free layer and the magnetic pinned layer.

2. The magnetic random access memory according to claim 1,
   wherein a magnetization direction of the magnetic free layer is a third direction which is perpendicular to the first and second direction.

3. The magnetic random access memory according to claim 1,
   wherein a magnetization direction of the magnetic pinned layer is a third direction which is perpendicular to the first and second direction.

4. The magnetic random access memory according to claim 1,
   wherein the magnetic free layer comprises an alloy which includes one element selected from Fe, Co and Ni, and one element selected from Cr, Pt and Pd.

5. A magnetic random access memory according to claim 4,
   wherein the alloy includes one selected from Cu, Ag, Cr, B, V, Ta, Nb, SiO$_2$, MgO and TiN.

6. The magnetic random access memory according to claim 1,
   wherein the magnetic free layer has a laminated structure having a first layer and a second layer, the first layer comprising one element selected from Fe, Co and Ni, the second layer comprising one element selected from Pt and Pd.

7. The magnetic random access memory according to claim 1,
   wherein the magnetic free layer comprises an amorphous alloy which includes one element of rare earth metals and one element of transition metals.

* * * * *